United States Patent [19]
Nagumo

[11] Patent Number: 6,028,472
[45] Date of Patent: Feb. 22, 2000

[54] TEMPERATURE SENSING CIRCUIT, DRIVING APPARATUS, AND PRINTER

[75] Inventor: Akira Nagumo, Tokyo, Japan

[73] Assignee: Oki Data Corporation, Tokyo, Japan

[21] Appl. No.: 09/083,065

[22] Filed: May 21, 1998

[30] Foreign Application Priority Data

Jun. 3, 1997 [JP] Japan ................................. 9-145031

[51] Int. Cl.[7] ................................................ H01L 35/00
[52] U.S. Cl. ............................................. 327/512; 327/432
[58] Field of Search .................................... 327/512, 513, 327/432, 433; 323/315, 316, 317

[56] References Cited

U.S. PATENT DOCUMENTS

| | | | |
|---|---|---|---|
| 5,334,929 | 8/1994 | Schade, Jr. ................................. | 323/315 |
| 5,873,053 | 2/1999 | Pricer et al. .............................. | 327/513 |
| 5,942,888 | 8/1999 | Tan ........................................... | 323/315 |

FOREIGN PATENT DOCUMENTS 9-109459  4/1997  Japan.

*Primary Examiner*—Toan Tran
*Attorney, Agent, or Firm*—Akin, Gump, Strauss, Hauer & Feld, L.L.P.

[57] ABSTRACT

A temperature-sensing circuit has a pair of bipolar transistors of different sizes, exposed to the temperature to be sensed. A current mirror circuit, or an operational amplifier and another bipolar transistor, is used to sense the difference between the base-emitter voltages of the bipolar transistors and generate a corresponding output current, which is converted to a voltage output signal. This temperature-sensing circuit can be integrated into a driving circuit to sense the temperature of the driven elements and compensate for temperature effects. In a printer, the temperature-sensing circuit can be used for temperature compensation of dot-forming elements.

32 Claims, 47 Drawing Sheets

FIG.10

| COMMAND DATA | | | | MODE |
|---|---|---|---|---|
| $d_3$ | $d_2$ | $d_1$ | $d_0$ | |
| 0 | 0 | 1 | 0 | WRITE (WR) |
| 0 | 1 | 0 | 0 | TRANSFER (TRANS) |
| 0 | 1 | 1 | 0 | DIRECT |
| 1 | 0 | 0 | 0 | READ (RD) |

TEMPERATURE SENSING CIRCUIT, DRIVING APPARATUS, AND PRINTER

BACKGROUND OF THE INVENTION

The present invention relates to a temperature-sensing circuit, to a driving apparatus using this temperature-sensing circuit in selectively and cyclically driving a group of driven elements such as a row of light-emitting diodes employed in an electrophotographic printer, a row of resistive heating elements employed in a thermal printer, or an array of display elements employed in a display device, and to a printer employing this type of driving apparatus.

In the following description, the driven elements will be light-emitting diodes or LEDs employed in an electrophotographic printer.

In a conventional electrophotographic printer, for example, an electrically charged photosensitive drum is selectively illuminated, responsive to the data to be printed, to form a latent electrostatic image, which is developed by application of toner particles to form a toner image. The toner image is then transferred to paper and fused onto the paper.

FIG. 52 is a block diagram of the control circuitry of a conventional electrophotographic printer. FIG. 53 is a timing diagram illustrating the operation of the conventional electrophotographic printer.

The printing control unit 1 in FIG. 52 comprises a microprocessor, read-only memory (ROM), random-access memory (RAM), input-output ports, timers, and other elements disposed in the printing engine of the printer. The printing control unit 1 receives a control signal SG1 and a dot data signal SG2 from a higher-order controller, and controls the printing operations performed by the printing engine. The dot data signal SG2 is a one-dimensional digital signal representing a two-dimensional bit map of picture elements (pixels), referred to below as dots.

Upon receiving a print command via control signal SG1, the printing control unit 1 first checks a temperature sensor 23 to determine whether the fuser 22 is within the necessary temperature range. If the fuser 22 is not within the necessary temperature range, the printing control unit 1 activates a heater 22a built into the fuser 22. When the fuser 22 reaches the necessary temperature, the printing control unit 1 activates a driver 2 that drives a stepping motor or pulse motor (PM) 3 used in the developing and transfer process, and activates a charge signal SGC that switches on a high-voltage power source 25 that charges toner particles in a developer unit 27.

The presence or absence of paper and the size of the paper are detected by a paper sensor 8 and size sensor 9. If paper is present, the printing control unit 1 activates a driver 4 that drives another pulse motor (PM) 5. This motor is first driven in reverse by a certain amount, until paper is detected by a pick-up sensor 6, then driven forward to feed the paper into the printing engine.

When the paper has been fed to the necessary position, the printing control unit 1 sends timing signals SG3 (including horizontal and vertical synchronization signals) to the higher-order controller, and begins receiving the dot data signal SG2, which the higher-order controller generates on a page-at-a-time basis. The dot data signal SG2 is supplied as a data signal HD-DATA to an LED head 19 comprising a row of LEDs, with one LED per dot. The transfer of dot data into the LED head 19 is synchronized with a clock signal (HD-CLK). The dot data will be referred to below as driving data, since they determine whether each LED is driven or not.

After sufficient driving data (HD-DATA) for one horizontal dot line have been transferred into the LED head 19, the printing control unit 1 sends the LED head 19 a load signal (HD-LOAD), causing the driving data to be latched in the LED head 19. The LED head 19 can then print this line while receiving driving data for the next line.

The LED head 19 prints the line by illuminating a photosensitive drum (not visible) which has been precharged to a negative electrical potential. The potential level of illuminated dots rises, creating a latent dot image. The toner in the developer unit 27 is also charged to a negative potential, so toner particles are electrostatically attracted to the illuminated dots, creating a toner image.

The LEDs are turned on and off in synchronization with a strobe signal (HD-STB-N). FIG. 53 illustrates the timing of this signal and other signals mentioned above. The SG3 pulses shown at the top of FIG. 53 are horizontal synchronization pulses. FIG. 53 illustrates three successive line-printing cycles, for printing lines N–1, N, and N+1 (where N is an arbitrary integer).

Referring again to FIG. 52, to transfer the toner image to the paper, the printing control unit 1 activates a transfer signal SG4 that turns on a high-voltage power source 26, generating a high positive voltage in a transfer unit 28. As the paper travels through a narrow gap between the photosensitive drum and transfer unit 28, the toner image is transferred by electrostatic attraction to the paper.

The paper with the toner image is then transported to the fuser 22, which has been heated by the heater 22a. The heat fuses the toner to the paper, which then passes an exit sensor 7 and is ejected from the printer.

The printing control unit 1 controls these operations so that the high-voltage power source 26 is switched off except while the paper is traveling past the transfer unit 28, as detected by sensors 6 and 9. When the paper passes the exit sensor 7, the printing control unit 1 also switches off the high-voltage power source 25 of the developer unit 27, and stops the pulse motor (PM) 3 used in the developing and transfer process.

The above sequence is repeated for each page.

FIG. 54 shows the structure of the conventional LED head 19 in more detail. The driving data HD-DATA and clock signal HD-CLK are provided to a shift register comprising, for example, two thousand four hundred ninety-six flip-flop circuits $FF_1$, $FF_2$, ..., $FF_{2496}$ (this number of flip-flop circuits is appropriate for printing on A4-size paper at three hundred dots per inch). When two thousand four hundred ninety-six bits of driving data have been clocked into this shift register, the load signal HD-LOAD is activated, causing the bits to be stored in latches $LT_1$, $LT_2$, ..., $LT_{2496}$. When the strobe signal HD-STB-N is driven low, bits set to the high logic level (one) turn on light-emitting diodes $LD_1$, $LD_2$, ..., $LD_{2496}$ by way of an inverter $G_0$. NAND gates $G_1$, $G_2$, ..., $G_{2496}$, and p-channel metal-oxide-semiconductor (MOS) transistors $Tr_1$, $Tr_2$, ..., $Tr_{2496}$. The symbol $V_{DD}$ represents a power-supply potential.

In a printer employing the LED head in FIG. 54, all of the light-emitting diodes $LD_1$, $LD_2$, ..., $LD_{2496}$ that are switched on are switched on for the same length of time, determined by the strobe signal HD-STB-N. Thus if these light-emitting diodes, or the transistors $Tr_1$, $Tr_2$, ..., $Tr_{2496}$, do not have perfectly uniform electrical properties, the dots will be unevenly illuminated. This will lead to differences in the sizes of the electrostatic dots in the latent image formed on the photosensitive drum, hence to differences in the sizes of the dots printed on the page. Although different dot sizes are not readily noticeable on pages containing only line art or text, when photographs or similar types of images are printed, variations in dot size create density differences that can degrade the printing quality to an undesirable degree.

Typical differences in LED output are illustrated by the graph in FIG. 55. Dot position is indicated on the horizontal axis, and optical power on the vertical axis. The light-emitting diodes are disposed in a plurality of semiconductor chips, more specifically LED array chips CHP1 to CHP26, which are driven by a like plurality of integrated driver circuits (driver ICs) DRV1 to DRV26, as illustrated at the top of FIG. 55. Ninety-six light-emitting diodes are integrated onto each LED array chip. The LED array chips and driver ICs are interconnected by wire bonding. The driver ICs are cascaded to form a single shift register for receiving the driving data signal HD-DATA.

The horizontal dotted lines indicate the ranges of variability of the optical power output by the light-emitting diodes in each individual LED array. The horizontal dot-dash lines indicate the range of variability of the average optical output power of each LED array. Thus the dotted lines indicate ranges of dot-to-dot variation within each array, while the dot-dash lines indicate the range of chip-to-chip variation.

In U.S. patent application Ser. No. 08/694,055, the present inventor has proposed a driving apparatus with circuitry for compensating for the above chip-to-chip and dot-to-dot variations.

It has been found, however, that compensation for these chip-to-chip and dot-to-dot variations still does not assure perfectly uniform printed output. Further study has shown that printing irregularities can be caused by temperature differences between the LED array chips. LEDs emit light with decreasing efficiency at increasing temperature, and during a typical printing job, depending on the printed data, some LED array chips may be driven more intensively than other LED array chips. These LED array chips generate more heat, causing their temperature to rise and their optical output to fall. Compared with the other LED array chips, the intensively driven LED array chips produce fainter printed dots.

To compensate for these temperature-induced printing irregularities, it becomes necessary to detect the temperature of the individual LED array chips accurately, but the known art offers no temperature-sensing circuit suitable for this purpose.

SUMMARY OF THE INVENTION

It is accordingly an object of the present invention to provide a temperature-sensing circuit with a simple circuit configuration.

Another object of the invention is to provide a temperature-sensing circuit that can be formed within a semiconductor integrated circuit.

A further object is to provide a driving apparatus that can compensate for temperature-dependent variations in the output power of driven elements.

A still further object is to provide a printer having printing elements driven by a driving apparatus, in which the printed output is not affected by temperature variations.

A yet further object is to provide a simple circuit for driving driven elements disposed in groups on a plurality of semiconductor chips, that is capable of compensating for differences in the electrical characteristics of different driven elements in the same chip, for chip-to-chip differences in electrical characteristics, and also for chip-to-chip temperature differences.

According to a first aspect of the invention, a temperature-sensing circuit has a pair of bipolar transistors of different sizes, both bipolar transistors exposed to the temperature to be sensed. The temperature-sensing circuit also has a converting element for converting current to voltage, and a current mirror circuit comprising a plurality of MOS transistors. The current mirror circuit supplies corresponding currents to the bipolar transistors and the converting element, responsive to a signal received from one of the bipolar transistors, thereby determining the base-emitter voltages of the bipolar transistors. The converting element generates a voltage output signal from the current supplied by the current mirror circuit. The voltage output signal is substantially proportional to the temperature to be sensed.

According to a second aspect of the invention, a temperature-sensing circuit comprises a pair of bipolar transistors of different sizes, both exposed to a temperature to be sensed, and a converting element for converting current to voltage. An operational amplifier generates an amplifier output signal according to the difference between the base-emitter voltages of the two bipolar transistors. A third bipolar transistor supplies current to the converting element responsive to the amplifier output signal. The converting element generates a voltage output signal, proportional to the temperature to be sensed, from the current supplied by the third bipolar transistor.

According to a third aspect of the invention, a driving apparatus supplying energy to a driven element comprises the temperature-sensing circuit of the first or second aspect of the invention, and a temperature compensation circuit that adjusts the energy supplied to the driven element responsive to the voltage output signal generated by the temperature-sensing circuit.

According to a fourth aspect of the invention, a driving apparatus selectively and cyclically drives a plurality of driven elements to form dots. The driving apparatus uses the temperature-sensing circuit of the first or second aspect of the invention to sense the temperature of the driven elements. A temperature compensation circuit generates a control voltage responsive to the voltage output signal generated by the temperature-sensing circuit. A plurality of driving circuits supply driving energy to the driven elements, responsive to driving data indicating whether the driven elements are to be driven, to compensation data for adjusting the driving energy, and to the control voltage. The compensation data are stored in a plurality of compensation memory circuits. A data transfer means first transfers compensation data to the compensation memory circuits, then transfers driving data to the driving circuits.

According to a fifth aspect of the invention, a printer uses the driving apparatus of the fourth aspect to print dots. The printer preferably has a printing control unit that receives the voltage output signal from the temperature-sensing circuit and halts printing if the voltage output signal exceeds a threshold value.

According to a sixth aspect of the invention, a driving apparatus selectively and cyclically drives a plurality of driven elements to form dots. The driving apparatus has a test input terminal for receiving a test signal, and a plurality of driving circuits coupled to the test input terminal. Each driving circuit has a main driving element for supplying driving energy to a corresponding driven element, responsive to driving data indicating whether the driven element is to be driven, when the test signal is inactive. The main driving element is disabled when the test signal is active. The driving circuit also has at least one compensation driving element for supplying additional energy to the driven element, responsive to compensation data. The driving apparatus also has compensation memory circuits for storing the compensation data, and a data transfer means for first transferring the compensation data to the compensation memory circuits, then transferring the driving data to the driving circuits.

BRIEF DESCRIPTION OF THE DRAWINGS

In the accompanying drawings:

FIG. 10 shows an example of the bit assignments of mode command data;

FIG. 46 is a graph illustrating test results obtained from the internal circuit in FIG. 45 when the main driving transistor is switched on;

DETAILED DESCRIPTION OF THE INVENTION

Figure 52:
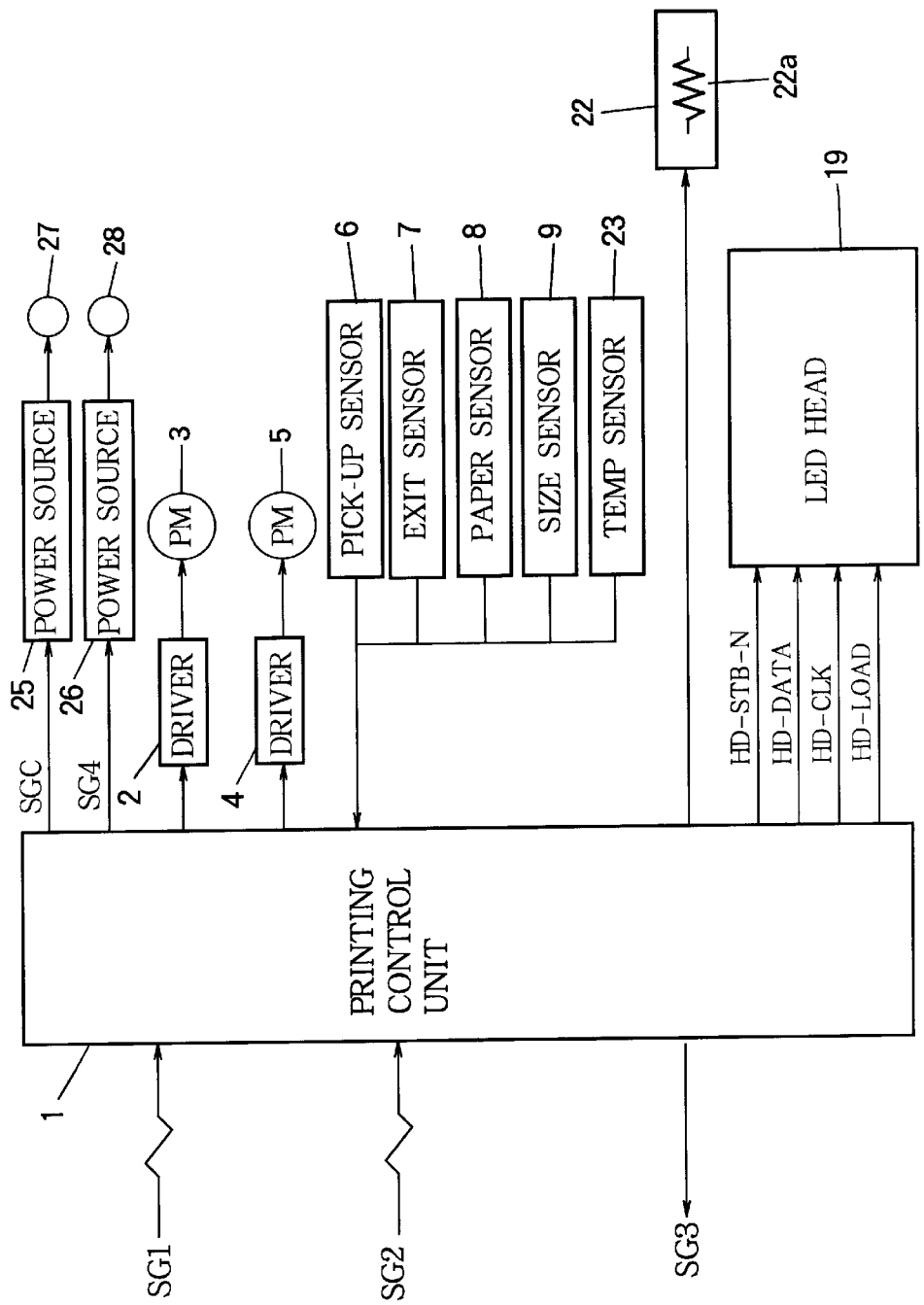
FIG. 52 is a block diagram illustrating the printing control circuits in a conventional electrophotographic printer.

Embodiments of the invention will be described with reference to the attached illustrative drawings. As the invention relates to a temperature-sensing circuit, a driving apparatus, and a printer, the description will be of a printer of the invented type, having a driving apparatus of the invented type, employing a temperature-sensing circuit of the invented type. The printer is generally similar to a conventional printer, having a printing control unit 1 and other units as shown in FIG. 52, but the driver ICs and control ICs in the LED head 19 differ from the conventional ICs.

To describe control signals, the suffix -P will sometimes be added to signal names, as in LOAD-P for example, to indicate positive logic (active high), and the suffix -N will sometimes be added, as in LOAD-N for example, to indicate negative logic (active low). Thus LOAD-P and LOAD-N are complementary signals, one being the inverse of the other.

Figure 1:
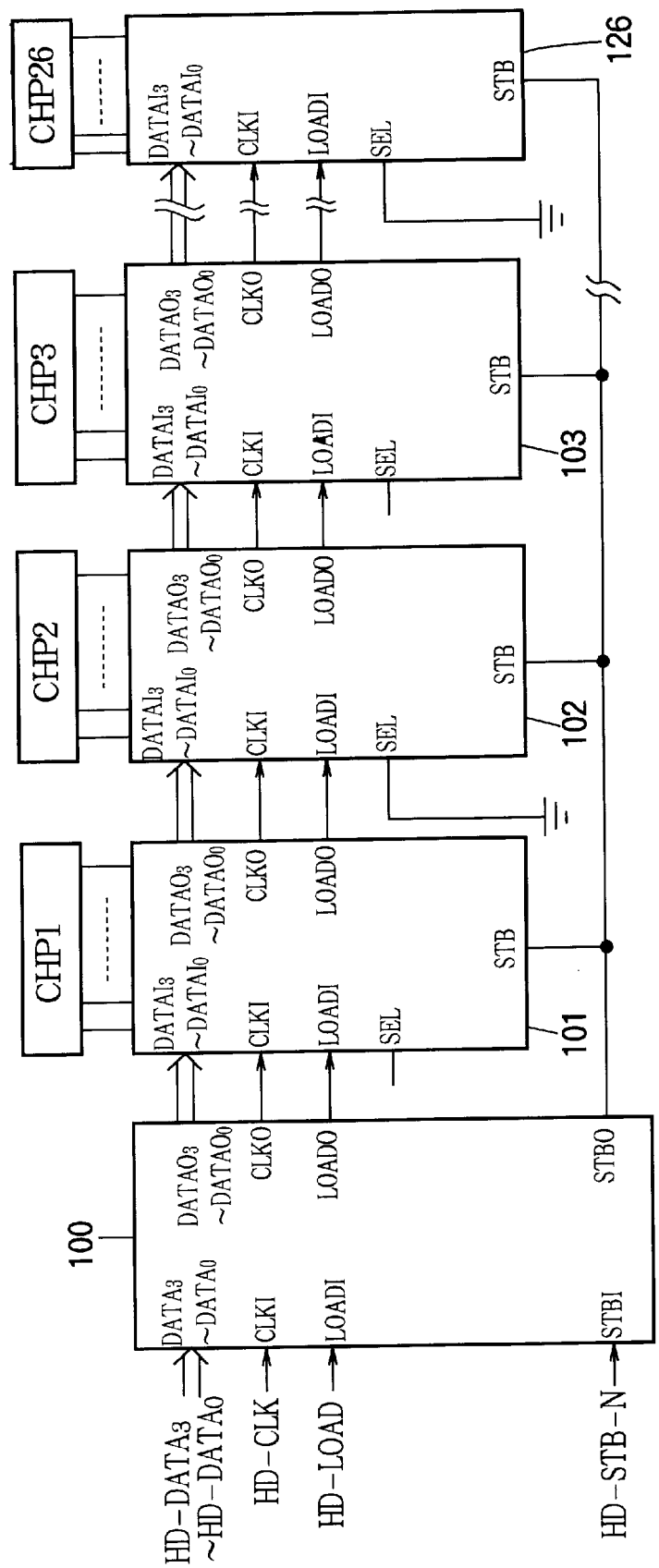
FIG. 1 is a block diagram illustrating the control IC and driver ICs in a driving apparatus according to the present invention.

Referring to FIG. 1, the first embodiment comprises a control IC 100 and twenty-six driver ICs 101, 102, 103, . . ., 126. The control IC 100 is an integrated circuit comprising control circuitry and a non-volatile memory storing compensation data that compensate for differences in the optical output of a plurality of LEDs. The driver ICs 101 to 126 are separate integrated circuits that drive corresponding LED-array chips, denoted CHP1 to CHP26, each LED array chip having an array of ninety-six LEDs for printing ninety-six dots. The driver ICs in FIG. 1 are mounted in close proximity to the corresponding LED array chips, so that a thermal coupling exists between the driver ICs and the corresponding LED array chips. The driver ICs and LED array chips form an LED printing head that prints lines of two thousand four hundred ninety-six dots.

96 dots/chip×26 chips=2496 dots

The SEL input terminal of each driver IC is connected to a pull-up resistor inside the IC. The SEL input terminal of the first driver IC 101 is left unconnected, and the SEL input terminal of the second driver IC 102 is coupled to the ground power-supply potential. In like manner, the SEL input terminals of all the odd-numbered driver ICs are left unconnected, and the SEL input terminals of all the even-numbered driver ICs are coupled to ground.

From the printing control unit (not visible), the control IC 100 receives data signals HD-DATA$_3$ to HD-DATA$_0$, a clock signal HD-CLK, a load signal HD-LOAD, and a strobe signal HD-STB-N. The control IC 100 receives these signals at terminals denoted DATA$_3$ to DATA$_0$, CLKI, LOADI, and STBI, respectively. DATA$_3$ to DATA$_0$ are input/output terminals; CLKI, LOADI, and STBI are input terminals. The control IC 100 supplies output signals DATAO$_3$ to DATAO$_0$, CLKO, and LOADO to input terminals DATAI$_3$ to DATAI$_0$, CLKI, and LOADI of the first driver IC 101, and supplies an output strobe signal STBO to input terminals STB of all of the driver ICs 101 to 126.

The signals received at input terminals CLKI and LOADI of driver IC 101 are coupled through internal inverting circuits to output terminals CLKO and LOADO of driver IC 101, and supplied to the CLKI and LOADI input terminals of the next driver IC 102. These signals continue to be passed from one driver IC to the next, being inverted in each driver IC.

Dot driving data are input on signal lines HD-DATA$_3$ to HD-DATA$_0$. Four bits are input at once, in synchronization with the clock signal HD-CLK, representing four adjacent dots. Input of four bits at once enables the clock rate to be reduced by a factor of four, thereby reducing the generation of undesired electromagnetic interference.

The data that compensate for variations in the optical output of the LEDs comprise four bits per dot, enabling the output of each LED to be adjusted in sixteen steps. These compensation data are also received from the printing control unit on signal lines HD-DATA$_3$ to HD-DATA$_0$.

The data input and output terminals DATAI$_3$ to DATAI$_0$ and DATAO$_3$ to DATAO$_0$ of the driver ICs 101 to 126 are similarly used for the input and output of both driving data and compensation data. The data output at output terminals DATAO$_3$ to DATAO$_0$ of the control IC 100 are input by the first driver IC 101 and shifted through the other driver ICs to the last driver IC 126, as described below.

Using the same input and output terminals for both driving and compensation data has the following advantages.

First, fewer bonding wires are required for electrical interconnection of the driver ICs to wiring traces on the printed circuit board on which the ICs are mounted. The assembly time of the LED head is thereby reduced.

Second, fewer wiring traces are required on the printed circuit board, so the printed circuit board and consequently the LED head can be reduced in size.

Third, there are fewer wiring traces to be inspected. A 100% inspection of four wiring traces suffices to ensure that both driving data and compensation data will be passed correctly from one driver IC to the next.

Figure 2:
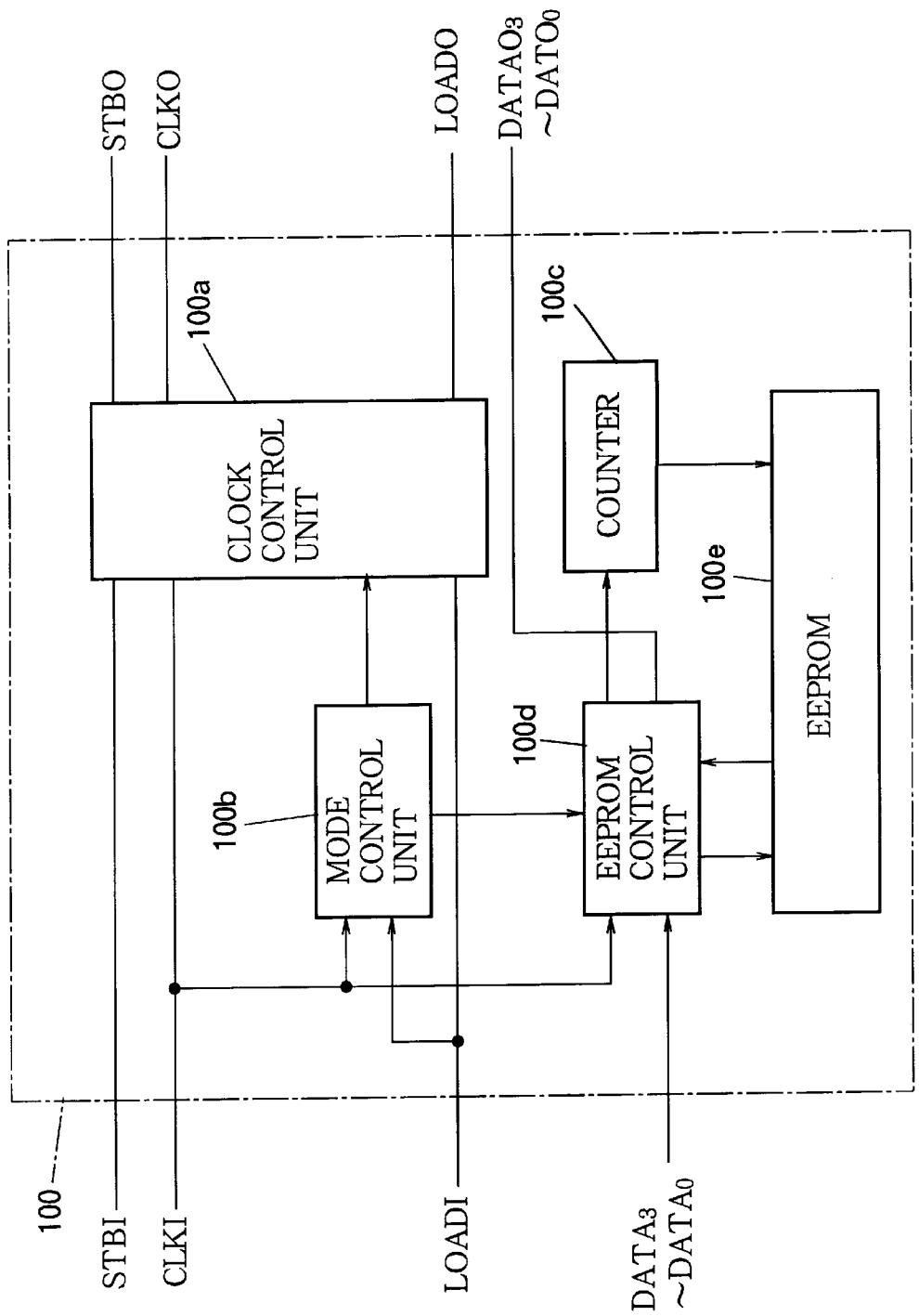
FIG. 2 is a block diagram illustrating the internal structure of the control IC in FIG. 1.

FIG. 2 is a block diagram of the control IC 100, showing the non-volatile memory and related control circuitry. The non-volatile memory is an electrically-erasable programmable read-only memory or EEPROM 100e. A clock control unit 100a supplies clock signals to the other circuits in FIG. 2, via signal lines not explicitly shown in the drawing. A mode control unit 100b decodes and latches command signals sent to the LED head, and issues commands controlling circuit operations. A counter 100c generates read and write addresses on instruction from an EEPROM control unit 100d, which reads and writes data in the EEPROM 100e.

The load signal HD-LOAD and strobe signal HD-STB-N are passed directly from input terminals LOADI and STBI to output terminals LOADO and STBO of the control IC 100, without being inverted. These two signals could be supplied directly to the first driver IC 101 instead of being coupled through the control IC 100.

Figure 3:
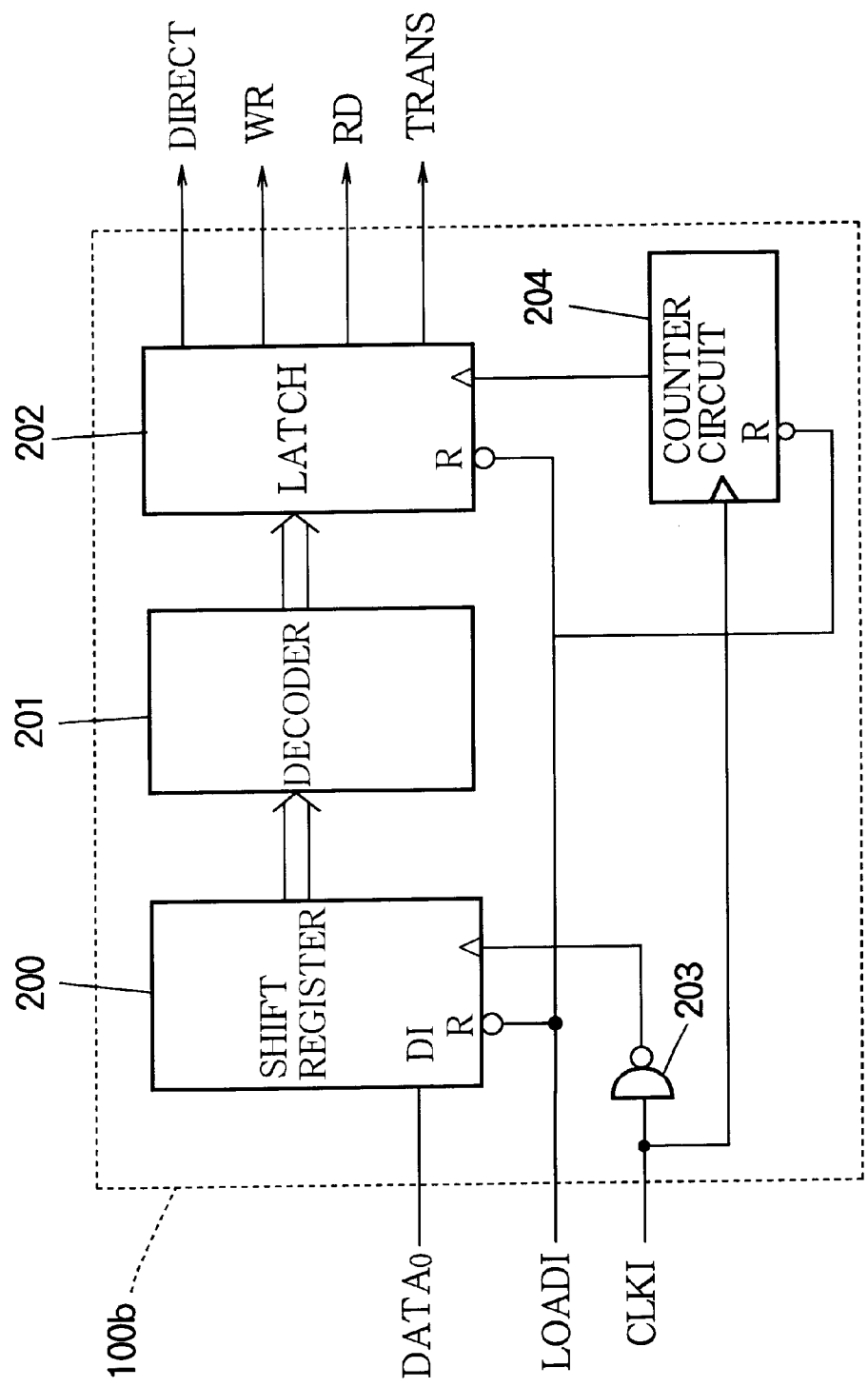
FIG. 3 is a block diagram showing an example of the internal structure of the mode control unit in FIG. 2.

FIG. 3 is a block diagram showing the internal structure of the mode control unit 100b, which comprises a shift register 200, a decoder 201, a latch circuit 202, an inverter 203, and a counter circuit 204.

The shift register 200 has a data input terminal DI coupled to the DATA$_0$ input/output terminal of the control IC 100. The shift register 200, latch circuit 202, and counter circuit 204 have reset terminals R that are coupled to the load signal input terminal LOADI. The clock signal HD-CLK input at the CLKI terminal is supplied to the clock input terminal of the counter circuit 204, and to the inverter 203. The inverter 203 supplies an inverted clock signal to the clock input terminal of the shift register 200. The counter circuit 204 outputs a command latch signal to the latch circuit 202.

Data entering the shift register 200 at data input terminal DI are shifted through the shift register 200 in synchronization with the clock signal (HD-CLK) received at input terminal CLKI. The shift register 200 converts these data from serial to parallel form, and sends the parallel data to the decoder 201 to be decoded. The decoded signals output by the decoder 201 are latched by the latch circuit 202 in response to the command latch signal, and output as a direct mode signal, a write (WR) mode signal, a read (RD) mode signal, and a transfer (TRANS) mode signal. These four mode signals are active high, and only one of them can be active at a time. When the LOADI input is inactive (low), the latch circuit 202 is reset and the direct, write, read, and transfer mode signals are all turned off.

Figure 4:
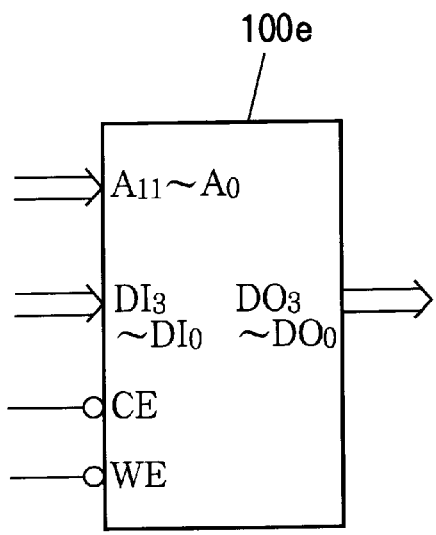
FIG. 4 shows an example of the input and output terminals of the non-volatile memory in FIG. 2.

FIG. 4 shows the input and output terminals of the EEPROM 100e. The EEPROM 100e used in this embodiment must be able to store at least two thousand four hundred ninety-six four-bit words of data; an EEPROM with a capacity of four thousand ninety-six words, for example, may be employed. Four-bit data are input at data input terminals $DI_3$ to $DI_0$, and output at data output terminals $DO_3$ to $DO_0$. Address signals generated by the counter 100c are input at address terminals $A_{11}$ to $A_0$. A chip enable signal is input at the CE terminal. A write enable signal is input at the WE terminal.

Figure 5:
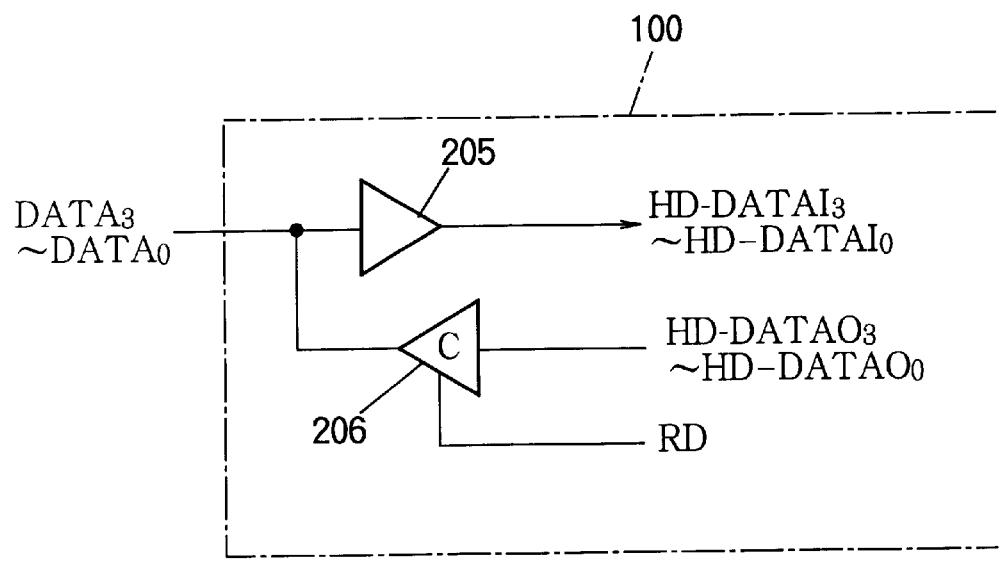
FIG. 5 illustrates the circuits coupled to the data input/output terminals of the control IC in FIG. 2.

FIG. 5 illustrates the circuits that are coupled directly to the data input/output terminals $DATA_3$ to $DATA_0$ of the control IC 100. Each data input/output terminal has a separate pair of buffer amplifiers 205 and 206. Only one pair of buffer amplifiers is shown in the drawing. Amplifier 206 is a three-state output buffer controlled by the read (RD) mode signal. When the read mode signal is active (high), data signals HD-DATAO$_3$ to HD-DATAO$_0$ created in the control IC 100 are output at these data input/output terminals $DATA_3$ to $DATA_0$. When the read mode signal is inactive (low), buffer amplifier 206 is in the high-impedance output state, and the external data signals on the signal lines HD-DATA$_3$ to HD-DATA$_0$ coupled to input/output terminals $DATA_3$ to $DATA_0$ are supplied to other circuits in the control IC 100, as data signals which will be denoted HD-DATAI$_3$ to HD-DATAI$_0$.

Figure 6:
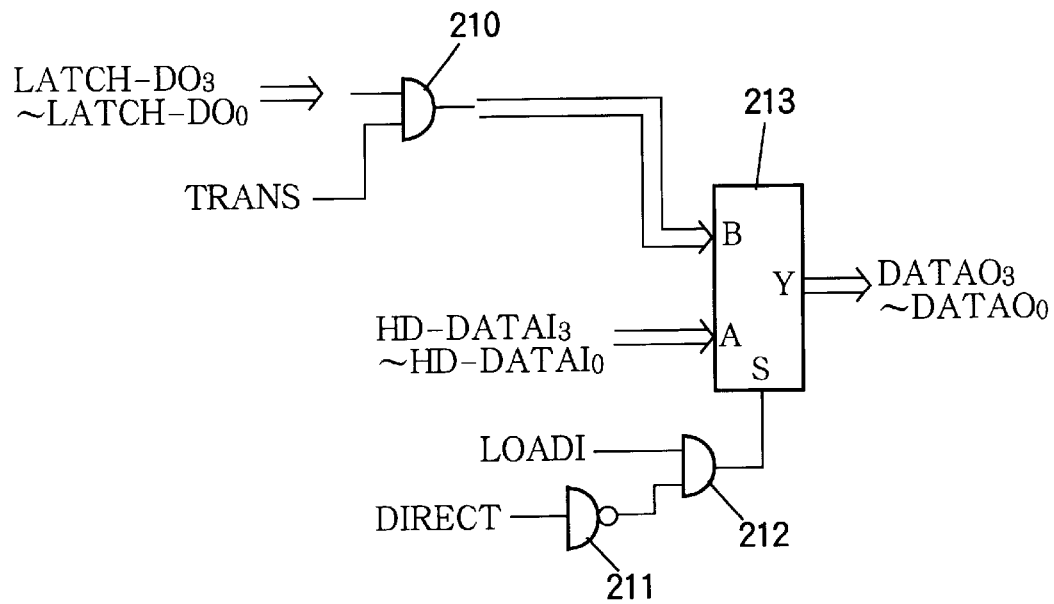
FIG. 6 illustrates the circuits coupled to the data output terminals of the control IC in FIG. 2.

FIG. 6 illustrates the circuits coupled to the data output terminals DATAO$_3$ to DATAO$_0$ of the control IC 100. Each data output terminal has a separate two-input AND gate 210. Reference numeral 210 thus denotes four AND gates, of which only one is visible. The other circuits in FIG. 6, namely the AND gate 212, inverter 211, and data selector 213, are single circuits that are shared by the four data output terminals.

All four AND gates 210 have the transfer mode signal (TRANS) as one of their two inputs. The other inputs to these AND gates 210 are the latched data outputs from the EEPROM 100e, which are held in latches not explicitly shown in the drawings, and are denoted LATCH-DO$_3$ to LATCH-DO$_0$. The four outputs of the AND gates 210 are supplied to four data input terminals of the data selector 213, collectively denoted by the letter B in FIG. 6.

The data selector 213 has four more data input terminals, collectively denoted by the letter A, that receive the data signals HD-DATAI$_3$ to HD-DATAI$_0$ shown in FIG. 5. The data selector 213 selects the A data inputs when the input at the select (S) input terminal is low, selects the B data inputs when the S input is high, and outputs the selected data from the DATAO$_3$ to DATAO$_0$ output terminals to the first driver IC 101.

The S input is created by AND gate 212 from the LOADI input and the direct mode signal, the latter being inverted by inverter 211. Thus when the LOADI input is inactive (low), or when the direct mode signal is active (high), S is low and HD-DATAI$_3$ to HD-DATAI$_0$ are output at DATAO$_3$ to DATAO$_0$. When the transfer mode signal and LOADI signals are both active (high), the latched EEPROM output data LATCH-DO$_3$ to LATCH-DO$_0$ are output at DATAO$_3$ to DATAO$_0$.(When the transfer mode signal is high, the direct mode signal is automatically low.)

Figure 7:
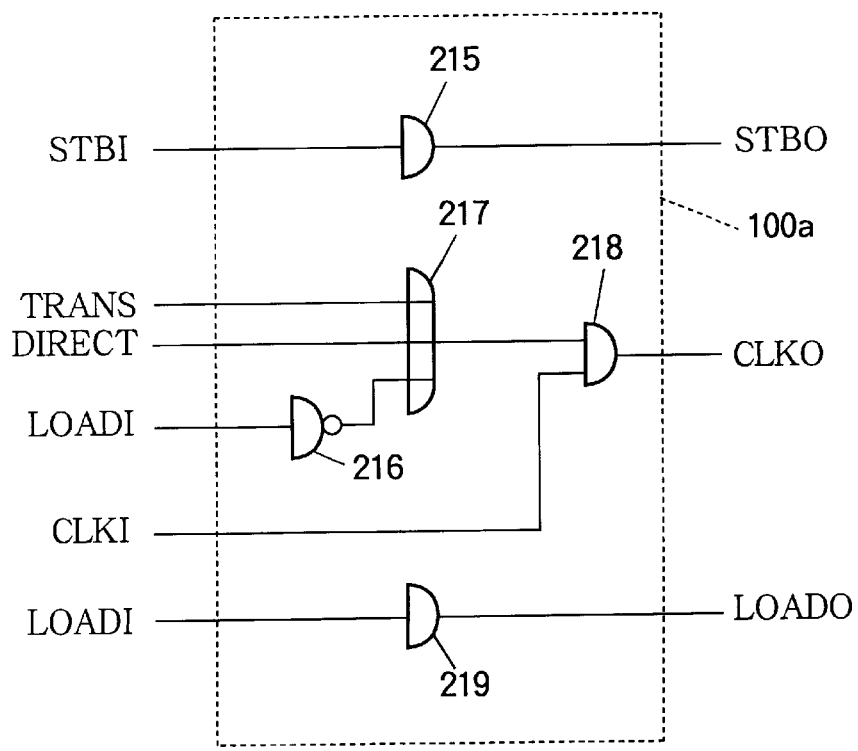
FIG. 7 shows an example of the internal structure of the clock control unit in FIG. 2.

FIG. 7 illustrates the clock control unit 100a, which comprises buffer circuits 215 and 219, an inverter 216, a three-input OR gate 217, and an AND gate 218. Buffers 215 and 219 couple the STBI and LOADI input terminals to the STBO and LOADO output terminals. The other circuit elements are coupled so as to transmit the HD-CLK signal from the CLKI input terminal to the CLKO output terminals when the transfer or direct mode signal is active (high), or when LOADI is low.

Figure 8:
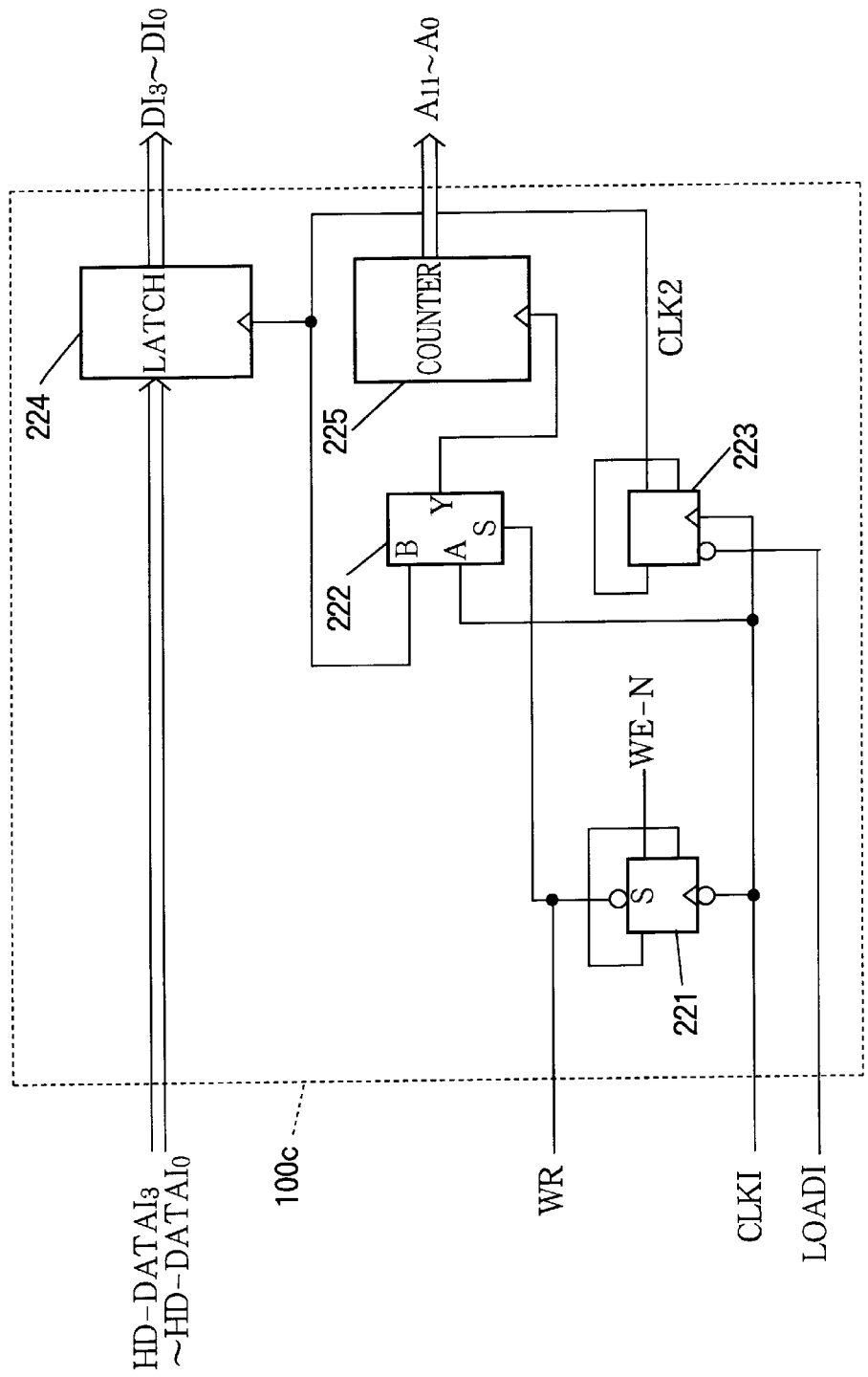
FIG. 8 shows an example of the internal structure of the counter in FIG. 2.

FIG. 8 illustrates the internal structure of the counter 100c that generates address signals for the EEPROM 100e. This counter comprises a flip-flop circuit 221 having a set (S) input terminal, a clock selector 222, another flip-flop circuit 223, a latch circuit 224, and a counter circuit 225.

Flip-flop circuits 221 and 223 both operate as toggle flip-flops, dividing the frequency of the HD-CLK signal input at CLKI by two. The outputs of these flip-flop circuits are a write enable signal (WE-N) and a second clock signal CLK2. The second clock signal CLK2 is input to the latch circuit 224, which latches data signals HD-DATAI$_3$ to HD-DATAI$_0$ and supplies these signals to the data input terminals DI$_3$ to DI$_0$ of the EEPROM 100e.

When the write (WR) mode signal is active (high), clock selector 222 selects CLK2 for input to the counter circuit 225, which generates successive addresses at the address input terminals $A_{11\ to\ A0}$ of the EEPROM 100e. The write enable signal WE-N cycles between the active and inactive states in synchronization with the CLKI input. These operations cause the input data HD-DATAI$_3$ to HD-DATAI$_0$ to be written into the EEPROM 100e in synchronization with CLK2.

When the write mode signal is inactive, the write enable signal WE-N is held in the inactive state, so the data inputs to the EEPROM 100e are ignored. In addition, clock selector 222 selects the HD-CLK signal input at the CLKI terminal, so the counter circuit 225 generates one address per HD-CLK cycle. These addresses are used for reading data from the EEPROM 100e in synchronization with HD-CLK.

Figure 9:
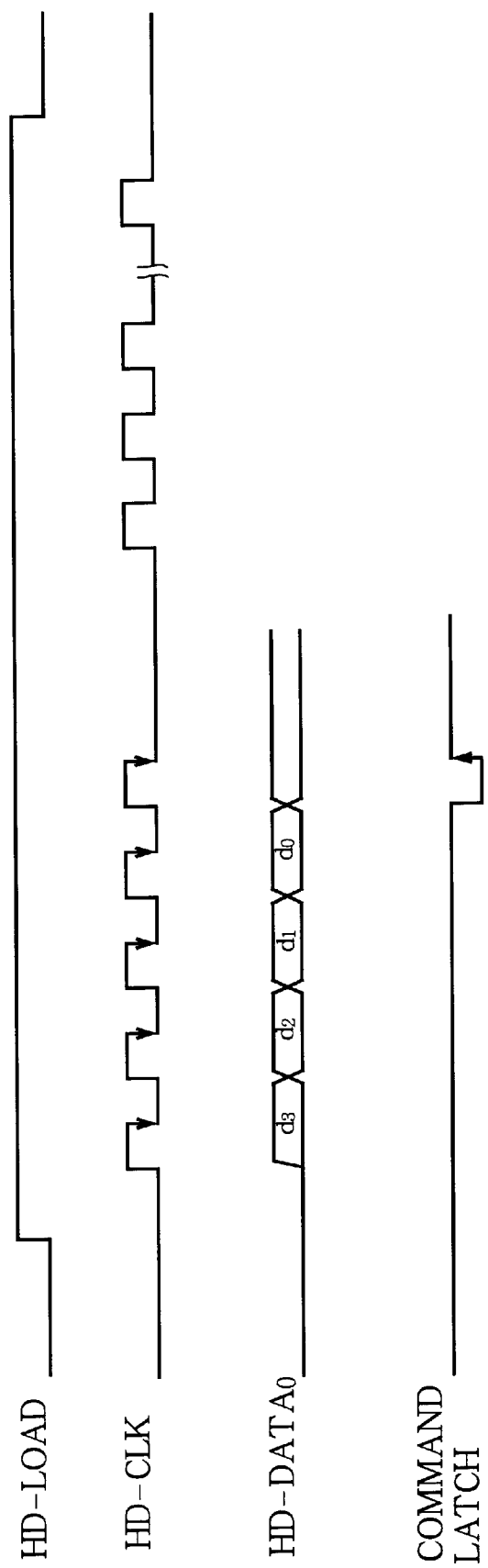
FIG. 9 is a timing diagram illustrating the transfer of mode command data to the driving apparatus.

FIG. 9 is a timing diagram illustrating the sending of a mode designation command to the LED head on the HD-DATA$_0$ signal line. Before the command is sent, the HD-LOAD signal is driven high to release the mode-setting circuit from the reset state. Next, serial data comprising bits $d_3, d_2, d_1,$ and $d_0$ are input on the HD-DATA$_0$ signal line, in synchronization with the HD-CLK signal.

At the fifth HD-CLK cycle, the counter circuit 204 in FIG. 3 activates the command latch signal, causing the latch circuit 202 to latch the mode signals decoded from data $d_3, d_2, d_1,$ and $d_0$ by the decoder 201, thereby setting the mode. This mode setting remains latched until the HD-LOAD signal goes low again. Next, further HD-CLK cycles are generated, causing the logic circuits in the LED head to operate according to the selected mode.

FIG. 10 lists the command data assignments to bits $d_3$, $d_2$, $d_1$, and $d_0$. The four operating modes in this embodiment can be described as follows.

In the write mode, compensation data derived from measurements of the optical output of the LEDs are written into the EEPROM 100e. This mode is used for writing compensation data into the EEPROM 100e when the LED head is manufactured.

In the transfer mode, the compensation data stored in the EEPROM 100e are read out and transferred to the driver ICs. This mode is used when, for example, the printer is powered up during normal use.

In the direct mode, compensation data derived from measurements of the optical output of the LEDs are transferred directly to the driver ICs, without being stored in the EEPROM 100e. Direct transfer enables the manufacturer to test the effect of compensation data before writing the compensation data into the EEPROM 100e. Direct transfer is quicker than first writing the data in the EEPROM, then transferring the data in the transfer mode.

In the read mode, the data stored in the EEPROM 100e are read out and provided from input/output terminals $DATA_3$ to $DATA_0$ to an external device, through a connector attached to the LED head. Read mode is useful in testing the LED head and confirming that the correct compensation data have been stored.

Figure 11:
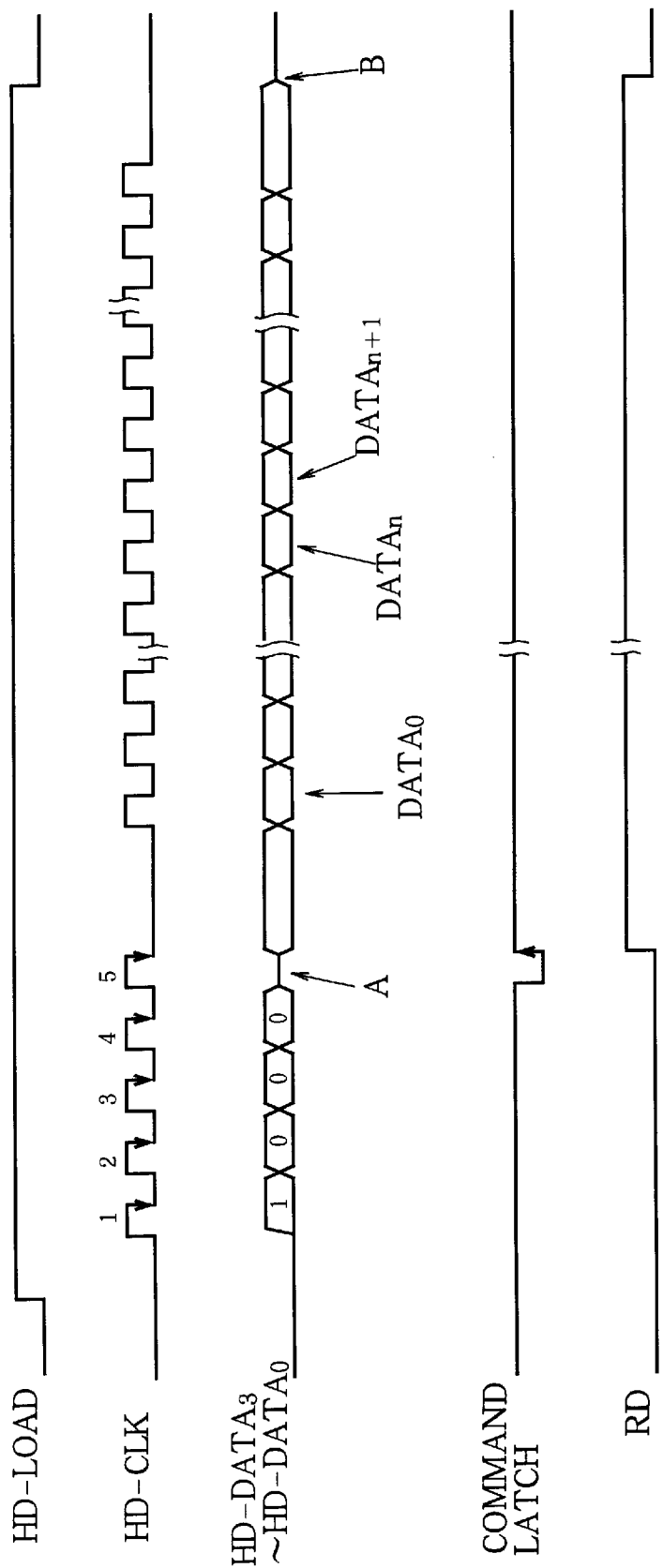
FIG. 11 is a timing diagram illustrating the reading of data from the non-volatile memory in the read mode.
Figure 12:
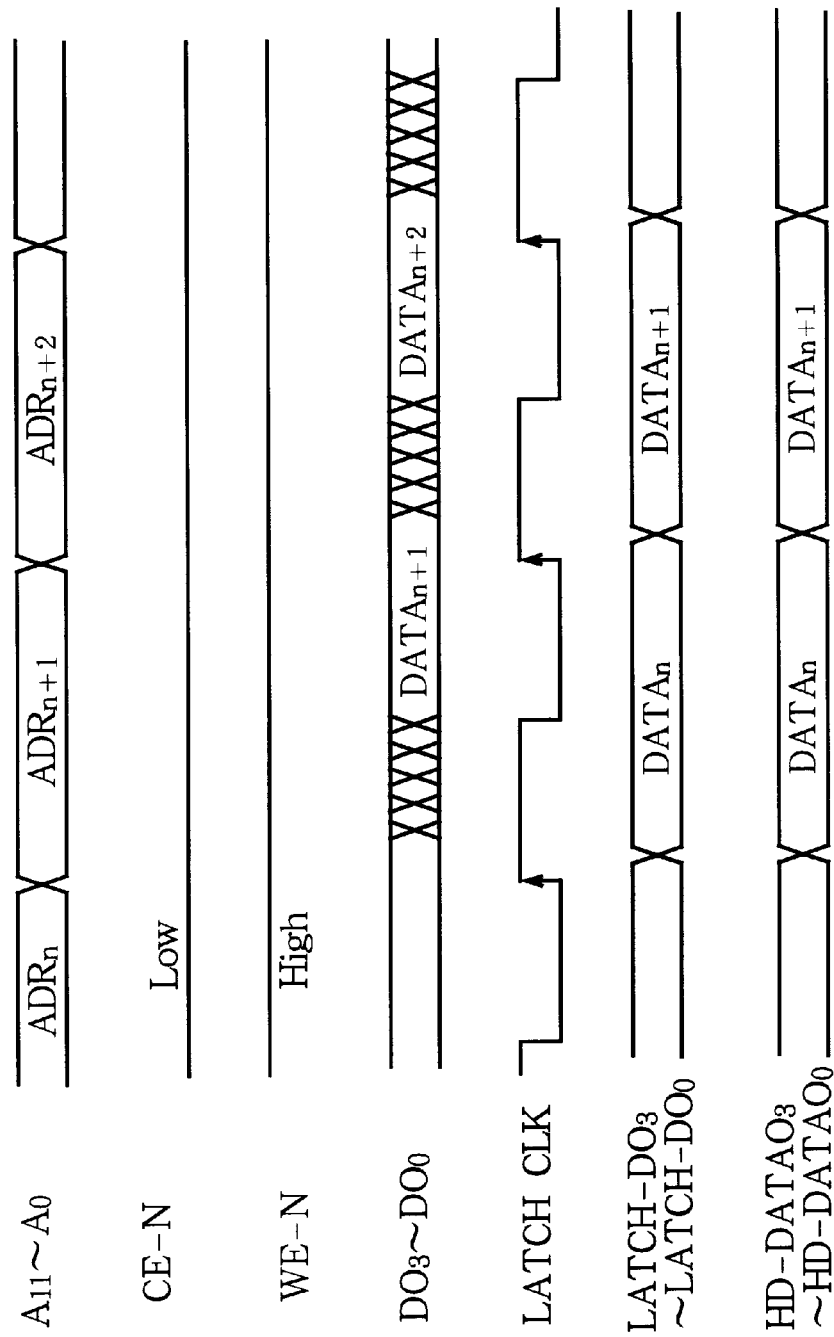
FIG. 12 is a more detailed timing diagram illustrating the reading of data from the non-volatile memory.

FIG. 11 is a timing diagram of the operation of sending the read mode command, then reading data from the EEPROM 100e. After the read mode command '1000' has been sent, the printing control unit places $HD\text{-}DATA_3$ to $HD\text{-}DATA_0$ in the high-impedance state, during the interval marked A in the drawing, and outputs a fifth HD-CLK pulse. At the trailing edge of this fifth HD-CLK pulse, the read mode is set and input/output terminals $DATA_3$ to $DATA_0$ are placed in the output state by activating the buffer amplifiers 206 shown in FIG. 5. These terminals remain in the output state until the HD-LOAD signal goes low to terminate the read mode, at the point marked B in the drawing. During the read mode, the EEPROM address changes at each HD-CLK cycle, and the data stored at these EEPROM addresses are latched and output on the $HD\text{-}DATA_3$ to $HD\text{-}DATA_0$ signal lines as $DATA_0, \ldots, DATA_n, DATA_{n+1}, \ldots$ FIG. 12 is a more detailed timing diagram showing how data are read out of the EEPROM. Successive addresses $ADR_n$, $ADR_{n+1}$, $ADR_{n+2}$ are sent to the address terminals $A_{11}$ to $A_0$. The data ($DATA_{n+1}$) stored at address $ADR_{n+1}$ are output from terminals $DO_3$ to $DO_0$ of the EEPROM, and latched by a latch circuit in synchronization with a latch clock signal (LATCH CLK) output from the clock control unit 100a (this latch circuit and latch clock signal were not explicitly shown in the preceding drawings). The latched data become the signals $LATCH\text{-}DO_3$ to $LATCH\text{-}DO_0$ supplied to the circuit in FIG. 6. In read mode, the latched data also become the signals $HD\text{-}DATAO_3$ to $HD\text{-}DATAO_0$ which are output from data input/output terminals $DATA_3$ to $DATA_0$ as shown in FIG. 5.

Figure 13:
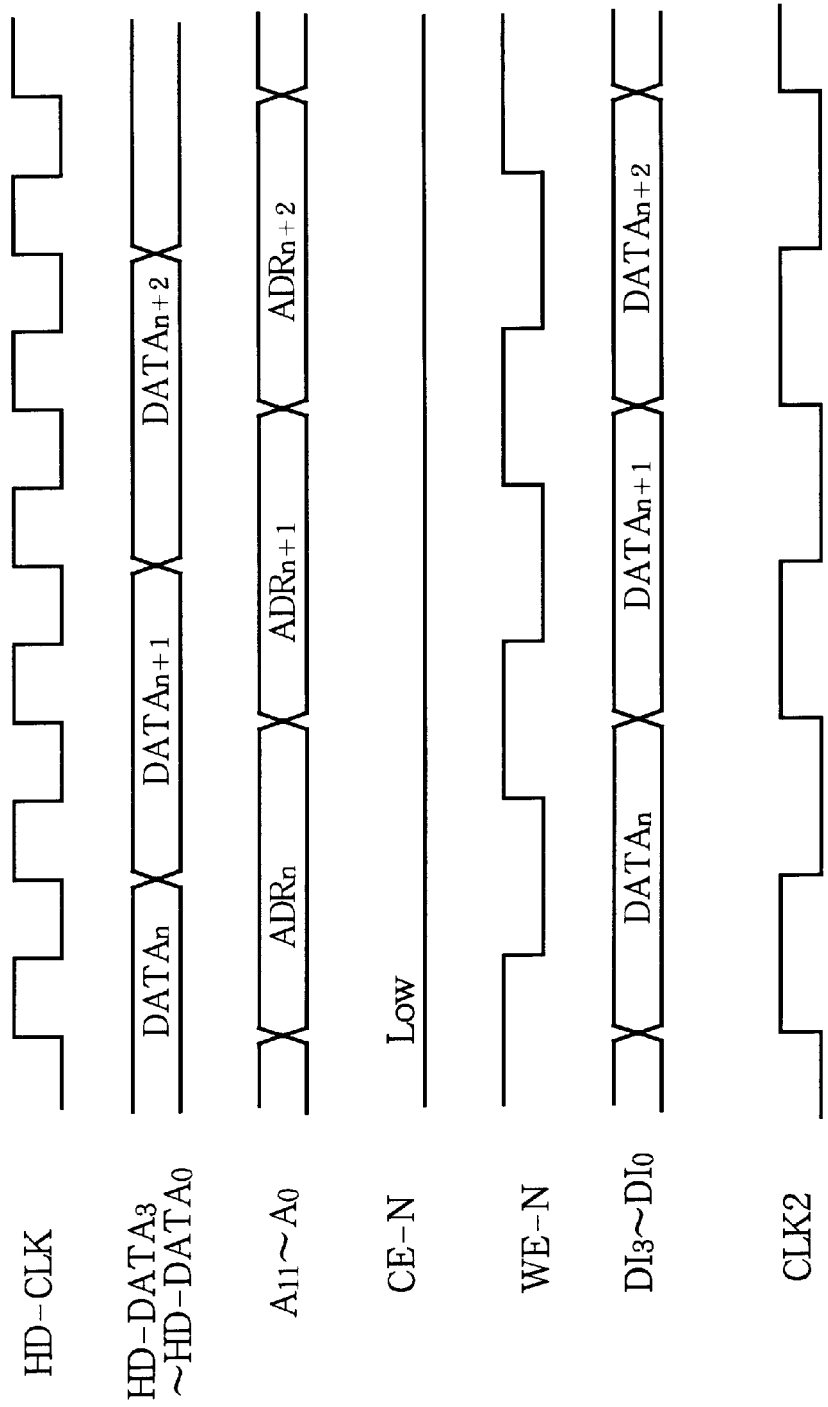
FIG. 13 is a timing diagram illustrating the writing of data to the non-volatile memory.

FIG. 13 is a timing diagram illustrating the operation of writing data into the EEPROM. After the write mode has been selected by serial command data sent to the LED head, further HD-CLK cycles cause the data on signal lines $HD\text{-}DATA_3$ to $HD\text{-}DATA_0$ to be written into the EEPROM in synchronization with the CLK2 signal, which has half the frequency of the HD-CLK signal. CLK2 is selected by the clock selector 222 in FIG. 8. Successive addresses $ADR_n$, $ADR_{n+1}$, $ADR_{n+2}$ are generated by counting CLK2, and furnished to the address terminals $A_{11}$ to $A_0$. The externally supplied data $HD\text{-}DATA_3$ to $HD\text{-}DATA_0$ become $HD\text{-}DATAI_3$ to $HD\text{-}DATAI_0$, which are latched in synchronization with CLK2, producing the data series $DATA_n$, $DATA_{n+1}$, $DATA_{n+2}$ in FIG. 13. These data are supplied to the input terminals $DI_3$ to $DI_0$ of the EEPROM, and latched inside the EEPROM at low-to-high transitions of the WE-N signal.

After thirty-two WE-N cycles, the latched data are written into the EEPROM memory cells. Due to the properties of the memory cells, each data write takes about ten milliseconds (10 ms). The printing control unit halts HD-CLK input while the write is in progress. After 10 ms, data input and HD-CLK input resume for thirty-two more WE-N cycles, then HD-CLK is halted again while the next thirty-two four-bit data words are written in the EEPROM memory cells. The write operation continues to repeat in this way.

Figure 14:
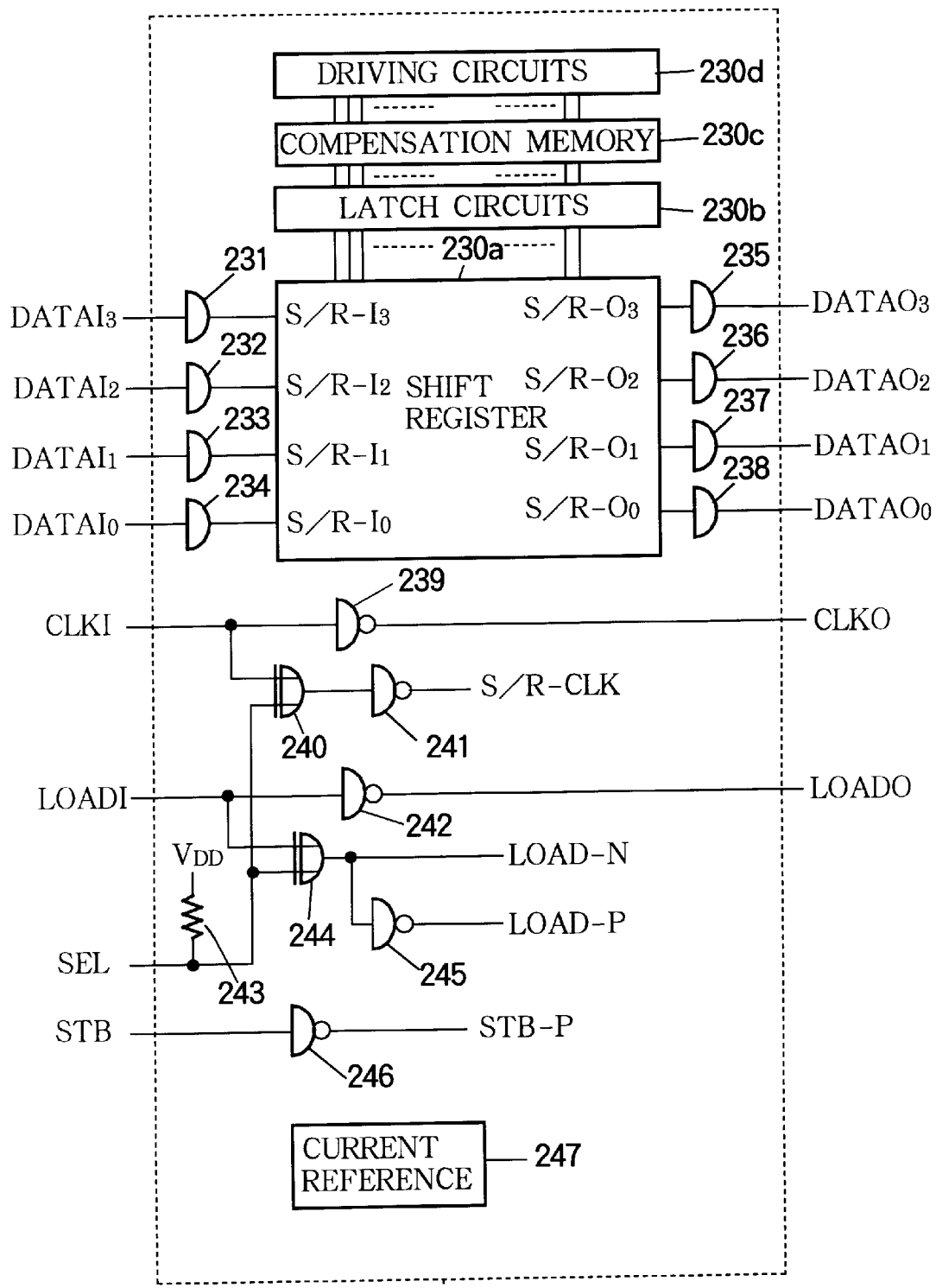
FIG. 14 is a block diagram illustrating the internal structure of the driver ICs in FIG. 1.

FIG. 14 is a block diagram of the first driver IC 101 in FIG. 1. All of the circuits enclosed in the dotted line are integrated into this driver IC. Driver ICs 102 to 126 have similar configurations. The main elements are a shift register 230a for transferring driving data and compensation data, a group of latch circuits 230b for temporarily latching the transferred driving data, a group of compensation memory circuits 230c for storing the transferred compensation data, and a group of driving circuits 230d for feeding current to LEDs designated by the driving data, in amounts adjusted according to the compensation data.

Each driver IC also has input buffer circuits 231 to 234, output buffer circuits 235 to 238, inverters 239, 241, 242, 245, and 246, exclusive-OR gates 240 and 244, a pull-up resistor 243, and a current reference circuit 247. The input buffer circuits 231 to 234 couple input terminals $DATAI_3$ to $DATAI_0$ to input terminals $S/R\text{-}I_3$ to $S/R\text{-}I_0$ of the shift register 230a. The output buffer circuits 235 to 238 couple output terminals $DATAO_3$ to $DATAO_0$ to output terminals $S/R\text{-}O_3$ to $S/R\text{-}O_0$ of the shift register 230a.

The clock signal input to driver IC 101 at the CLKI terminal is inverted by inverter 239 and output at the CLKO output terminal. The load signal input at the LOADI terminal is inverted by inverter 242 and output at the LOADO output terminal. The signals output at output terminals CLKO and LOADO are supplied to the next driver IC 102. These signals continue to be passed from one driver IC to the next driver IC until they reach the last driver IC 126.

Since the above signals are inverted by the inverters 239 and 242 as they pass through each driver IC, even if there are differences between the rise time and fall time of the inverters, these differences will be averaged out as the signals pass through the driver ICs, and the pulse width of the signals input to the CLKI and LOADI terminals of driver IC 126 will be substantially the same as the pulse width of the signals input to the CLKI and LOADI terminals of driver IC 101.

If the SEL input terminal is left unconnected, as in driver IC 101, pull-up resistor 243 generates a high signal, so that the S/R-CLK and LOAD-P signals are logically equivalent to the signals input at the CLKI and LOADI terminals. If the SEL input terminal is grounded, as in driver IC 102, then S/R-CLK and LOAD-P are logically inverted with respect to the CLKI and LOADI inputs; consequently, S/R-CLK and LOAD-P in all of the driver ICs 101 to 126 are logically equivalent to the CLKI and LOADI inputs to driver IC 101.

Figure 15:
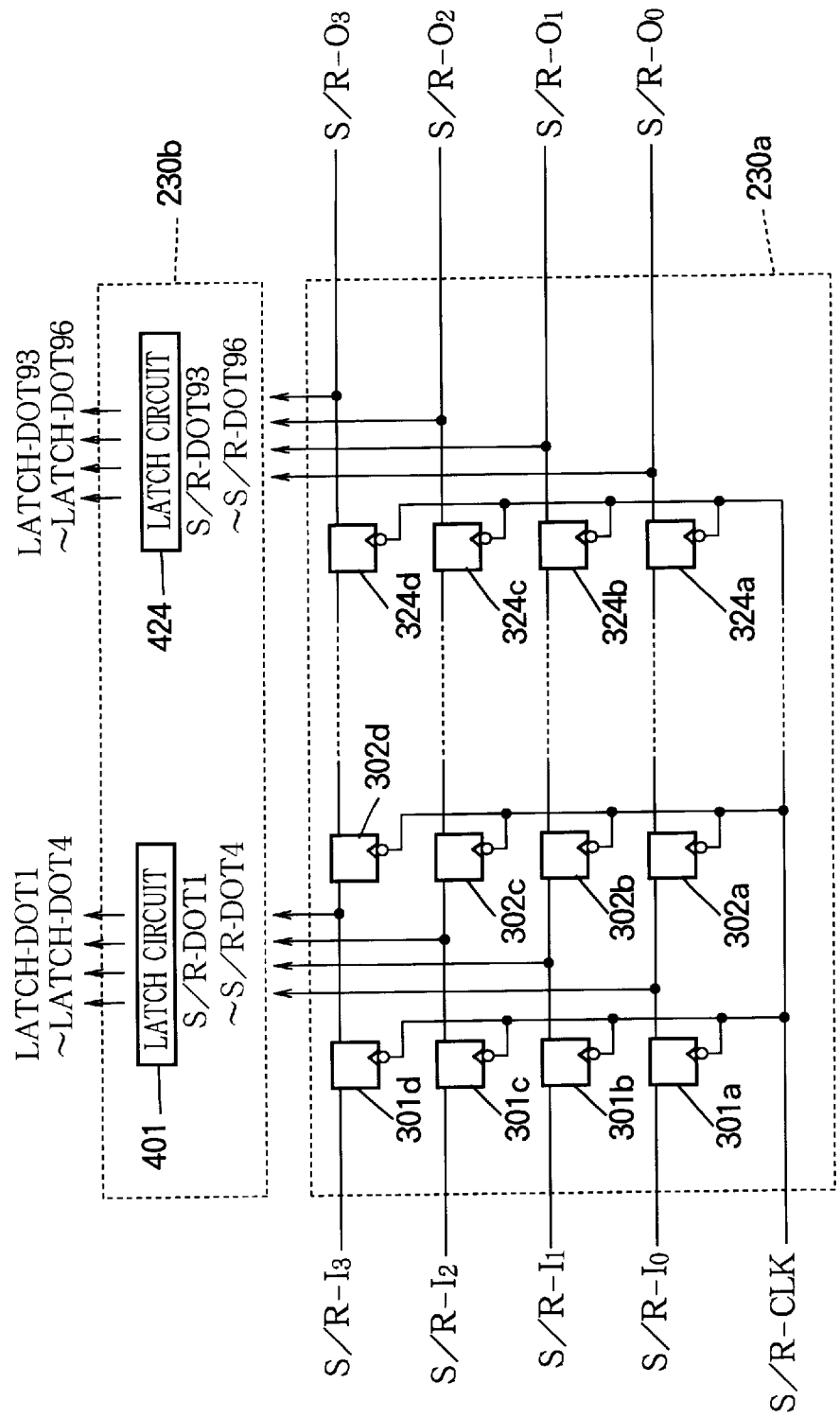
FIG. 15 is a more detailed circuit diagram illustrating the structure of the shift register in FIG. 14, and showing connections to related circuits.
Figure 16:
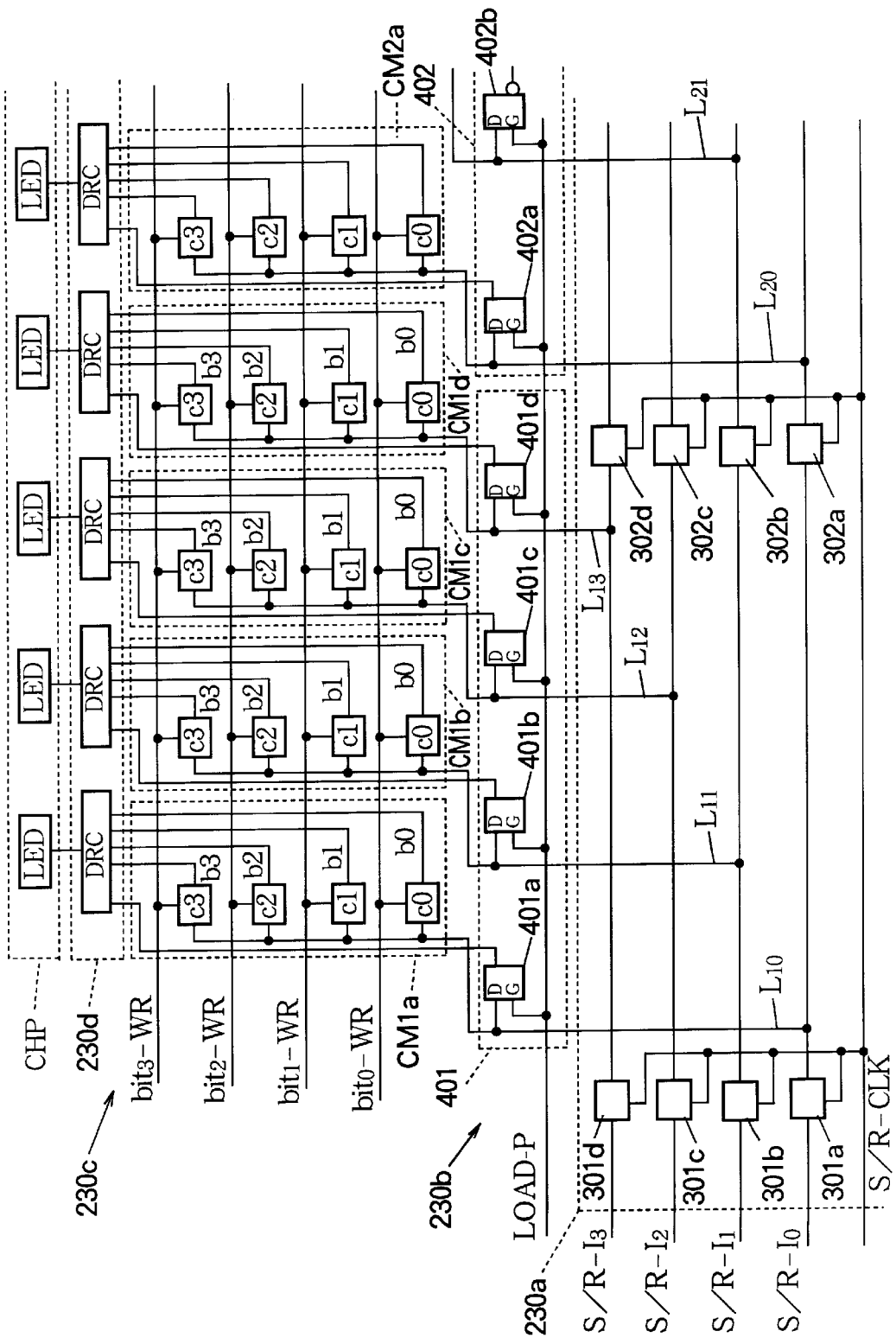
FIG. 16 is a more detailed circuit diagram illustrating the interconnections among the shift register and the groups of latch circuits, compensation memory circuits, and driving circuits in FIG. 14.

FIG. 15 illustrates the interconnections between the shift register 230a and the group of latch circuits 230b. FIG. 16 illustrates the interconnections among the shift register 230a and the groups of latch circuits 230b, compensation memory circuits 230c, driving circuits 230d, and the driven LEDs. The group of compensation memory circuits 230c comprises the compensation memory circuits CM1a, CM1b, ... shown in FIG. 16. FIG. 16 shows only the initial portion of the shift register 230a, group of latch circuits 230b, group of compensation memory circuits 230c, and group of driving circuits 230d, but the remaining portion of the circuit configuration is similar to this initial portion.

The shift register 230a has twenty-four stages, through which driving data and compensation data are shifted in four-bit parallel form. The first stage comprises four flip-flop circuits 301a, 301b, 301c, and 301d; the second stage comprises four flip-flop circuits 302a, 302b, 302c, and 302d; the last stage comprises four flip-flop circuits 324a, 324b, 324c, and 324d. The clock signal S/R-CLK is supplied to the clock terminals of the flip-flop circuits in FIGS. 15 and 16. The data output from the flip-flop circuits 301a, 301b, ... in the shift register 230a are denoted S/R-DOT1, S/R-DOT2, ..., while the corresponding data output from the latch circuits are denoted LATCH-DOT1, LATCH-DOT2, ..., as indicated in FIG. 15.

The group of latch circuits 230b comprises latch elements 401a to 424d that receive and temporarily store the outputs of the corresponding flip-flop circuits 301a to 324d in the shift register 230a. The four latch elements that receive and store the outputs of the four flip-flop circuits in the same shift-register stage constitute what will be referred to below as one latch circuit. For example, the four first-stage latch elements 401a to 401d constitute one latch circuit 401.

The group of compensation memory circuits 230c has compensation memory circuits CM1a to CM24d that receive and store the outputs of the corresponding flip-flop circuits 301a to 324d in the shift register 230a. Each compensation memory circuit has four memory cells, denoted c0, c1, c2, and c3, and stores four bits of data. The signals denoted $bit_0$-WR to $bit_3$-WR that determine which memory cell receives each data bit are generated by circuits that will be shown in FIGS. 22 to 24.

The group of driving circuits 230d comprises driving circuits (DRC) that receive the outputs of flip-flop circuits 301a to 324d, latch elements 401a to 424d, and compensation memory circuits CM1a–CM24d, and supply drive current through corresponding output terminals to the LEDs in the corresponding LED array chip (CHP). Each LED is driven by a separate driving circuit.

The compensation data are written into the compensation memory circuits 230c when the LED head is powered up, remain stored in those memory circuits until power is switched off, and are used repeatedly during printing. During the writing of compensation data at power-up, the shift register 230a transfers data supplied from the EEPROM 100e in the control IC 100. During the printing of data, the shift register 230a transfers driving data supplied from the printing control unit. The driving data are latched by the latch circuits 401 to 424. The compensation data bypass the latch circuits 401 to 424.

As can be seen from FIGS. 1 and 14, the shift registers 230a in driver ICs 101 to 126 are interconnected to form one continuous shift register, which functions as a four-bit parallel data transfer means. Due to the adoption of parallel transfer, a typical bit need be shifted through only twenty-four of the ninety-six flip-flop circuits in each driver IC. For example, the bit input at input terminal S/R-$I_0$ in FIGS. 15 and 16 is shifted through flip-flops 301a, 302a, ..., 324a.

During the transfer and writing of compensation data, four bits are transferred for each LED. The transfer and writing of these bits take place in the following sequence.

First, the most significant bits (bit $b_3$) of compensation data for all the LEDs are shifted through the shift registers 230a in the driver ICs until each of the flip-flops 301a to 324d in each driver IC holds one most significant bit; then these most significant bits are all written at once into the first memory cell (c3) in each compensation memory circuit.

Next, the second bits (bit $b_2$) of compensation data for all the LEDs are similarly shifted through the shift registers 230a in the driver ICs and all written at once into the second memory cells (c2) in the compensation memory circuits.

Following this, the third bits (bit $b_1$) of compensation data for all the LEDs are likewise shifted through the shift registers 230a in the driver ICs and all written at once into the third memory cells (c1) in the compensation memory circuits.

Finally, the fourth bits (bit $b_0$) of compensation data for all the LEDs are shifted through the shift registers 230a in the driver ICs and all written at once into the fourth memory cells (c0) in the compensation memory circuits.

In the transfer of driving data during printing, only one bit per LED is transferred. After all bits have been transferred into the flip-flops 301a to 324d of the shift registers, all bits are latched simultaneously by the latch elements 401a to 424d in the latch circuits. The driving data held in the latch circuits and the compensation data stored in the compensation memory circuits are then transferred to the corresponding drive circuits (DRC) and used in driving the LEDs.

The compensation memory circuits have static memory cells. The four memory cells in each memory circuit share a common input line, which is coupled to the corresponding flip-flop in the shift register 230a.

Figure 17:
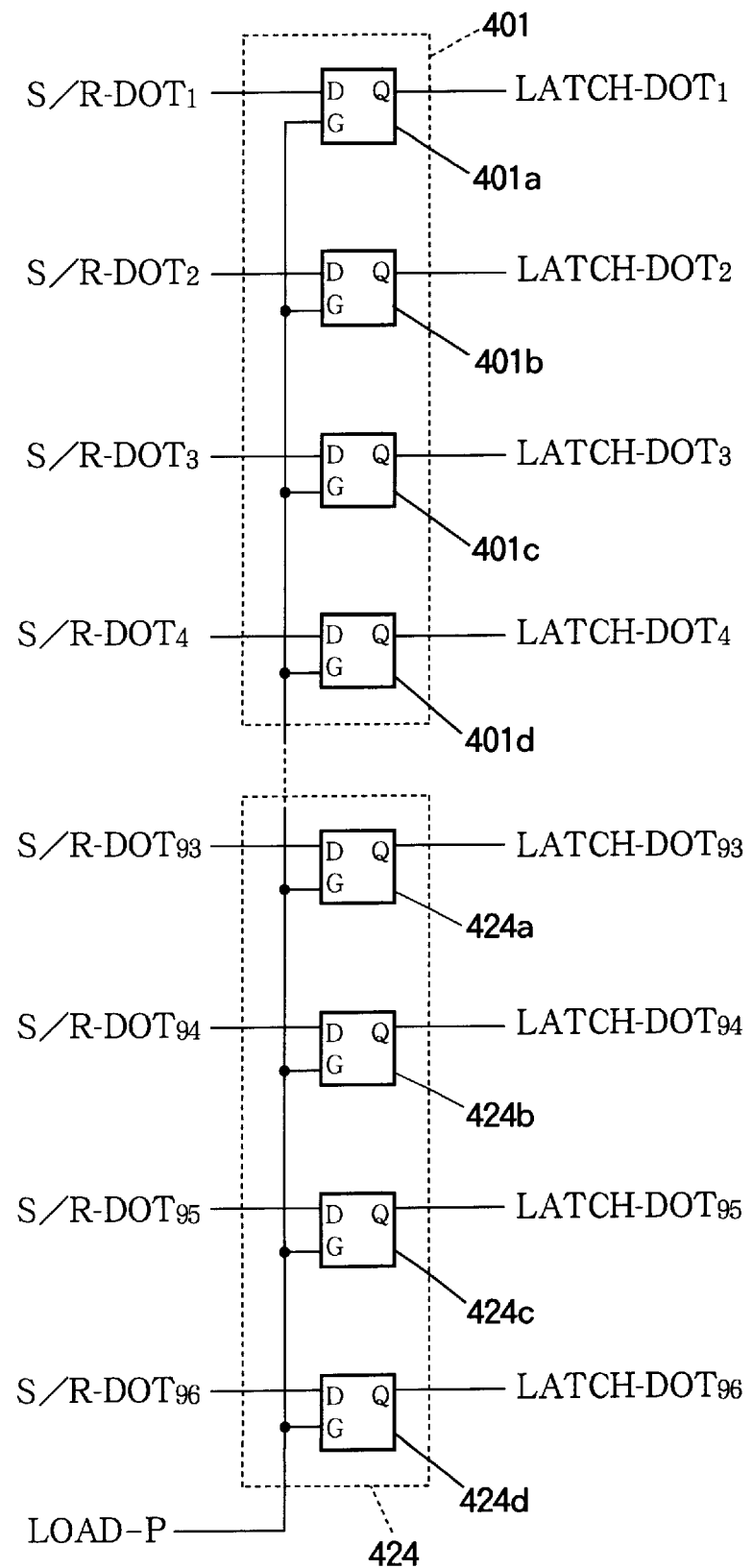
FIG. 17 illustrates two of the latch circuits in FIG. 16.

FIG. 17 illustrates the latch circuits 401 to 424. The LOAD-P signal is supplied to the enable (G) input terminals of all latch elements from 401a to 424d. Data received at the input terminals (D) of these latch elements are reproduced at their output terminals (Q), but the output data (Q) cannot change while LOAD-P is low.

Figure 18:
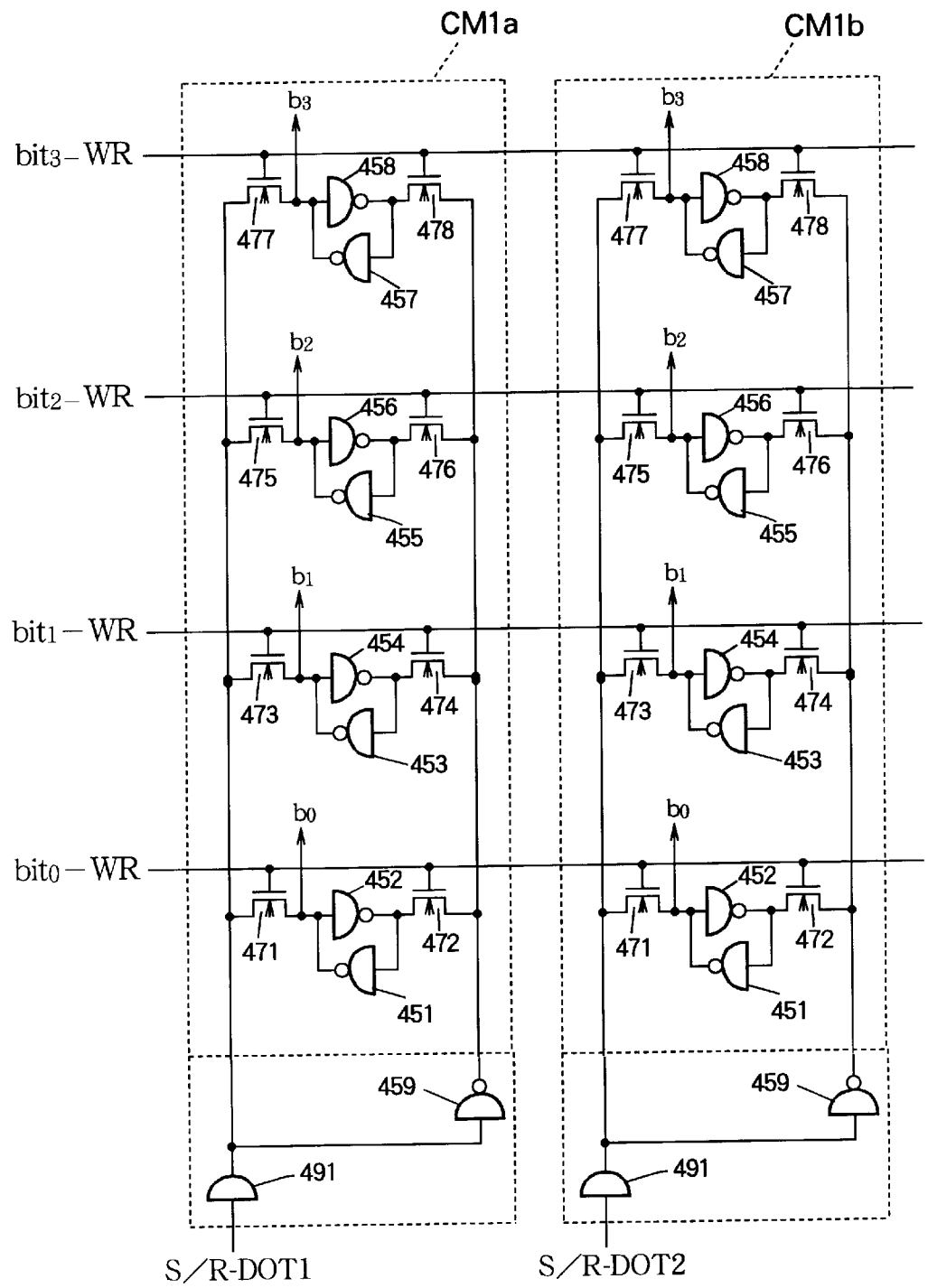
FIG. 18 is a circuit diagram illustrating two of the compensation memory circuits in FIG. 16.

FIG. 18 illustrates the detailed circuit configuration of the compensation memory circuits. Only the compensation memory circuits CM1a and CM1b pertaining to the first two LEDs are shown, but the other compensation memory circuits are similar.

Each of the compensation memory circuits separately has inverters 451 to 459, n-channel MOS transistors 471 to 478, read-out signal lines for bits $b_0$ to $b_3$, and a buffer 491. The buffers 491 receive the data S/R-DOT1, S/R-DOT2, ... output by the shift register 230a.

Inverters 451 and 452 store bit $b_0$ of the LED compensation data. Writing of bit $b_0$ is controlled by n-channel MOS transistors 471 and 472. The gates of these transistors 471 and 472 receive the write command signal $bit_0$-WR. The other bits ($b_1$, $b_2$, $b_3$) are stored in similar fashion in the other pairs of inverters.

Inverters 451 and 452 and transistors 471 and 472 constitute memory cell c0 in FIG. 16. Similarly, inverters 453 and 454 and transistors 473 and 474 constitute memory cell c1, inverters 455 and 456 and transistors 475 and 476 constitute memory cell c2, and inverters 457 and 458 and transistors 477 and 478 constitute memory cell c3.

The memory cell that stores one bit of compensation data comprises two MOS transistors and two inverters. Each inverter comprises two MOS transistors. Six transistors thus suffice to store each bit of compensation data, instead of the twenty transistors that would be required if flip-flop circuits were employed for the storage of compensation data. This makes the circuit size of the present embodiment much smaller than the size of a driver IC storing compensation data in flip-flop circuits.

The memory cells in FIG. 18 are similar to well-known static random-access memory (SRAM) cells, but with one significant difference. In an SRAM, data are read out from the memory cells onto a common bus, so the number of bits that can be read simultaneously is limited by the bus width. In FIG. 18, however, each memory cell has its own read-out signal line, so all of the nearly ten thousand bits of compensation data stored in the compensation memory circuits in the LED head are simultaneously readable.

Figure 19:
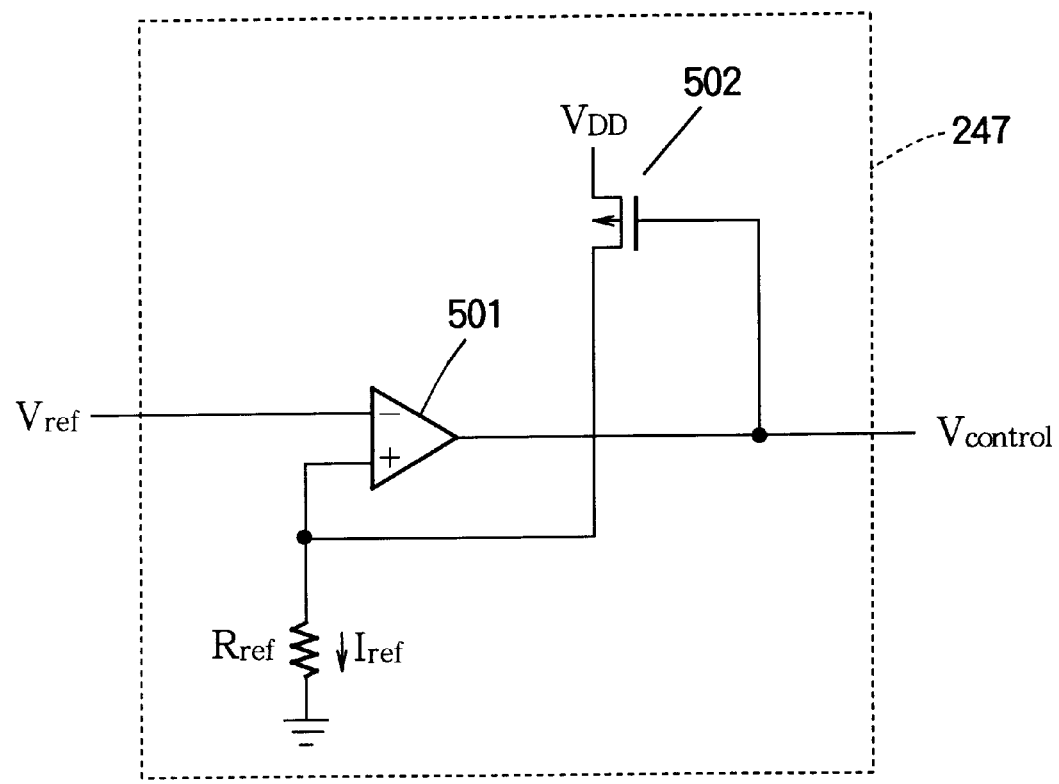
FIG. 19 is a circuit diagram showing an example of the configuration of the current reference circuit in FIG. 14.

FIG. 19 illustrates the internal structure of the current reference circuit 247, which comprises an operational amplifier 501, a p-channel MOS transistor 502, and a resistor with a resistance value of $R_{ref}$. The function of this circuit is to generate a control voltage $V_{control}$ for use in the driving circuits.

Figure 27:
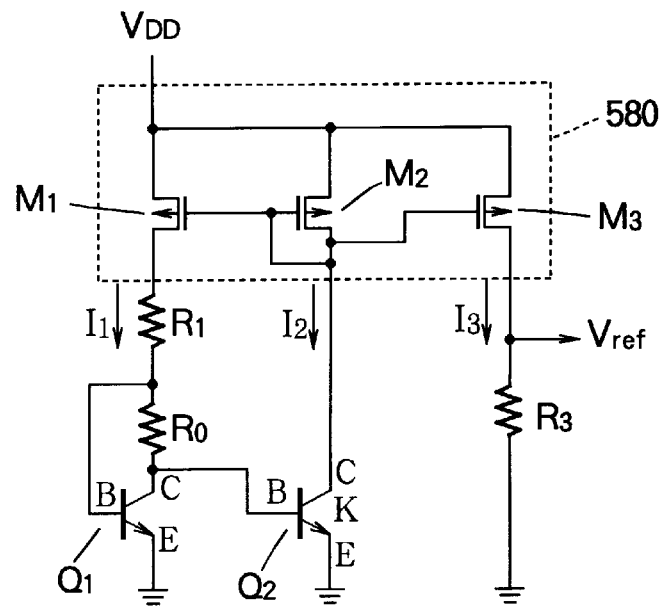
FIG. 27 is a circuit diagram of a temperature-sensing circuit according to a first embodiment of the invention.

The inverting (−) input terminal of the operational amplifier 501 receives a reference voltage $V_{ref}$ output from a temperature-sensing circuit that will be described later (FIG. 27). The non-inverting (+) input terminal of operational amplifier 501 is coupled through p-channel MOS transistor 502 to the power supply ($V_{DD}$), and through resistor $R_{ref}$ to ground. The transistor 502 and resistor $R_{ref}$ are thus coupled in series between $V_{DD}$ and ground. The output of the operational amplifier 501, which is the control voltage $V_{control}$, is applied to the gate of the p-channel MOS transistor 502. The operational amplifier 501 operates so as to equalize the inputs at its two input terminals. This operation produces a constant reference current $I_{ref}$ through transistor 502 and resistor $R_{ref}$, given by the following equation:

$$I_{ref}=V_{ref}/R_{ref}$$

Figure 20:
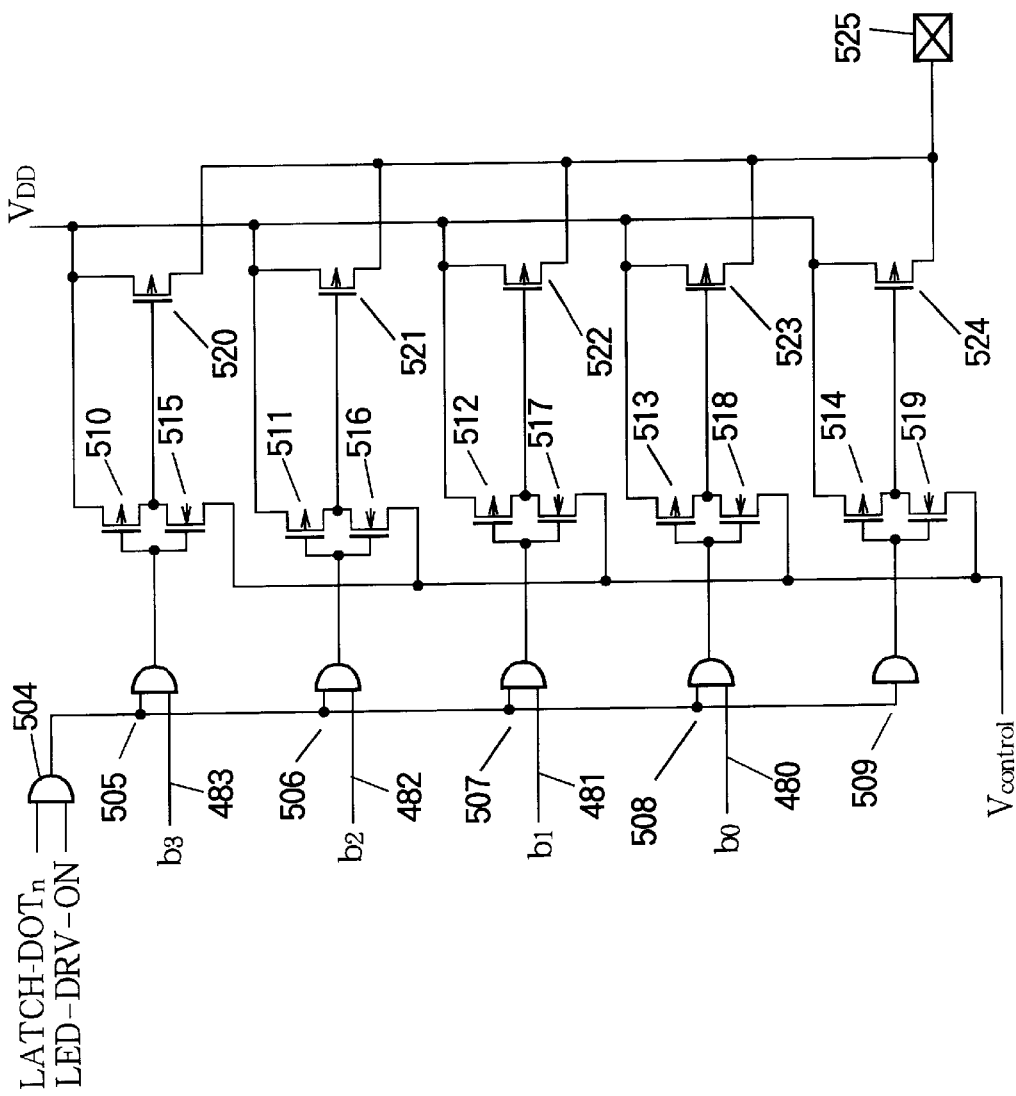
FIG. 20 is a circuit diagram illustrating the internal structure of one of the driving circuits in FIG. 14, showing the circuitry for driving one LED.

FIG. 20 illustrates one of the driving circuits in the group of driving circuits 230d, and the output terminal 525 through which this driving circuit drives one LED (the n-th LED in the LED array). The anode of the LED (not visible) is coupled to output terminal 525.

The circuit in FIG. 20 comprises AND gates 504 to 508, a buffer circuit 509, p-channel MOS transistors 510 to 514, n-channel MOS transistors 515 to 519, and p-channel MOS transistors 520 to 524 that feed drive current to output terminal 525.

The inputs to AND gate 504 are the LATCH-DOTn signal and an LED-DRV-ON signal. The output terminal of AND gate 504 is coupled to input terminals of AND gates 505 to 508 and buffer circuit 509. The other input terminals of AND gates 505 to 508 receive compensation data bits $b_3$ to $b_0$, respectively, from the corresponding compensation memory circuit, as shown in FIG. 18. The source terminals of n-channel MOS transistors 515 to 519 receive the control voltage $V_{control}$ output by the current reference circuit 247 in FIG. 19.

Transistor 524 is the main driving transistor that feeds driving current to the LED. Transistors 520 to 523 are compensation transistors that feed additional current to adjust the optical output of the LED. Transistors 520 to 523 have equal gate lengths, and their gate widths are in the ratio 8:4:2:1, corresponding to compensation data bits $b_3$ to $b_0$. (Transistors 502 and 520 to 524 all have the same gate length.) Transistors 520 to 523 generate weighted compensation currents in proportion to their gate widths.

Transistor 524 is switched on when the LED-DRV-ON and LATCH-DOTn signals are both high. Transistors 520 to 523 are switched on when LED-DRV-ON, LATCH-DOTn, and the corresponding compensation data bits $b_3$ to $b_0$ are all high. The current supplied from output terminal 525 to the LED is the sum of a main driving current contributed by transistor 524, and weighted compensation currents contributed by those transistors 520 to 523 that are switched on.

Transistors 510 to 519 form five inverters through which the gates of transistors 520 to 524 are driven. The control voltage $V_{control}$ output by the current reference circuit 247 is supplied to the source terminals of transistors 515 to 519. When transistors 515 to 519 are switched on, they supply voltages substantially equal to $V_{control}$ to the gate terminals of the driving transistors 520 to 524. Transistor 502 in FIG. 19 and transistors 520 to 524 in FIG. 20 thus form a current mirror.

The drain currents output by driving transistors 520 to 524 (when switched on) are determined by the ratios of the gate widths of these driving transistors to the gate width of transistor 502. The LED driving currents supplied by the driving transistors 520 to 524 in all of the driving circuits 230d in the driver IC are controlled simultaneously by the control voltage $V_{control}$, which in turn is controlled by the reference voltage $V_{ref}$ output by the temperature-sensing circuit to be described below. Specifically, the driving currents are proportional to the reference current $I_{ref}$ in FIG. 19, which is proportional to the reference voltage $V_{ref}$.

Figure 21:
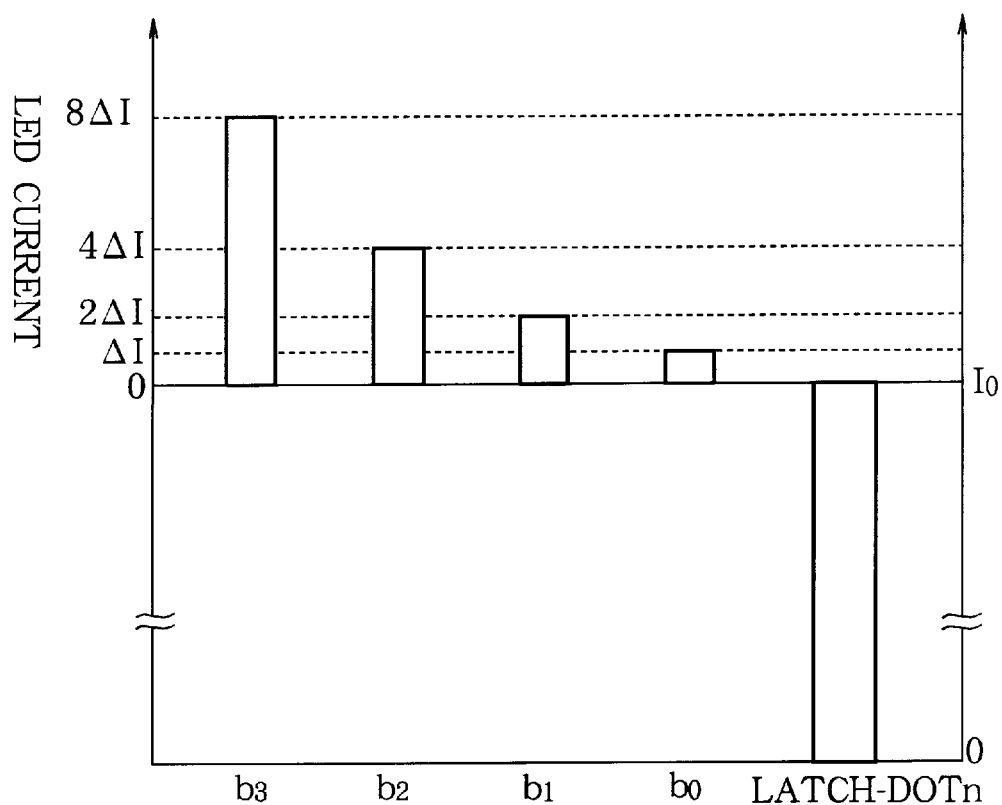
FIG. 21 is a graph illustrating the compensation for differences in the optical output of the LEDs.

The bar graph in FIG. 21 illustrates the relative sizes of the currents output by p-channel MOS transistors 520, 521, 522, 523, and 524 when these transistors are driven. The main driving current has a value $I_0$. The compensation currents output in response to bits $b_3$, $b_2$, $b_1$, and $b_0$ have values of 8ΔI, 4Δ1, 2ΔI, and ΔI, respectively. The quantity ΔI represents the minimum step in which the LED driving current can be varied by the compensation data. By storing various compensation data values, the LED driving current can be varied in sixteen steps, ranging from $I_0$ (when $b_3$, $b_2$, $b_1$, and $b_0$ are all zero) to $I_0+15\Delta I$ (when $b_3$, $b_2$, $b_1$, and $b_0$ are all one).

Figure 22:
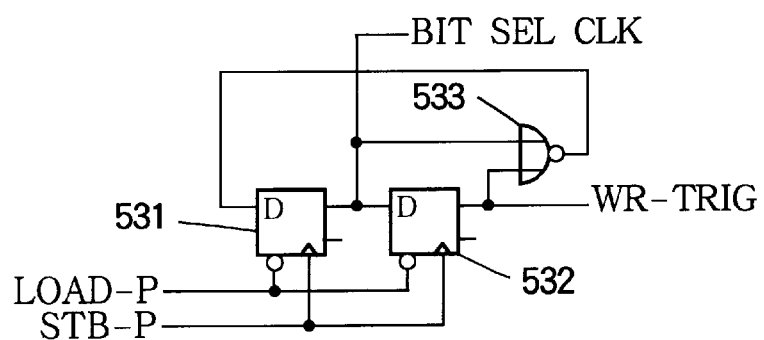
FIG. 22 is a circuit diagram of a timing generator circuit in the driver ICs in FIG. 1.

FIG. 22 illustrates a timing generator (not shown in FIG. 14) which is disposed in driver ICs 101 to 126. The timing generator comprises a pair of flip-flop circuits 531 and 532 and a NOR gate 533, which are interconnected to form a ring counter. The LOAD-P signal is supplied to the reset input terminals of flip-flop circuits 531 and 532. The STB-P signal is supplied to the clock input terminals of flip-flop circuits 531 and 532. The outputs of this timing generator are a bit select clock (BIT SEL CLK) signal and a write trigger (WR-TRIG) signal. For every three cycles of STB-P, one BIT SEL CLK pulse is output, followed by one WR-TRIG pulse, as will be shown in FIG. 26.

Figure 23:
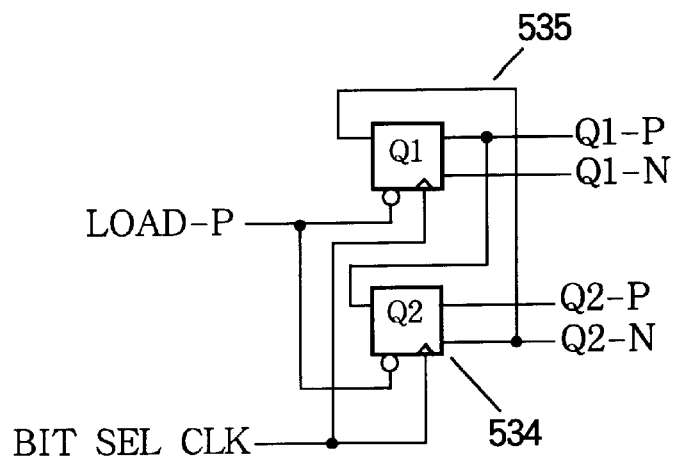
FIG. 23 is a circuit diagram of a bit position counter circuit in the driver ICs in FIG. 1.

FIG. 23 illustrates a compensation bit position counter (not shown in FIG. 14) which is disposed in the driver ICs. This counter comprises flip-flop circuits 534 and 535, which are interconnected to form a Johnson counter. The LOAD-P signal is supplied to the reset input terminals of flip-flop circuits 534 and 535. The BIT SEL CLK signal is supplied to the clock input terminals of these flip-flop circuits 534 and 535. The outputs of this counter are two complementary pairs of signals denoted Q1-P, Q1-N, Q2-P, and Q2-N.

Figure 24:
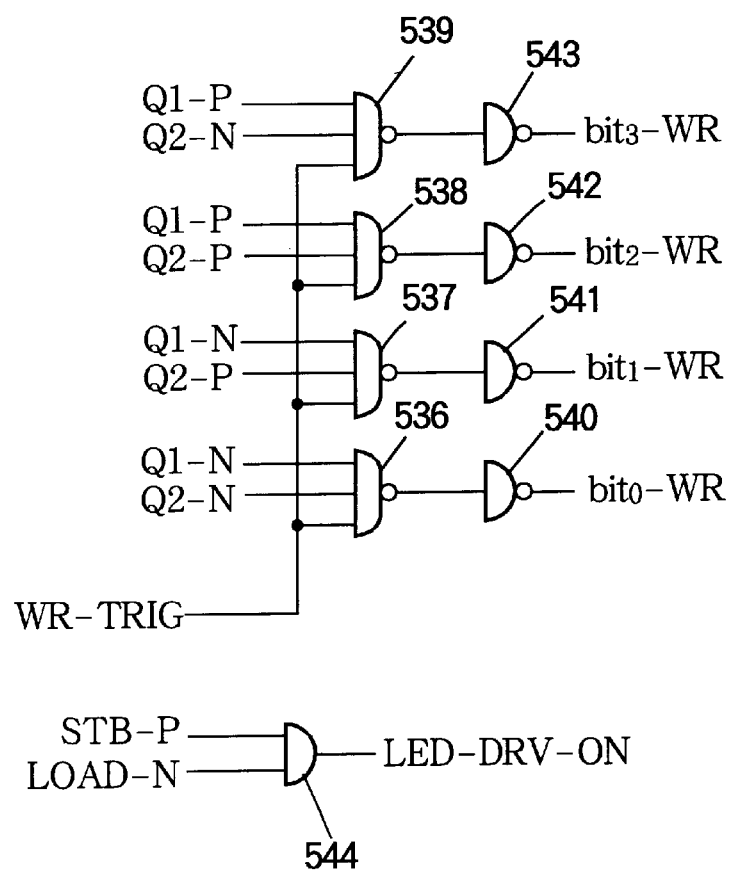
FIG. 24 is a circuit diagram of a word-line decoder circuit in the driver ICs in FIG. 1.

FIG. 24 illustrates a word-line decoder (also not shown in FIG. 14) which is disposed in each of the driver ICs. This decoder comprises NAND gates 536 to 539 and inverters 540 to 543. All four NAND gates 536 to 539 receive the WR-TRIG signal output by the timing generator in FIG. 22. Each NAND gate also receives two of the signals Q1-P, Q1-N, Q2-P, and Q2-N output by the compensation bit position counter. The outputs of the NAND gates go low one at a time responsive to different combinations of the logic levels of Q1-P, Q1-N, Q2-P, and Q2-N. These outputs are inverted by inverters 540 to 543 to generate the signals $bit_3$-WR to $bit_0$-WR that control the writing of compensation data into the compensation memory circuits.

The word-line decoder circuit also generates the LED-DRV-ON signal by means of an AND gate 544 that receives the STB-P and LOAD-N signals. When the load signal is active (when LOAD-P is high and LOAD-N is low), LED-DRV-ON is held in the inactive (low) state, so that the LEDs are not driven.

The circuits in FIGS. 23 and 24 combine to activate $bit_3$-WR, $bit_2$-WR, $bit_1$-WR, and $bit_0$-WR in turn at four consecutive BIT SEL CLK pulses.

Figure 25:
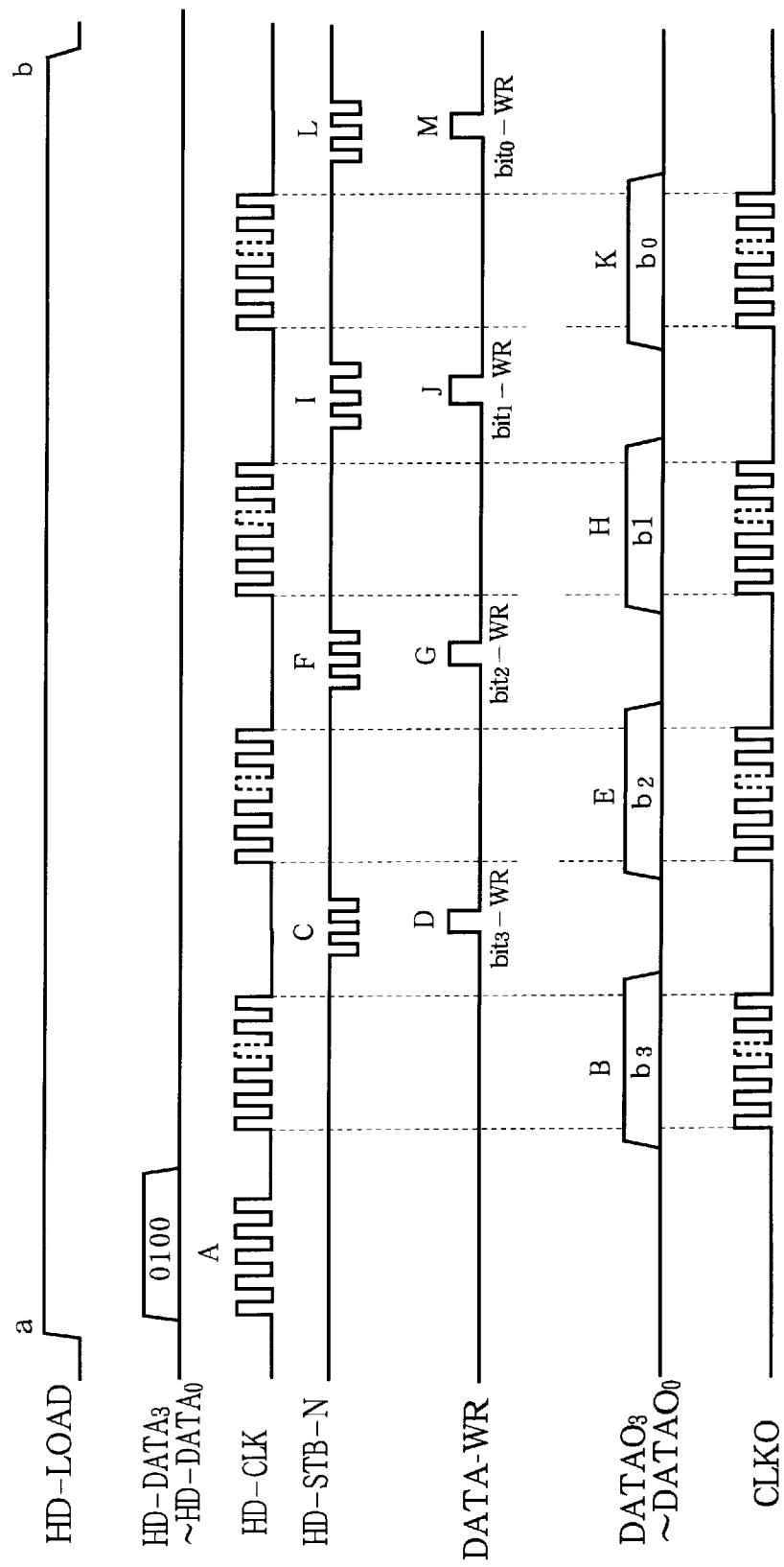
FIG. 25 is a timing diagram illustrating the writing of compensation data.

FIG. 25 illustrates the operation of transferring the compensation data into the compensation memory circuits of driver ICs 101 to 126. This operation is performed when the LED head is powered up, or at some other suitable time before printing begins, and is controlled by the printing control unit or a higher-order controller (not shown in the drawings). The compensation data are read from the EEPROM 100e in the control IC 100.

Signals HD-LOAD, $HD-DATA_3$ to $HD-DATA_0$, HD-CLK, and HD-STB-N in FIG. 25 are provided from the printing control unit to the LED head through a connector attached to the LED head. Signals $DATAO_3$ to $DATAO_0$ and CLKO are supplied from the control IC 100 to driver IC 101 in FIG. 1. The DATA-WR signal collectively indicates the four signals $bit_3$-WR to $bit_0$-WR shown in FIGS. 16, 18, and 24, which are generated in each of the driver ICs.

The operation begins when the HD-LOAD signal goes high as shown at the top left (a) in FIG. 25. Next, command data are transferred on the $HD-DATA_0$ signal line in synchronization with HD-CLK (A). The command data ('0100') specify the transfer (TRANS) command, as shown in FIG. 10, which instructs the control IC 100 to transfer compensation data from its internal EEPROM to the driver ICs.

When the command data have been transferred and the control IC 100 has been placed in the transfer mode, further HD-CLK cycles are generated to transfer the compensation data. First, the most significant bits ($b_3$), comprising one bit for each LED, are read from the EEPROM and transferred into the shift registers 230a of the driver ICs. After the number of HD-CLK cycles (B) necessary to transfer all of the most significant bits, HD-CLK is temporarily halted and three HD-STB-N pulses are produced (C).

From these HD-STB-N pulses, each driver IC generates the write command signal $b_3$-WR needed to write the transferred bits into the compensation memory circuits (D). The notation $bit_3$-WR in FIG. 25 indicates that at this point in the drawing, DATA-WR represents $bit_3$-WR. The $bit_3$-WR signals cause all of the data held in the shift registers 230a in the driver ICs to be written into memory cells c3 (FIG. 16) of the compensation memory circuits and stored by inverters 457 and 458 (FIG. 18).

Next, the printing control unit sends further HD-CLK cycles to transfer the next bits ($b_2$) of compensation data (E), followed by three more HD-STB-N pulses (F), which cause the driver ICs to generate $bit_2$-WR signals (G). These bits ($b_2$) are thereby written into memory cells c2 (FIG. 16) in the compensation memory circuits, and stored by inverters 455 and 456 in FIG. 18.

In the same way the third bits ($b_1$) are transferred to the driver ICs and written in their compensation memory circuits (H, I, J). Then the last bits ($b_0$) are similarly transferred and written (K, L, M). At this point four bits of compensation data ($b_3, b_2, b_1$, and $b_0$) have been stored sequentially in the memory cells c3, c2, c1, and c0 in each compensation memory circuit.

Finally, the HD-LOAD signal is driven low (b) to end the transfer of compensation data and prepare for the transfer of driving data. The operation illustrated in FIG. 25 thus comprises a command transfer phase (A), followed by four compensation data transfer cycles (B-C-D, E-F-G, H-I-J, and K-L-M), with each compensation memory circuit receiving one bit of compensation data per cycle.

Figure 26:
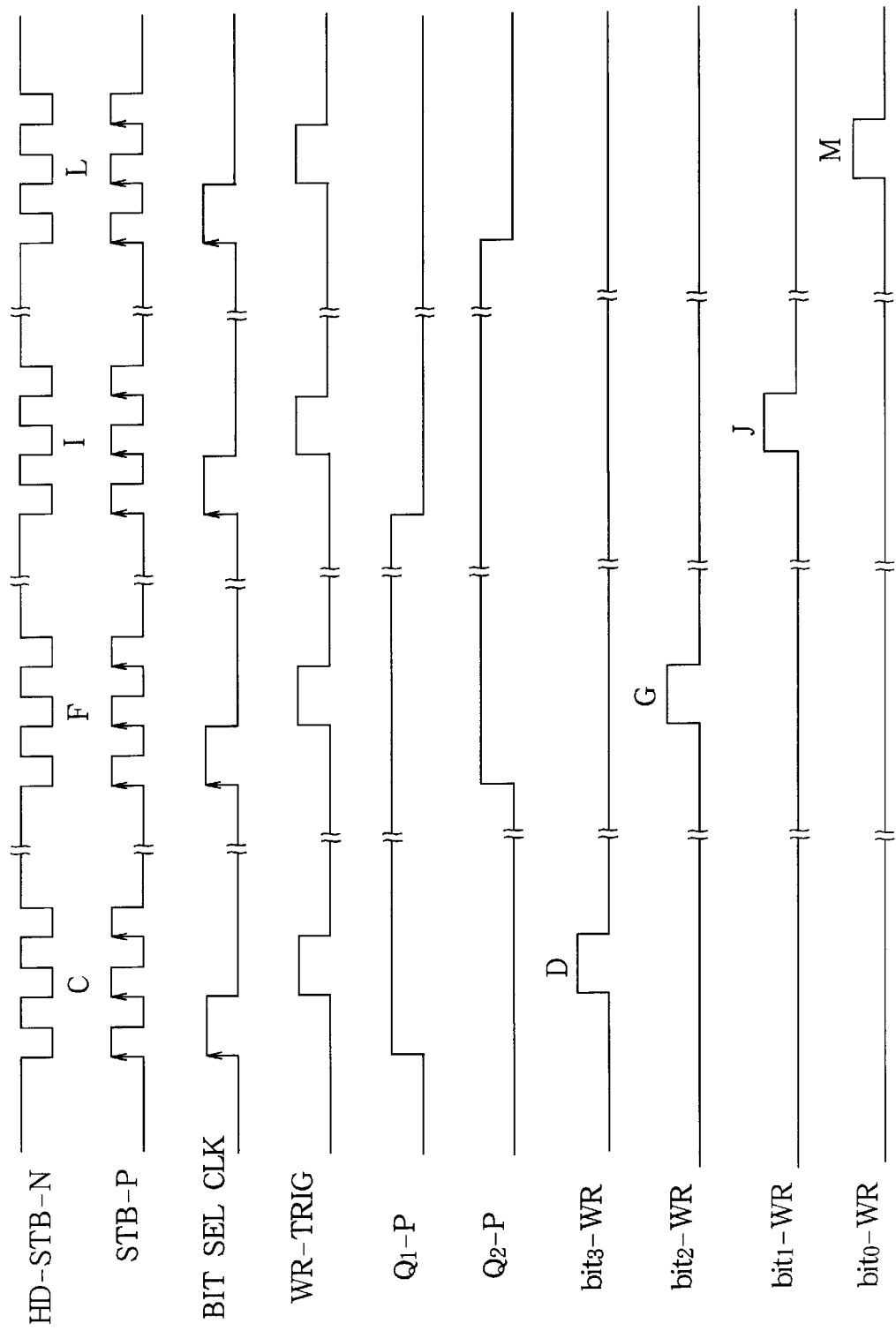
FIG. 26 is a more detailed timing diagram illustrating the operation of the timing generator circuit, bit position counter circuit, and word-line decoder circuit.

The timing diagram in FIG. 26 illustrates the operation of the timing generator (FIG. 22), compensation bit position counter (FIG. 23), and word-line decoder (FIG. 24) during the writing of data into the compensation memory circuits. The letters C, D, F, G, I, J, L, and M in FIG. 26 have the same meaning as in FIG. 25.

The HD-STB-N signal output from the printing control unit is buffered in the control IC 100 and received at the STB input terminals of all the driver ICs (FIG. 1). In each driver IC, inverter 246 (FIG. 14) inverts the STB input to produce STB-P, which clocks the ring counter comprising flip-flop circuits 531 and 532 in FIG. 22. LOAD-P is high, so these flip-flop circuits 531 and 532 are not reset.

The first rising edge of STB-P in FIG. 26 (C) causes BIT SEL CLK to go high. The second rising edge of STB-P causes BIT SEL CLK to go low and WR-TRIG to go high. The third rising edge of STB-P causes WR-TRIG to go low. The same sequence occurs at the other groups of strobe pulses (F, I, L).

Signals Q1-P and Q2-P are generated by the circuit in FIG. 23, in which flip-flop circuits 534 and 535 form a Johnson counter clocked by BIT SEL CLK. The four rising edges of BIT SEL CLK in FIG. 26 cause Q1-P and Q2-P to assume, in turn, the four pairs of values '10,' '11,' '01,' and '00.' The word-line decoder in FIG. 24 decodes these pairs of values and the WR-TRIG signal to generate signals $bit_3$-WR to $bit_0$-WR (shown at D, G, J, and M).

When the load signal is active (when LOAD-P is high and LOAD-N is low), AND gate 544 in FIG. 24 disables the LED-DRV-ON signal, so that the STB-P pulses in FIG. 26 do not cause LED-DRV-ON to go high.

Figure 53:
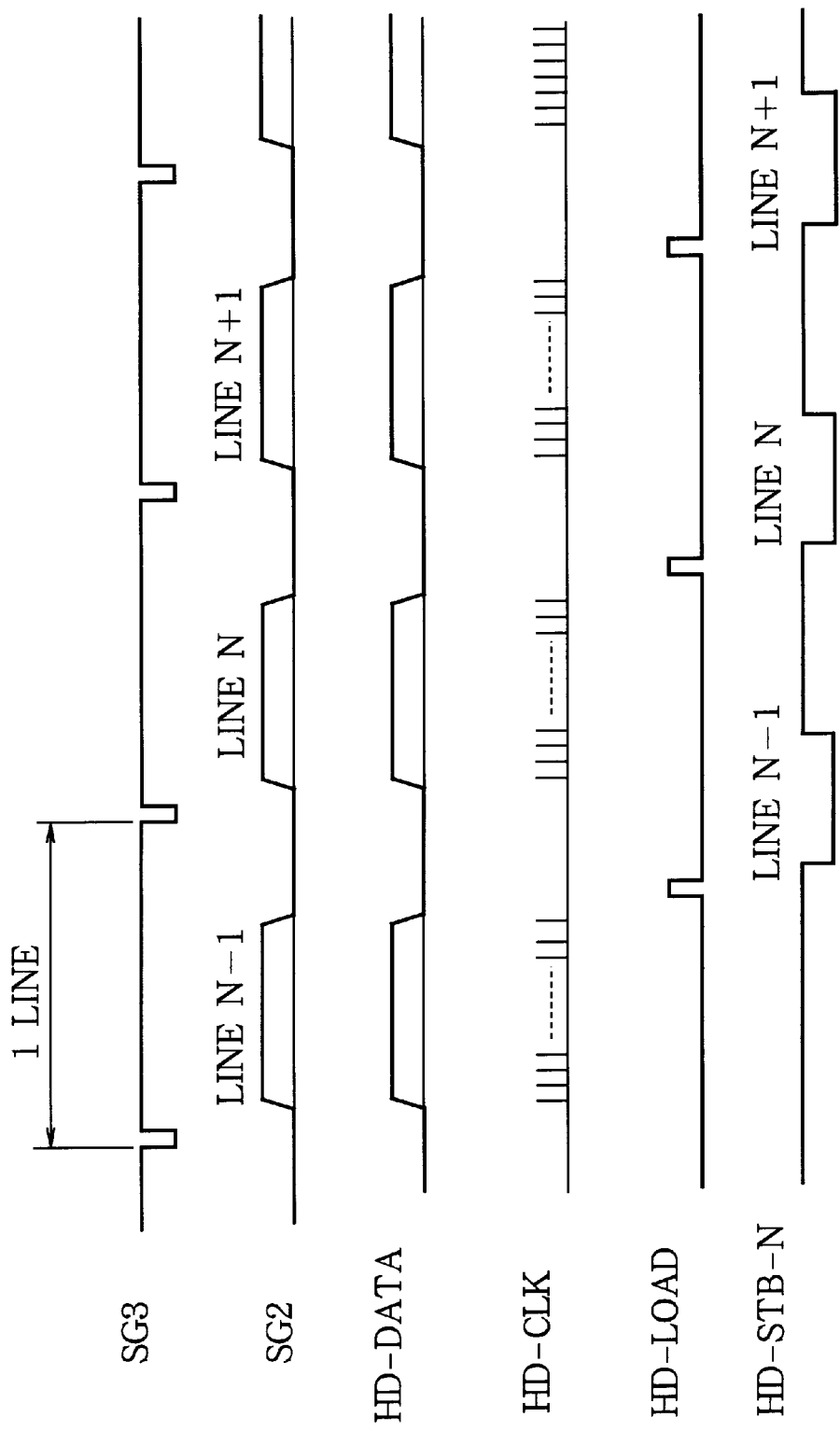
FIG. 53 is a timing diagram illustrating the operation of a conventional electrophotographic printer.
Figure 54:
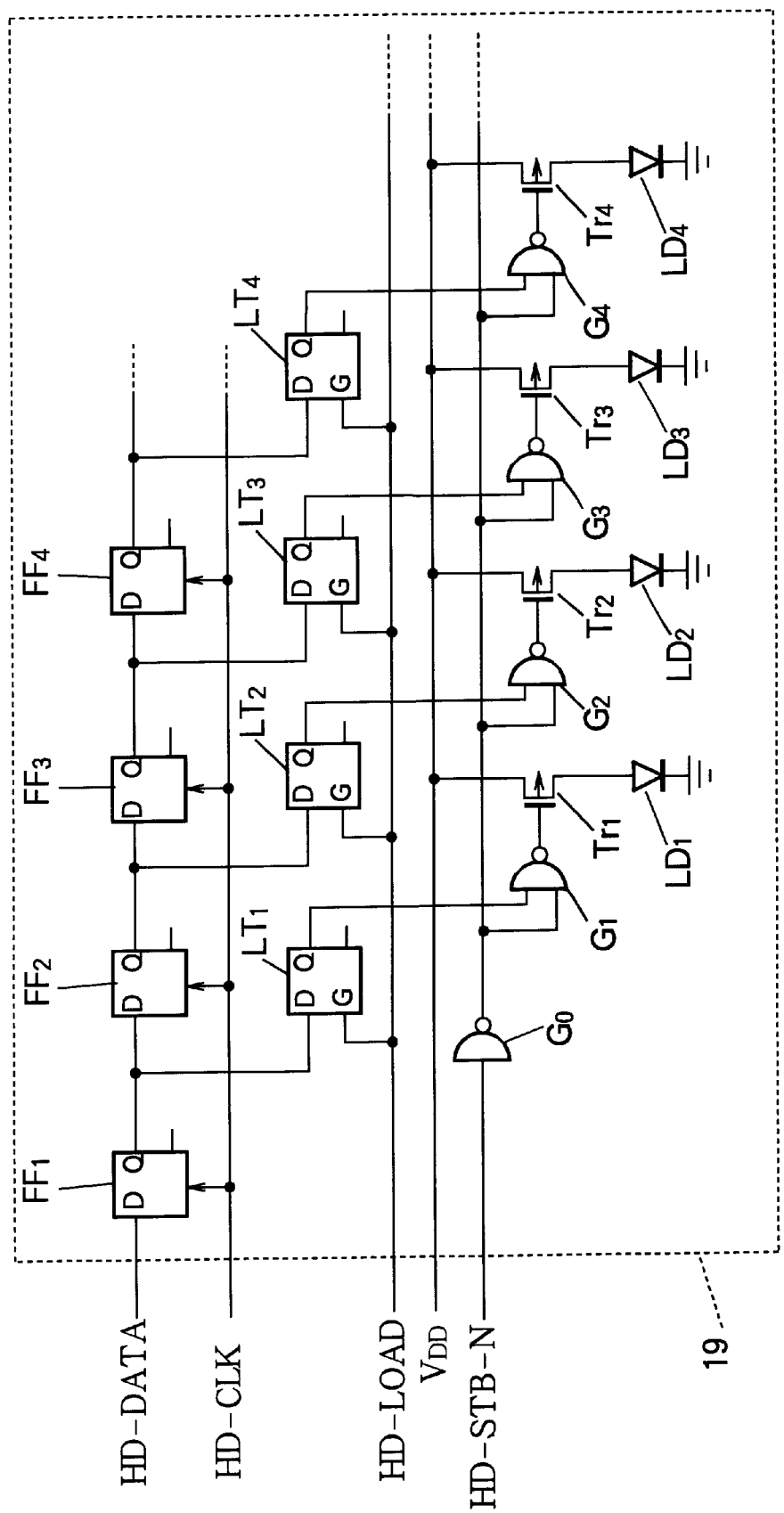
FIG. 54 illustrates the circuit configuration of a conventional LED head.
Figure 55:
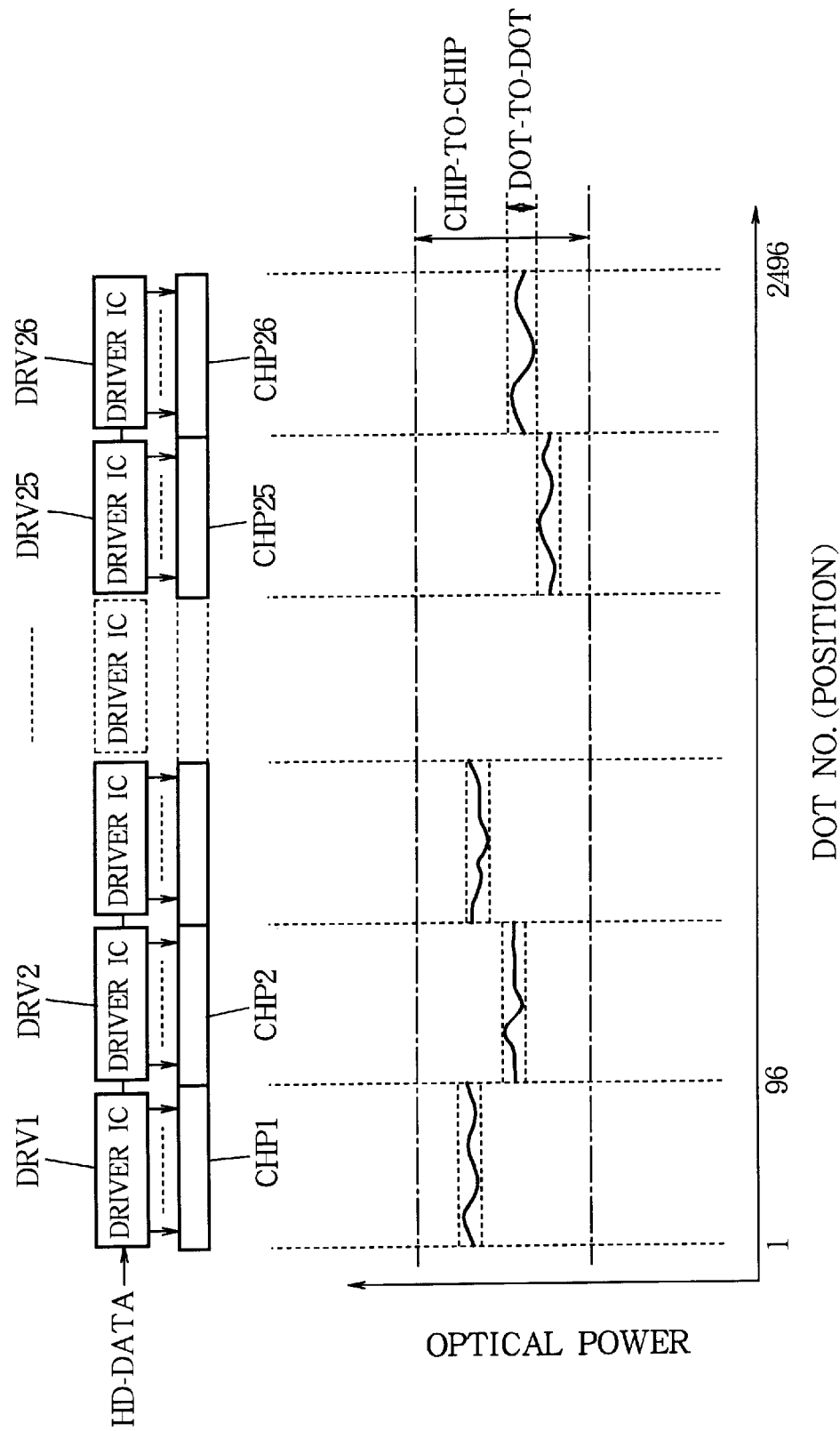
FIG. 55 is a graph illustrating dot-to-dot and chip-to-chip variations in an LED head.

During printing, LED-DRV-ON output is enabled. The load signal is inactive (LOAD-N is high and LOAD-P is low) when STB-P goes high, so STB-P propagates through AND gate 544 to become the LED-DRV-ON signal. Printing is carried out with the same signal timing sequence as in the prior art, illustrated in FIG. 53.

FIG. 27 shows the temperature-sensing circuit that generates the reference voltage $V_{ref}$ used in the current reference circuit 247, comprising npn bipolar transistors $Q_1$ and $Q_2$, p-channel MOS transistors $M_1$, $M_2$, and $M_3$, and resistors $R_0$, $R_1$, and $R_3$. Transistors $Q_1$ and $Q_2$ differ in size; transistor $Q_2$ may be several times larger than transistor $Q_1$. The size ratio $Q_1:Q_2$ will be denoted 1:K below. Transistors $M_1$, $M_2$, and $M_3$ have mutually equal dimensions, that is, mutually equal gate widths and mutually equal gate lengths. Resistors $R_0$ and $R_3$ are of identical type: for example, both are polysilicon resistors, or both are diffused resistors.

The source terminals of transistors $M_1$, $M_2$, and $M_3$ are coupled in common to the power supply $V_{DD}$. The gate terminals of transistors $M_1$, $M_2$, and $M_3$ are connected in common to the drain terminal of transistor $M_2$. In this configuration, transistors $M_1$, $M_2$, and $M_3$ operate as a current mirror circuit 580, supplying substantially equal drain currents $I_1$, $I_2$, and $I_3$ determined by their common gate-source voltage.

Resistors $R_1$ and $R_0$ and npn bipolar transistor $Q_1$ are coupled in series between the drain terminal of MOS transistor $M_1$ and ground. That is, a first terminal of resistor $R_1$ is coupled to the drain terminal of transistor $M_1$, a second terminal of resistor $R_1$ is coupled to a first terminal of resistor $R_0$, a second terminal of resistor $R_0$ is coupled to the collector terminal (C) of transistor $Q_1$, and the emitter terminal (E) of transistor $Q_1$ is coupled to ground. The base terminal (B) of transistor $Q_1$ is coupled to a point between resistors $R_1$ and $R_0$.

The collector terminal of transistor $Q_2$ is coupled to the drain terminal of MOS transistor $M_2$, making the drain current $I_2$ of transistor $M_2$ equal to the collector current of transistor $Q_2$. The emitter terminal of transistor $Q_2$ is coupled to ground. The base terminal of transistor $Q_2$ is coupled to a point between resistor $R_0$ and the collector terminal of transistor $Q_1$.

The drain current $I_1$ of MOS transistor $M_1$ flows through resistors $R_1$ and $R_0$ to the collector of transistor $Q_1$, then from the emitter of transistor $Q_1$ to ground. Part of this current $I_1$, also flows into the base terminals of bipolar transistors $Q_1$ and $Q_2$, but the current gains of transistors $Q_1$ and $Q_2$ are sufficiently large that their base currents are negligible in comparison with their collector currents. $I_1$ is therefore substantially equal to the collector current of transistor $Q_1$.

The drain terminal of MOS transistor $M_3$ is coupled through resistor $R_3$ to ground, and is also coupled to the inverting input terminal of the operational amplifier 501 in the current reference circuit 247, shown in FIG. 19. Resistor $R_3$ operates as a converting element, converting the drain current $I_3$ output by MOS transistor $M_3$ in the current mirror circuit 580 to the reference voltage $V_{ref}$ used by the current reference circuit 247.

Since the base current of transistor $Q_1$ is negligible, its emitter current is substantially equal to the collector current $I_1$. The emitter current ($I_1$) is described by the following equation, in which $V_{BE1}$ is the base-emitter voltage of transistor $Q_1$, $I_S$ is the saturation current of transistor $Q_1$, k is the Boltzmann constant, q is the charge of the electron, T is the absolute temperature of transistor $Q_1$, and exp is the exponential function.

$$I_1 = I_S \exp(qV_{BE1}/kT)$$

Rearranging and taking natural logarithms (ln) gives the following expression for $V_{BE1}$.

$$V_{BE1} = (kT/q)\ln(I_1/I_S)$$

A similar relationship holds for the base-emitter voltage $V_{BE2}$ of transistor $Q_2$. The saturation current of transistor $Q_2$ is $KI_S$, so the relationship is as follows.

$$V_{BE2} = (kT/q)\ln(I_2/KI_S)$$

The difference $\Delta V_{BE}$ between the base-emitter voltages of transistors $Q_1$ and $Q_2$ is accordingly the following.

$$\Delta V_{BE} = V_{BE1} - V_{BE2}$$
$$= (kT/q)[\ln(I_1/I_S) - \ln(I_2/KI_S)]$$
$$= (kT/q)\ln(KI_1/I_2)$$

Since I and $I_2$ are substantially equal, this relationship can be approximated as follows.

$$\Delta V_{BE} = (kT/q)\ln(K)$$

Since $\Delta V_{BE}$ is also the voltage across resistor $R_0$, current $I_1$ can be expressed as follows.

$$I_1 = \Delta V_{BE}/R_0$$

$$= (kT/q)(1/R_0)\ln(K) = I_3$$

Bipolar transistor $Q_2$ produces a transistor output signal, namely a collector voltage signal, that controls the currents supplied by the current mirror circuit 580, because it is also the gate voltage of MOS transistors $M_1$, $M_2$, and $M_3$. One of these currents ($I_1$) determines the base-emitter voltages of bipolar transistors $Q_1$ and $Q_2$. The equations above show that the currents supplied by the current mirror circuit 580 are proportional to the absolute temperature T of transistors $Q_1$ and $Q_2$.

The reference voltage $V_{ref}$ can be expressed as follows.

$$V_{ref} = I_3 R_3$$
$$= (R_3/R_0)(kT/q)\ln(K)$$

Since resistors $R_0$ and $R_3$ are of the same type, they have identical temperature coefficients. The reference voltage $V_{ref}$ is therefore also proportional to the absolute temperature T.

The temperature coefficient of $V_{ref}$ is defined to be the following quantity.

$$(1/V_{ref})(V_{ref}/T)$$

With this definition, the temperature coefficient is inversely proportional to T.

$$(1/V_{ref})(V_{ref}/T)=1/T$$

At room-temperature conditions in the vicinity of three hundred kelvins (300 K), the temperature coefficient is approximately 0.33%/° C.

The above argument does not require $I_1$, $I_2$ and $I_3$ to be equal; essentially the same conclusion is reached if they are related by fixed proportionality factors.

As explained above, the operational amplifier 501 operates to make the LED driving current proportional to the reference voltage $V_{ref}$. The temperature-sensing circuit in FIG. 27 accordingly makes the LED driving current proportional to the absolute temperature T of bipolar transistors $Q_1$ and $Q_2$. Due to the thermal coupling between the LED array chip and its driver IC, the temperature T of bipolar transistors $Q_1$ and $Q_2$ varies together with the temperature of the LED array chip. Thus as the temperature of an LED array chip rises, the driving current supplied to the LEDs in that LED array chip increases to compensate for the reduced optical output efficiency of the LEDs.

To obtain a reference voltage $V_{ref}$ of 1.5 V at a typical room temperature of 25° C., the transistor size ratio can be set equal to ten (K=10), the resistance $R_0$ to 10 kΩ, and the resistance $R_3$ to 254 kΩ. The reference voltage at 85° C. will then be 1.8 V.

As is clear from the preceding description, during the operation of the printer, the temperature-sensing circuit in each driver IC senses the temperature of the driver IC, which corresponds to the temperature of the driven LED array chip, and generates a corresponding reference voltage $V_{ref}$. The current reference circuit 247 shown in FIG. 19 operates as a temperature compensation circuit, using the reference voltage $V_{ref}$ to compensate for temperature-induced variations in the optical output of the LEDs. Printing irregularities due to temperature differences between the LED array chips can thus be reduced.

The advantages of the first embodiment can be summarized as follows.

When compensation data are transferred from the control IC 100 to the driver ICs according to the first embodiment, the compensation data are transferred by the same shift registers that are also used for transferring driving data during printing, and the compensation data held in the shift registers are stored simultaneously in the compensation memory circuits in the driver ICs. Compared with the use of a separate shift register comprising flip-flop circuits to transfer and store the compensation data, the present embodiment requires fewer transistors, fewer external terminals, and fewer wire-bonding interconnections, thereby reducing the size and cost of the driver ICs. Assembly and testing costs are also reduced. In particular, the testing of logic functions in the LED head and inspection of wire-bonding interconnections are simplified.

The LOAD-P signal distinguishes between the transfer of compensation data and the transfer of driving data. When LOAD-P is high, the STB-P signal does not strobe the LEDs, so STB-P can be used to generate write control signals for the memory cells. Moreover, the driver ICs internally generate the write command signals that determine which memory cells receive which bits of compensation data. Thus the first embodiment can be practiced without the need for additional signal terminals in the LED head.

When the LED head is manufactured, the LEDs are driven one by one at room temperature, their optical outputs are measured, and compensation data are stored in the EEPROM 100e in the control IC 100 so that under uniform temperature conditions, all LEDs will emit substantially equal optical power. Under actual printing conditions, if some LED array chips are driven more heavily than others and generate more heat, part of this heat is conducted to the adjacent driver ICs. The temperature of each driver IC corresponds closely to the temperature of the driven LED array chip. As the LED array chips and driver ICs are made of materials with high thermal conductivity, temperature differences within each chip or IC are slight. By sensing the temperature at a single point within a driver IC and adjusting the driving current supplied to the driven LED array chip according to the temperature at this point, the temperature-sensing circuit in FIG. 27 and temperature compensation circuit in FIG. 19 can markedly reduce the optical output irregularities due to temperature differences between the LED array chips.

Next, a second embodiment of the invention will be described.

The current mirror circuit 580 in the first embodiment does not have an extremely high output impedance, because the drain currents of the three MOS transistors $M_1$, $M_2$, and $M_3$ are directly affected by differences in their drain potentials. Different drain potentials can thus create differences between the currents supplied to the bipolar transistors that sense the temperature T. In the second embodiment, these current differences are reduced by use of a cascoded current mirror circuit configuration, which has a higher output impedance.

Figure 28:
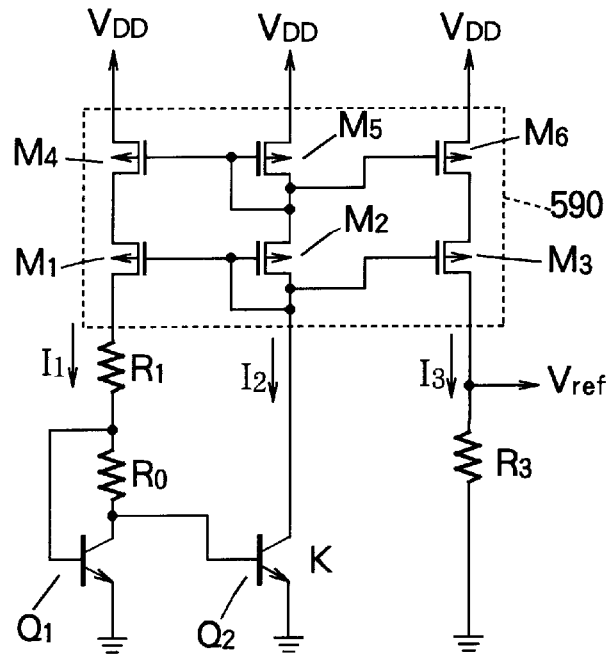
FIG. 28 is a circuit diagram of a temperature-sensing circuit according to a second embodiment of the invention.

The second embodiment replaces the temperature-sensing circuit of FIG. 27 with the temperature-sensing circuit shown in FIG. 28, comprising npn bipolar transistors $Q_1$ and $Q_2$, resistors $R_0$, $R_1$, and $R_3$, and p-channel MOS transistors $M_1$ to $M_6$.

The source terminals of MOS transistors $M_4$, $M_5$, and $M_6$ are coupled to the power supply $V_{DD}$. The gate terminals of MOS transistors $M_4$, $M_5$, and $M_6$ are connected in common to the drain terminal of MOS transistor $M_5$. The drain terminals of MOS transistors $M_4$, $M_5$, and $M_6$ are coupled to the source terminals of MOS transistors $M_1$, $M_2$, and $M_3$, respectively. The gate terminals of MOS transistors $M_1$, $M_2$, and $M_3$ are connected in common to the drain terminal of MOS transistor $M_2$. MOS transistors $M_1$ to $M_6$ form a cascode current mirror circuit 590.

As in the first embodiment, the drain terminals of MOS transistors $M_1$, $M_2$, and $M_3$ are coupled, respectively, to resistor $R_1$, the collector of npn bipolar transistor $Q_2$, and resistor $R_3$. Resistor $R_0$ and npn bipolar transistors $Q_1$, and $Q_2$ are interconnected to sense temperature as in the first embodiment.

If $I_1$, $I_2$, and $I_3$ are the drain currents of MOS transistors $M_1$, $M_2$, and $M_3$, then as in the first embodiment, the difference $\Delta V_{BE}$ between the base-emitter voltages of transistors $Q_1$, and $Q_2$ can be expressed as follows.

$$\Delta V_{BE} = (kT/q)\ln(KI_1/I_2)$$

MOS transistors $M_2$ $_{and}$ $_{M5}$, which are coupled in series, form a cascoded current source with a higher internal impedance the internal impedance of $M_2$ alone. The combined internal impedance of $M_1$ and $M_4$ (and of $M_3$ and $M_6$) is likewise greater than the internal impedance of $M_1$ (and $M_3$) alone. Drain currents $I_1$ and $I_2$ (and $I_3$) therefore remain more nearly equal despite differences in the drain potentials of MOS transistors $M_1$ and $M_2$ (and $M_3$).

Aside from this difference, the second embodiment is identical to the first embodiment and operates in the same way, sensing temperature as the difference in the base-emitter voltages of a pair of bipolar transistors. The high internal impedance of the cascoded current mirror circuit 590 reduces differences in the currents supplied from the current mirror, thereby leading to more accurate temperature sensing.

Next, a third embodiment of the invention will be described.

Normally, when the printer's power supply is switched on, the supply voltage rises quickly. This abrupt voltage surge creates a transient condition that injects sufficient charge into the base terminals of the bipolar transistors $Q_1$ and $Q_2$ in FIGS. 27 and 28 to enable these transistors to turn on, after which a type of positive feedback brings the temperature-sensing circuit to its correct operating point. If the power-supply voltage rises very slowly when the printer is switched on, however, it is possible for the temperature-sensing circuits in FIGS. 27 and 28 to remain in a stable state in which bipolar transistors $Q_1$ and $Q_2$ and MOS transistors $M_1$ and $M_2$ are switched off, and the correct reference voltage $V_{ref}$ is not obtained. The third embodiment adds a starting circuit to the configuration shown in FIG. 27 to assure that bipolar transistors $Q_1$ and $Q_2$ turn on before printing operations begin.

Figure 29:
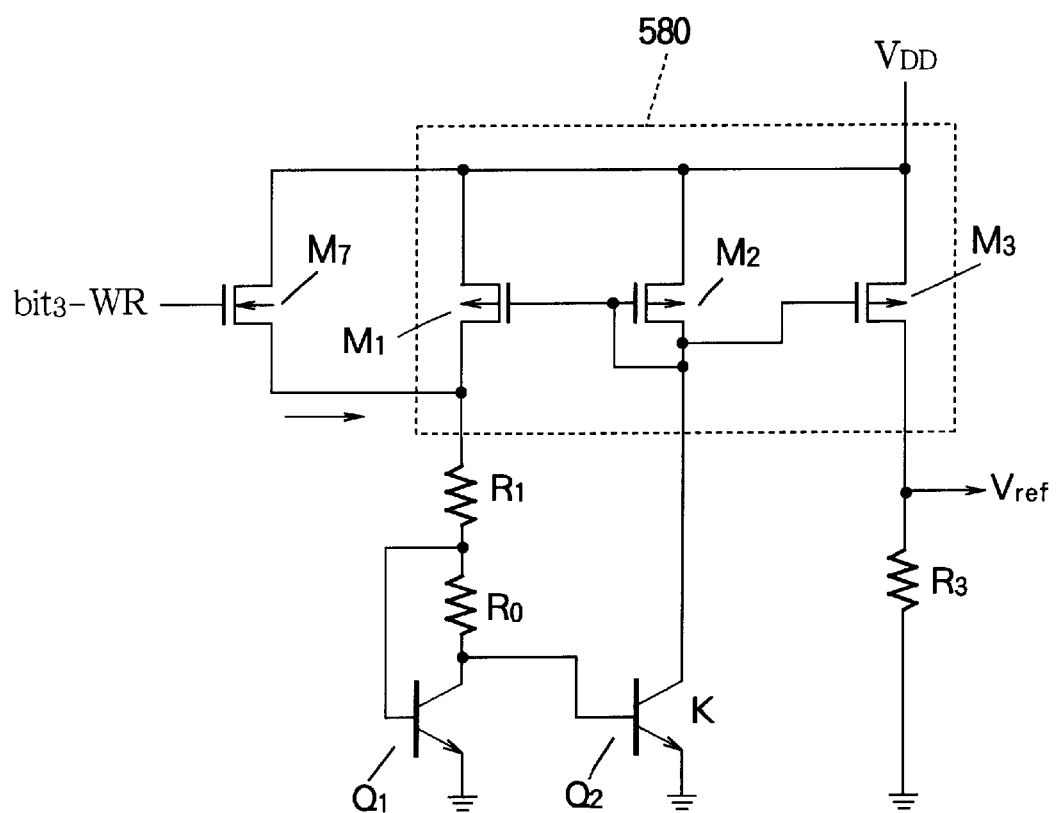
FIG. 29 is a circuit diagram of a temperature-sensing circuit according to a third embodiment of the invention.

Referring to FIG. 29, the temperature-sensing circuit in the third embodiment has the same npn bipolar transistors $Q_1$ and $Q_2$, resistors $R_0$, $R_1$, and $R_3$, and current mirror circuit 580 as in the first embodiment. The starting circuit comprises an additional n-channel MOS transistor $M_7$ coupled in parallel with the current mirror circuit 580, more precisely in parallel with MOS transistor $M_1$, between the power supply $V_{DD}$ and resistor $R_1$. The gate terminal of MOS transistor $M_7$ receives the $b_3$-WR write command signal.

Transistor $M_7$ can also be a p-channel MOS transistor of suitable dimensions, if write command signal $b_3$-WR is coupled through an inverter.

Instead of write command signal $b_3$-WR, write command signal $b_0$-WR, or any other signal that is normally inactive but is temporarily activated at some time before printing begins, could be coupled to the gate of transistor $M_7$.

Figure 30:
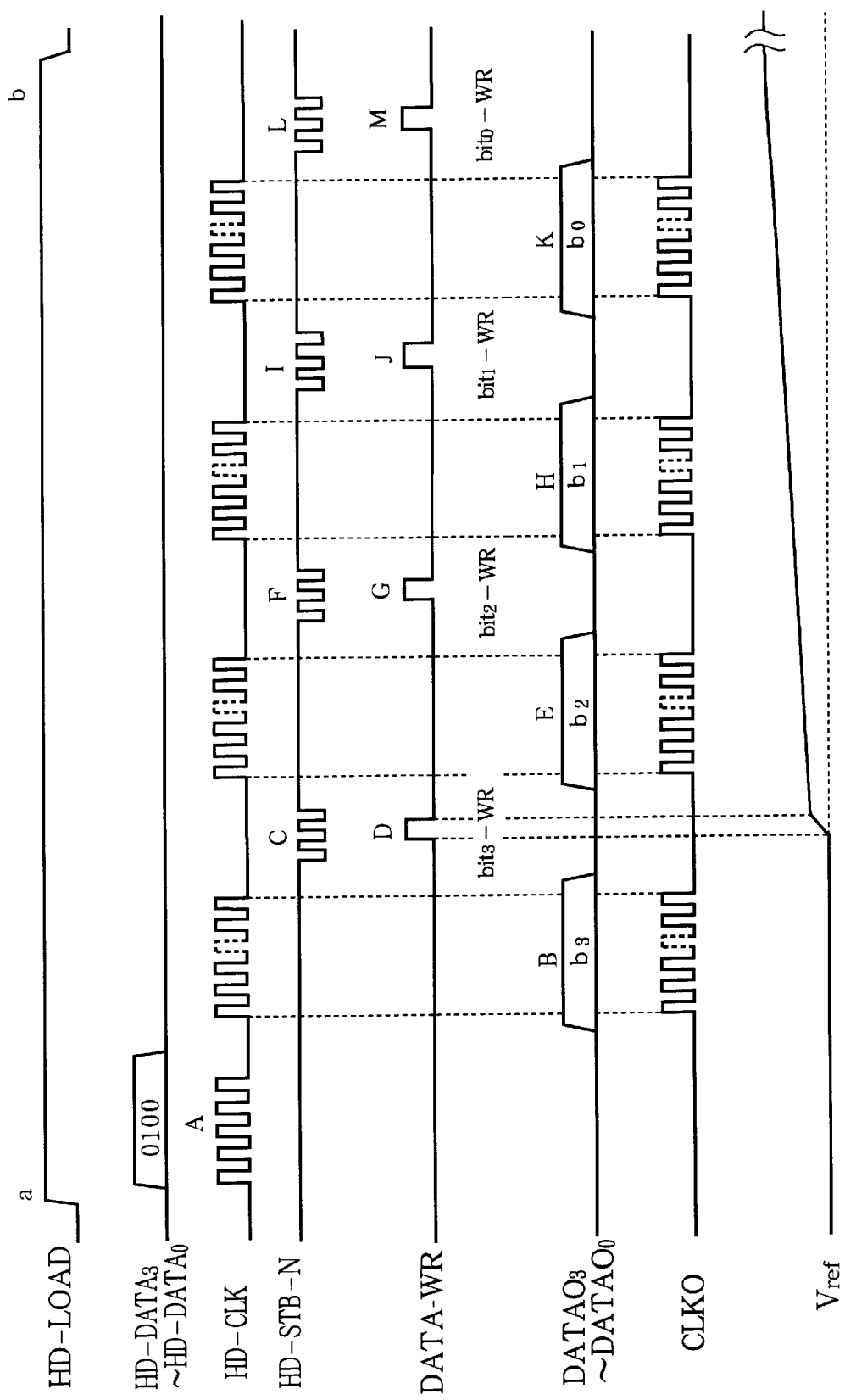
FIG. 30 is a timing diagram illustrating the operation of the third embodiment.

Referring to FIG. 30, suppose that when the HD-LOAD signal goes high (at time a), the reference voltage $V_{ref}$ is still zero, due to an extremely slow rise of $V_{DD}$ at power-up, for example. In this state, MOS transistors $M_1$, $M_2$, and $M_3$ are turned off, bipolar transistors $Q_1$ and $Q_2$ are also turned off, and the temperature-sensing circuit does not respond to temperature changes.

While HD-LOAD is high (from time a to time b), compensation data are loaded into the driver ICs. As part of this process, write command signal $b_3$-WR goes high (operation D), causing MOS transistor $M_7$ to conduct. Charge is thereby injected through transistor $M_7$ into the gate terminals of bipolar transistors $Q_1$ and $Q_2$, as indicated by the arrow in FIG. 29, bringing the circuit comprising transistors $Q_1$ and $Q_2$ into a conducting state. The collector potential of transistor $Q_2$ accordingly begins to drop. The gate potential of MOS transistors $M_1$ and $M_2$ therefore drops, increasing the current flow to the bipolar transistors from the current mirror circuit 580, and moving the temperature-sensing circuit toward its correct operating point. The reference voltage $V_{ref}$ begins rise, as shown at the bottom of FIG. 30, and reaches a stable value before printing actually begins.

The third embodiment assures that the advantages of the first embodiment are obtained regardless of the manner in which the printer is powered up, by using a command signal generated during the storing of compensation data to activate the temperature-sensing circuit before printing actually begins.

Next, a fourth embodiment of the invention will be described.

Figure 31:
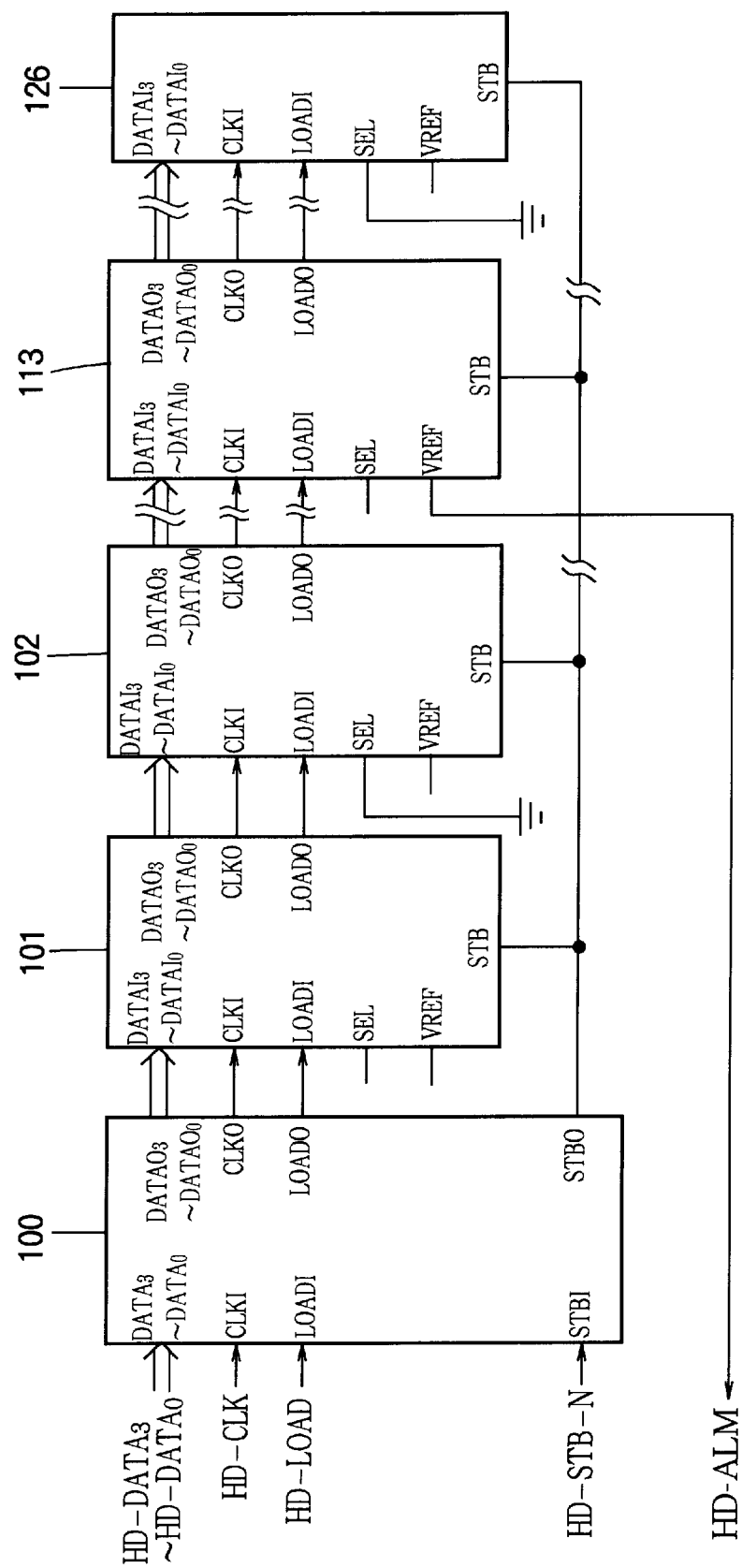
FIG. 31 is a block diagram illustrating the control IC and driver ICs in a fourth embodiment of the invention.

Referring to FIG. 31, the driver ICs 101 to 126 in the fourth embodiment have VREF output terminals for output of the reference voltage $V_{ref}$ generated in their internal temperature-sensing circuits. The VREF output terminal of one of the driver ICs, preferably a driver IC in the middle of the array, such as driver IC 113 in the drawing, is coupled to the connector (not visible) by which the LED head is interfaced to the printing control unit. The conventional interface shown in FIG. 52 is thus modified by the addition of a $V_{ref}$ signal line between the printing control unit 1 and LED head 19. The printing control unit 1 receives the reference voltage generated by driver IC 113 as a head alarm signal HD-ALM.

The printing control unit monitors the HD-ALM signal, and halts printing if the HD-ALM voltage rises above a first threshold, e.g. by halting the supply of driving data at the end of the current page. Printing is resumed when the HD-ALM voltage returns to a second threshold, preferably lower than the first threshold.

Figure 32:
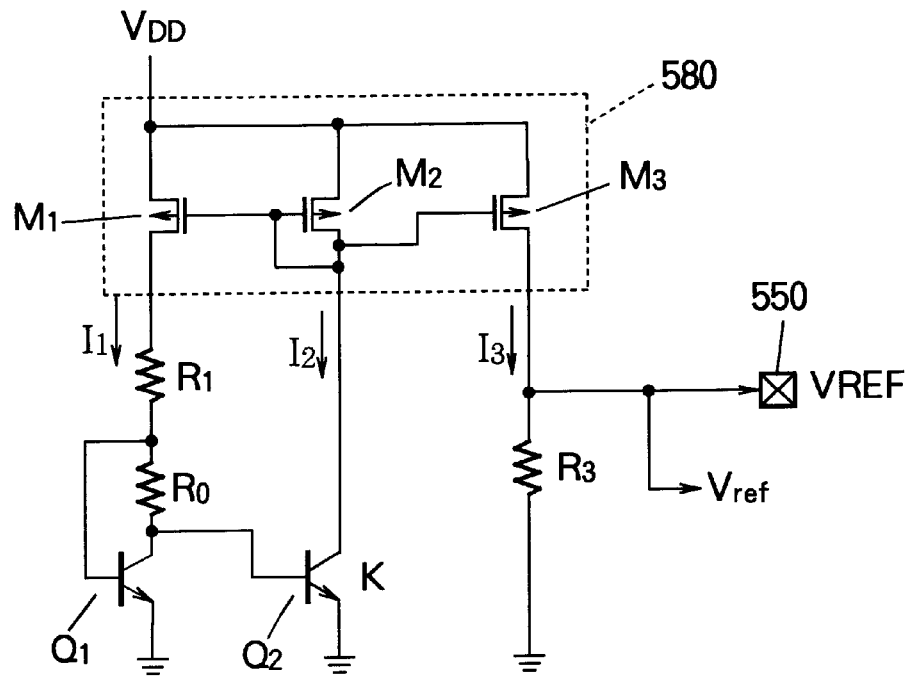
FIG. 32 is a circuit diagram of the temperature-sensing circuit in the fourth embodiment.

FIG. 32 shows the temperature-sensing circuit in the fourth embodiment, which is identical to the temperature-sensing circuit in the first embodiment with the addition of a pad 550 to which the reference voltage $V_{ref}$ is supplied. This pad 550 is coupled to the VREF output terminal of the driver IC.

As explained in the first embodiment, if the temperature of the LED array chips in the LED head rises due to heat generated during the printing process, the driving current supplied to the LED array chips is increased to compensate for the reduced optical output efficiency of the LEDs. As a result, even more heat may be generated, causing the temperature to rise still further.

As also explained in the first embodiment, the reference voltage $V_{ref}$ is proportional to the absolute temperature T sensed by the temperature-sensing circuit.

$$V_{ref}=(R_3/R_0)(kT/q)\ln(K)$$

The head alarm signal HD-ALM is equal to $V_{ref}$ so by monitoring HD-ALM, the printing control unit 1 monitors the temperature of the LED head. If the LED head becomes overheated, due to continuous printing of all-black pages, for example, the printing control unit can detect this condition and halt printing until the temperature of the LED head drops back to a safe level, thereby preventing damage that might be caused by overheating.

Conventional LED printers use a thermal fuse to prevent damage from overheating. The fourth embodiment enables this fuse to be eliminated.

The fourth embodiment can be modified by supplying the printing control unit with $V_{ref}$ signals taken from two or more of the driver ICs, or with an average value or maximum value of these $V_{ref}$ signals.

Next, a fifth embodiment of the invention will be described.

Figure 33:
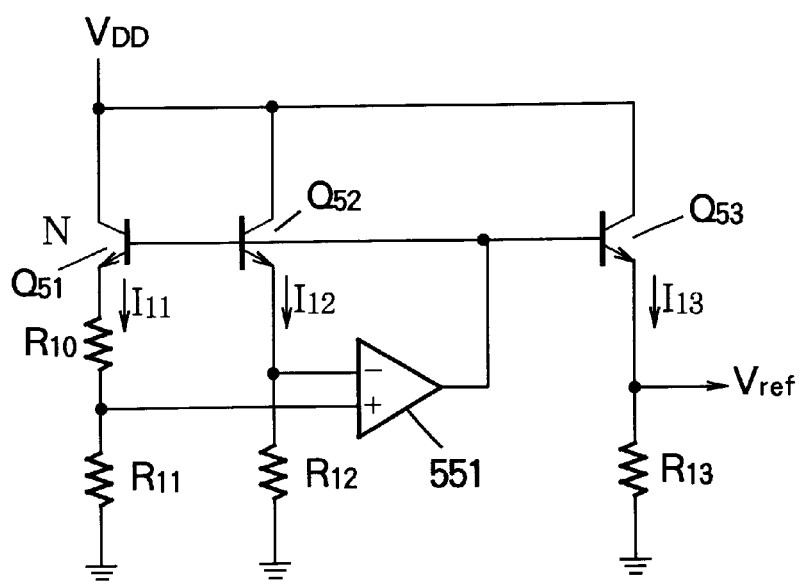
FIG. 33 is a circuit diagram of a temperature-sensing circuit according to a fifth embodiment of the invention.

Referring to FIG. 33, the temperature-sensing circuit in the fifth embodiment comprises npn bipolar transistors $Q_{51}$, $Q_{52}$, and $Q_{53}$ with collectors connected to the power supply $V_{DD}$. The emitter terminal of transistor $Q_{51}$ is coupled to ground through a series circuit comprising resistors $R_{10}$ and $R_{11}$. The emitter terminals of transistors $Q_{52}$ and $Q_{53}$ are coupled to ground through respective resistors $R_{12}$ and $R_{13}$. The base terminals of transistors $Q_{51}$, $Q_{52}$, and $Q_{53}$ are coupled in common to the output terminal of an operational amplifier 551. The non-inverting (+) input terminal of operational amplifier 551 is coupled to a point between resistors $R_{10}$ and $R_{11}$. The inverting (−) input terminal of operational amplifier 551 is coupled to a point between the emitter of transistor $Q_{52}$ and resistor $R_{12}$. Transistors $Q_{51}$ and $Q_{52}$ have a size ratio of N:1 (N>1). To simplify the calculations, in the description below it will be assumed that the size ratio of $Q_{52}$ and $Q_{53}$ is 1:1, and resistors $R_{12}$ and $R_{13}$ have equal resistances.

Resistors $R_{10}$, $R_{11}$, $R_{12}$, and $R_{13}$ are of the same type, and have equal temperature coefficients.

The reference voltage $V_{ref}$ generated by this temperature-sensing circuit will be calculated below, using $I_{11}$, $I_{12}$, and $I_{13}$ to denote the emitter currents of transistors $Q_{51}$, $Q_{52}$, and $Q_{53}$, and $V_R$ to denote the voltage developed across $R_{11}$. The operational amplifier 551 operates so as to maintain the following relationship.

$$V_R=I_{11}R_{11}=I_{12}R_{12}$$

From this relationship, $$I_{12}/I_{11}=R_{11}/R_{12}$$

If the base-emitter voltages of transistors $Q_{51}$ and $Q_{52}$ are denoted $V_{BE1}$ and $V_{BE2}$, then the difference $\Delta V_{BE}$ between them is related to $R_{10}$ as follows.

$$I_{11}=\Delta V_{BE}/R_{10}$$

In addition, $$\begin{aligned}\Delta V_{BE} &= V_{BE2} - V_{BE1} \\ &= (kT/q)\ln(I_{12}/I_S) - (kT/q)\ln(I_{11}/NI_S) \\ &= (kT/q)\ln[N(I_{12}/I_{11})] \\ &= (kT/q)\ln[N(R_{11}/R_{12})]\end{aligned}$$

where k is the Boltzmann constant, T is the absolute temperature of transistors $Q_{51}$ and $Q_{52}$, q is the charge of the electron, $I_S$ is the saturation current of transistor $Q_{52}$, and in is the natural logarithm function. Furthermore, $$I_{13} = I_{12}$$
$$= (R_{11}/R_{12})I_{11}$$
$$= (R_{11}/R_{12})(\Delta V_{BE}/R_{10})$$

Since $R_{12}=R_{13}$, these relationships give $V_{ref}$ as follows.

$$V_{ref} = I_{13}R_{13}$$
$$= (R_{11}/R_{12})(R_{13}/R_{10})(kT/q)\ln[N(R_{11}/R_{12})]$$
$$= (R_{11}/R_{10})(kT/q)\ln[N(R_{11}/R_{12})]$$

Since resistors $R_{10}$, $R_{11}$, $R_{12}$, and $R_{13}$ have equal temperature coefficients, the ratio between the resistance values of two of them does not change with temperature. The reference voltage $V_{ref}$ is therefore proportional to the absolute temperature T.

This conclusion also holds if $R_{11}$ and $R_{12}$ have mutually equal temperature coefficients, and $R_{10}$ and $R_{13}$ have mutually equal temperature coefficients.

The fifth embodiment uses the temperature-sensing circuit in FIG. 33 to compensate for temperature differences between the LED array chips in the same way as the first embodiment.

Next, a sixth embodiment of the invention will be described. The sixth embodiment provides more complete compensation for the temperature dependence of the optical output power of the LEDs.

The description of the sixth embodiment will begin with an analysis of certain temperature coefficients in the first embodiment, then derive the temperature coefficient of the driving current needed to hold the optical output power of the LEDs fixed, and finally present a circuit that achieves the necessary temperature coefficient.

The reference voltage $V_{ref}$ in each of the preceding embodiments was related to the absolute temperature T by an equation of the following form, in which C is a constant.

$$V_{ref} = C(kT/q)$$

Under room temperature conditions, in the vicinity of 300 K, the temperature coefficient $(1/V_{ref})(V_{ref}/T)$ is substantially 0.33%/° C.

Figure 34:
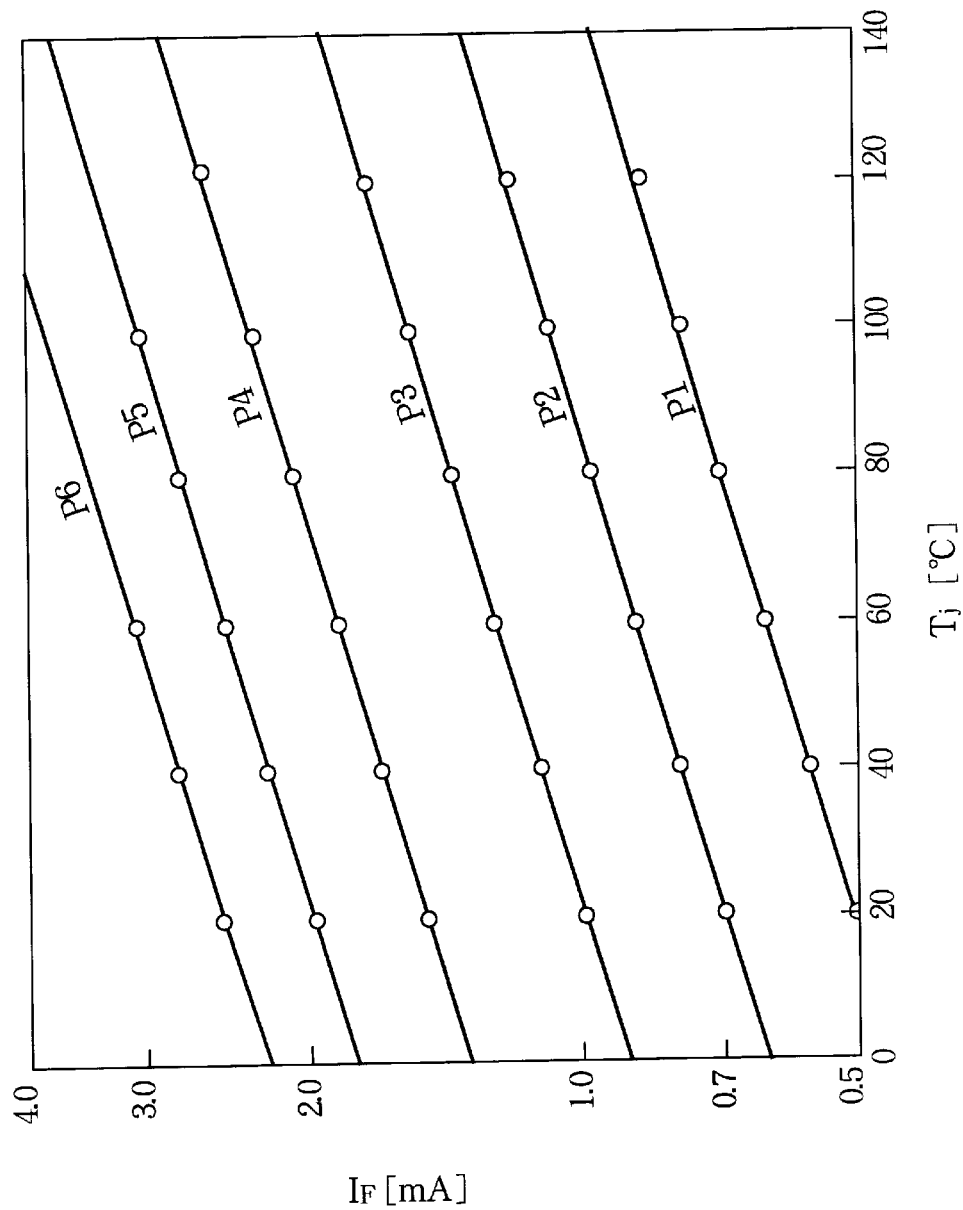
FIG. 34 is a graph illustrating the temperature characteristics of an LED.

FIG. 34 illustrates the temperature characteristics of LEDs, showing junction temperature $T_j$. in degrees Celsius (° C.) on the horizontal axis, and LED driving current $I_F$ in milliamperes (mA) on a logarithmic scale on the vertical axis. The curves marked P1 to P6 represent constant levels of optical output power, which is measured in microwatts ($\mu$W). These curves P1 to P6 indicate that to hold the optical output of the LEDs at a constant value, the temperature coefficient of the driving current should be substantially 0.6%/° C., which is approximately twice the temperature coefficient of $V_{ref}$.

Figure 35:
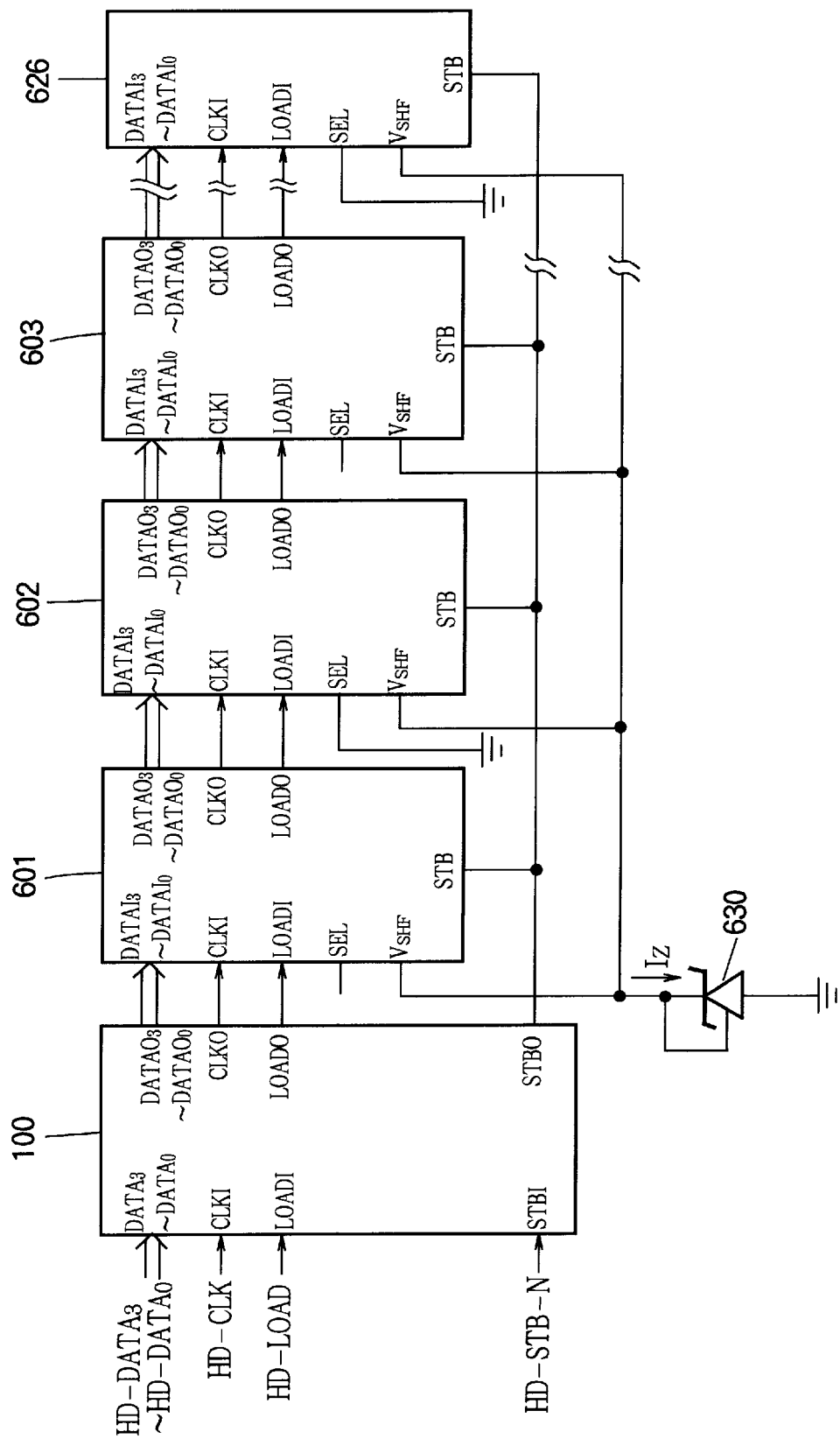
FIG. 35 is a block diagram illustrating the control IC, driver ICs, and bandgap reference in a sixth embodiment of the invention.

FIG. 35 is a block diagram of an LED head having a control IC 100, driver ICs 601 to 626, and a bandgap reference IC 630 such as the TL431 bandgap reference manufactured by Texas Instruments. The anode terminal of the bandgap reference IC 630 is connected to ground. The cathode terminal is coupled to shift voltage input terminals $V_{SHF}$ of the driver ICs 601–626. As described below, there is a combined flow of current $I_Z$ from these terminals $V_{SHF}$ into the bandgap reference IC 630.

A feature of the bandgap reference IC 630 is that a constant voltage is maintained between its anode and cathode terminals over a wide range of values of the current $I_Z$. This voltage is also extremely stable with respect to temperature changes, having a temperature coefficient of essentially zero. The voltage at the $V_{SHF}$ terminals of the driver ICs therefore has a fixed value (also denoted $V_{SHF}$ below) that does not vary with temperature.

Figure 36:
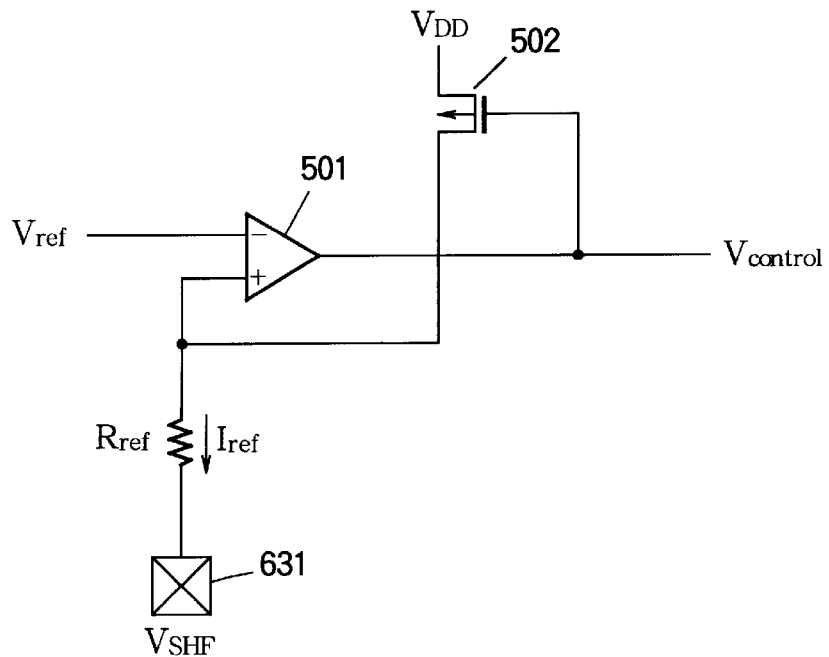
FIG. 36 is a circuit diagram of the current reference circuit in the sixth embodiment.

FIG. 36 shows part of the current reference circuit used in the driver ICs in place of the circuit shown in FIG. 19 in the first embodiment, comprising an operational amplifier 501 with its inverting input terminal receiving a reference voltage $V_{ref}$ from, for example, the circuit shown in FIG. 27 in the first embodiment. As described above, reference voltage $V_{ref}$ has a temperature coefficient of substantially 0.33%/° C.

As in the first embodiment, the output terminal of the operational amplifier 501 provides the output control voltage $V_{control}$, and is also coupled to the gate of a p-channel MOS transistor 502, the source of which is coupled to the power supply. The non-inverting input terminal of the operational amplifier 501 is coupled to the drain of transistor 502, and to one terminal of a resistor $R_{ref}$. Differing from the first embodiment, the other terminal of resistor $R_{ref}$ is coupled to the $V_{SHF}$ terminal 631 of the driver IC (or to a bonding pad that is wire-bonded to the $V_{SHF}$ terminal 631).

The current flowing through resistor $R_{ref}$ is denoted $I_{ref}$. The current $I_Z$ flowing into the bandgap reference IC 630 is the sum of the $I_{ref}$ currents from all of the driver ICs. As explained above, the bandgap reference IC 630 holds the $V_{SHF}$ terminal 631 at a fixed potential, regardless of the value of $I_Z$.

To describe the operation of the circuit in FIG. 36, the temperature dependence of the reference current $I_{ref}$ will be calculated below. There is a current mirror relationship between $I_{ref}$ and the LED driving current $I_{LED}$, so the temperature coefficient of $I_{ref}$ is also the temperature coefficient of $I_{LED}$.

The operational amplifier 501 operates so as to equalize the potentials of its inverting and non-inverting input terminals. This leads to the following relation.

$$I_{ref}=(V_{ref}-V_{SHF})/R_{ref}$$

The temperature coefficient $\alpha$ of $I_{ref}$ can be expressed as follows, where for simplicity the temperature coefficient of resistor $R_{ref}$ is ignored.

$$\alpha = (1/I_{ref})(I_{ref}/T)$$
$$= \{1/[1-(V_{SHF}/V_{ref})]\}(1/V_{ref})(V_{ref}/T)$$

To obtain the desired value of $\alpha$, equal to twice the temperature coefficient $(1/V_{ref})(V_{ref}/T)$ of $V_{ref}$, it suffices for the following condition to be satisfied.

$$V_{SHF}=(\tfrac{1}{2})V_{ref}$$

That is, $V_{SHF}$ should be set to about one-half the value of $V_{ref}$ (in the range of temperatures from room temperature to the temperature of the driver IC during operation).

In the sixth embodiment, accordingly, the temperature-sensing circuit in the driver ICs is designed to generate a reference voltage $V_{ref}$ substantially equal to twice the fixed value of $V_{SHF}$ output by the bandgap reference IC 630. The current reference circuit then compensates almost completely for the known temperature coefficient of the optical output of the LEDs, enabling uniform printed output to be obtained at all operating temperatures.

A similar effect could be obtained by providing each driver IC with an internal circuit generating a voltage equivalent to $V_{SHF}$, and using this voltage to shift the level of the reference voltage $V_{ref}$.

Next, a seventh embodiment of the invention will be described.

To compensate for the reduced optical output of the LEDs at high temperatures, the first embodiment relies on the temperature-sensing circuit to generate a reference voltage $V_{ref}$ that increases in proportion with increasing temperature. It is possible, however, for inadequate electrical characteristics of the semiconductor circuit elements used in the temperature-sensing circuit (for example, too small an Early voltage) to lead to unwanted variations in the reference voltage $V_{ref}$. Since the seventh embodiment is directed toward improvements in this regard, the description will begin with a more detailed explanation of the cause of these variations.

The temperature-sensing circuit in FIG. 27 in the first embodiment uses two npn bipolar transistors of different physical sizes, and senses temperature by detecting the difference between their base-emitter voltages. This sensing method implicitly assumes that the collector currents of the bipolar transistors are related mainly to their base-emitter voltages, and are substantially independent of the collector-emitter voltage, or in other words, that the bipolar transistors have sufficiently high Early voltages $V_A$.

The bipolar transistors employed, however, are lateral transistors formed in a semiconductor substrate, and for various reasons, the lateral transistor fabrication process does not yield a high Early voltage. One reason is the unavoidably large width of the base regions. Another reason is the relatively high sheet resistance of the collector and emitter regions.

Figure 37:
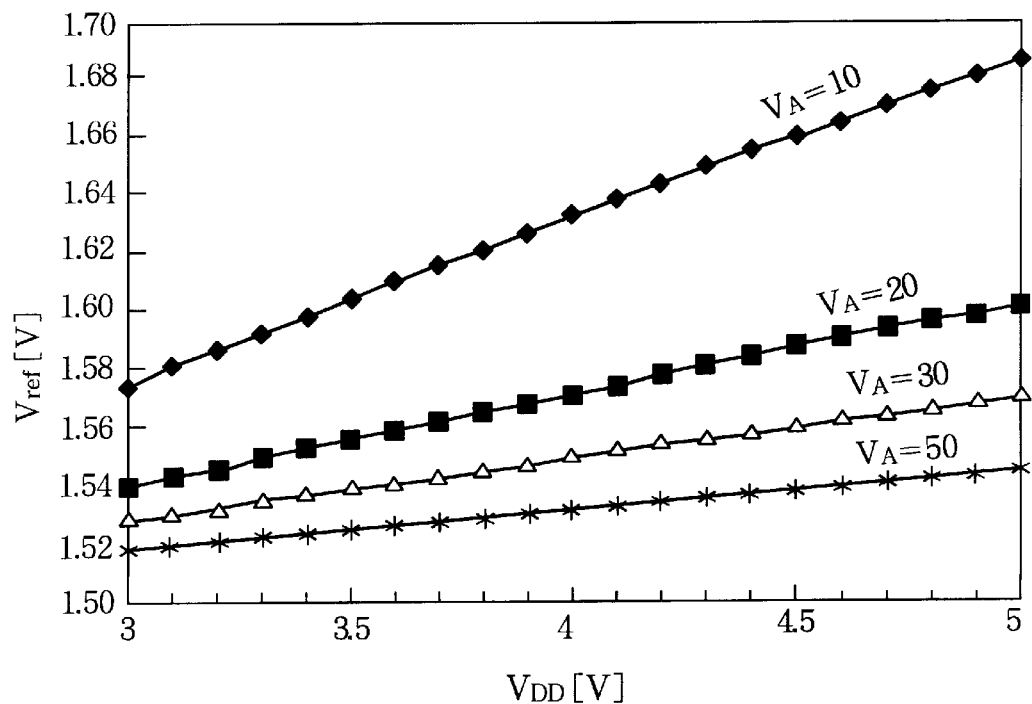
FIG. 37 is a graph illustrating the supply-voltage dependency of the voltage output of the temperature-sensing circuit in the first embodiment.

FIG. 37 shows that if a sufficiently high Early voltage $V_A$ can be obtained, the reference voltage $V_{ref}$ (shown on the vertical axis) will depend very little on the supply voltage $V_{DD}$ (shown on the horizontal axis). If the Early voltage $V_A$ is not sufficiently high, however, the reference voltage $V_{ref}$ varies considerably with the supply voltage $V_{DD}$.

Figure 38:
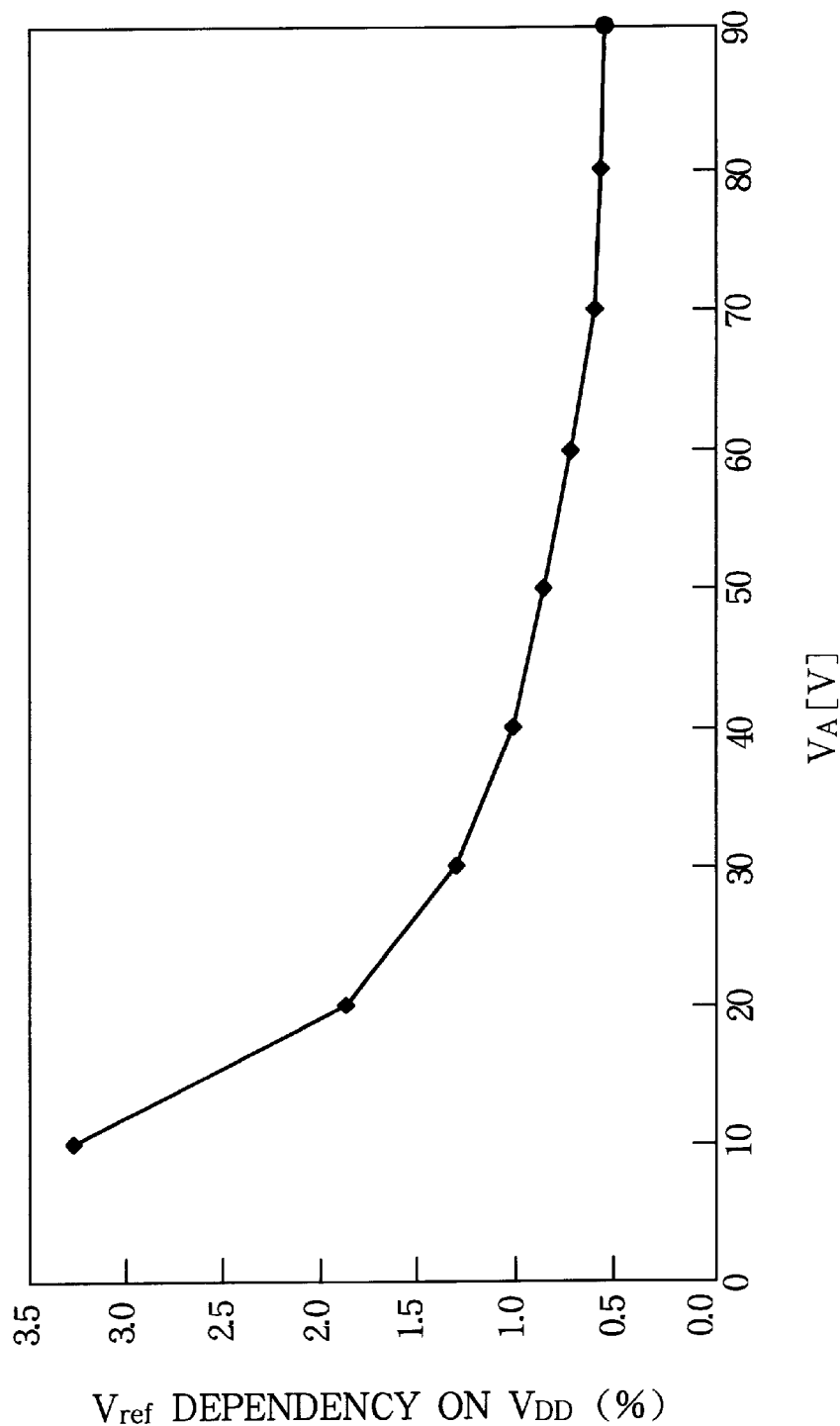
FIG. 38 is a graph illustrating the supply-voltage dependency of the voltage output of the temperature-sensing circuit in the first embodiment as a function of the Early voltage.

FIG. 38 plots the $V_{DD}$ dependency of $V_{ref}$ (shown in percent on the vertical axis) against the Early voltage $V_A$ (shown on the horizontal axis), showing that the dependency rises sharply at small values of $V_A$.

The seventh embodiment provides a temperature-sensing circuit and compensation circuit from which an output voltage that depends only slightly on the power-supply voltage can be obtained, even if bipolar transistors with small Early voltages are used.

Figure 39:
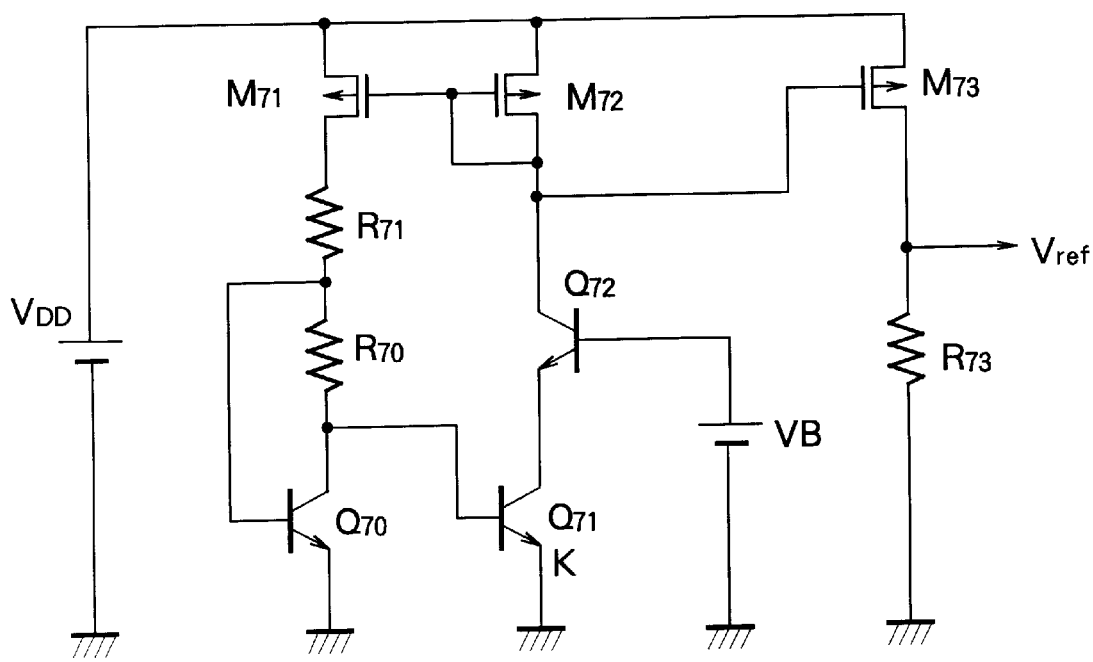
FIG. 39 is a circuit diagram of a temperature-sensing circuit according to a seventh embodiment of the invention.

FIG. 39 shows the temperature-sensing circuit used in the seventh embodiment in place of the circuit in FIG. 27 in the first embodiment.

The circuit in FIG. 39 is generally similar to the circuit in FIG. 27, comprising three p-channel MOS transistors $M_{71}$, $M_{72}$, and $M_{73}$ forming a current mirror, a pair of npn bipolar transistors $Q_{70}$ and $Q_{71}$, and resistors $R_{70}$, $R_{71}$, and $R_{73}$. These elements are interconnected in the same way as the corresponding elements in FIG. 27, but in FIG. 39 an additional npn bipolar transistor $Q_{72}$ is inserted in series between MOS transistor $M_{72}$ and npn bipolar transistor $Q_{71}$, and an auxiliary power supply $V_B$ is provided to bias the base terminal of transistor $Q_{72}$. The collector of transistor $Q_{72}$ is coupled to the drain of MOS transistor $M_{72}$, and the emitter of transistor $Q_{72}$ is coupled to the collector of transistor $Q_{71}$.

Since the collector of transistor $Q_{70}$ is coupled to the base of transistor $Q_{71}$, the collector-emitter voltage $V_{CE}$ of transistor $Q_{70}$ is equal to the base-emitter voltage $V_{BE}$ of transistor $Q_{71}$. This voltage changes very little even if the power-supply voltage $V_{DD}$ fluctuates greatly.

Since the collector of transistor $Q_{71}$ is coupled to the emitter of transistor $Q_{72}$, the collector potential of transistor $Q_{71}$ is equal to the emitter potential of transistor $Q_{72}$. This potential, denoted $V_{CE2}$, is related to the base potential $V_B$ and the base-emitter potential $V_{BE3}$ of transistor $Q_{72}$ as follows.

$$V_{CE2}=V_B-V_{BE3}$$

Accordingly, if $V_B$ is substantially equal to twice $V_{BE}$, the collector-emitter voltages of transistors $Q_{70}$ and $Q_{71}$ can be made more nearly equal, and can be held substantially constant despite large fluctuations in the $V_{DD}$ voltage. Transistor $Q_{72}$ thus shields the collector potential of transistor $Q_{71}$ from fluctuations in the power supply $V_{DD}$.

Figure 40:
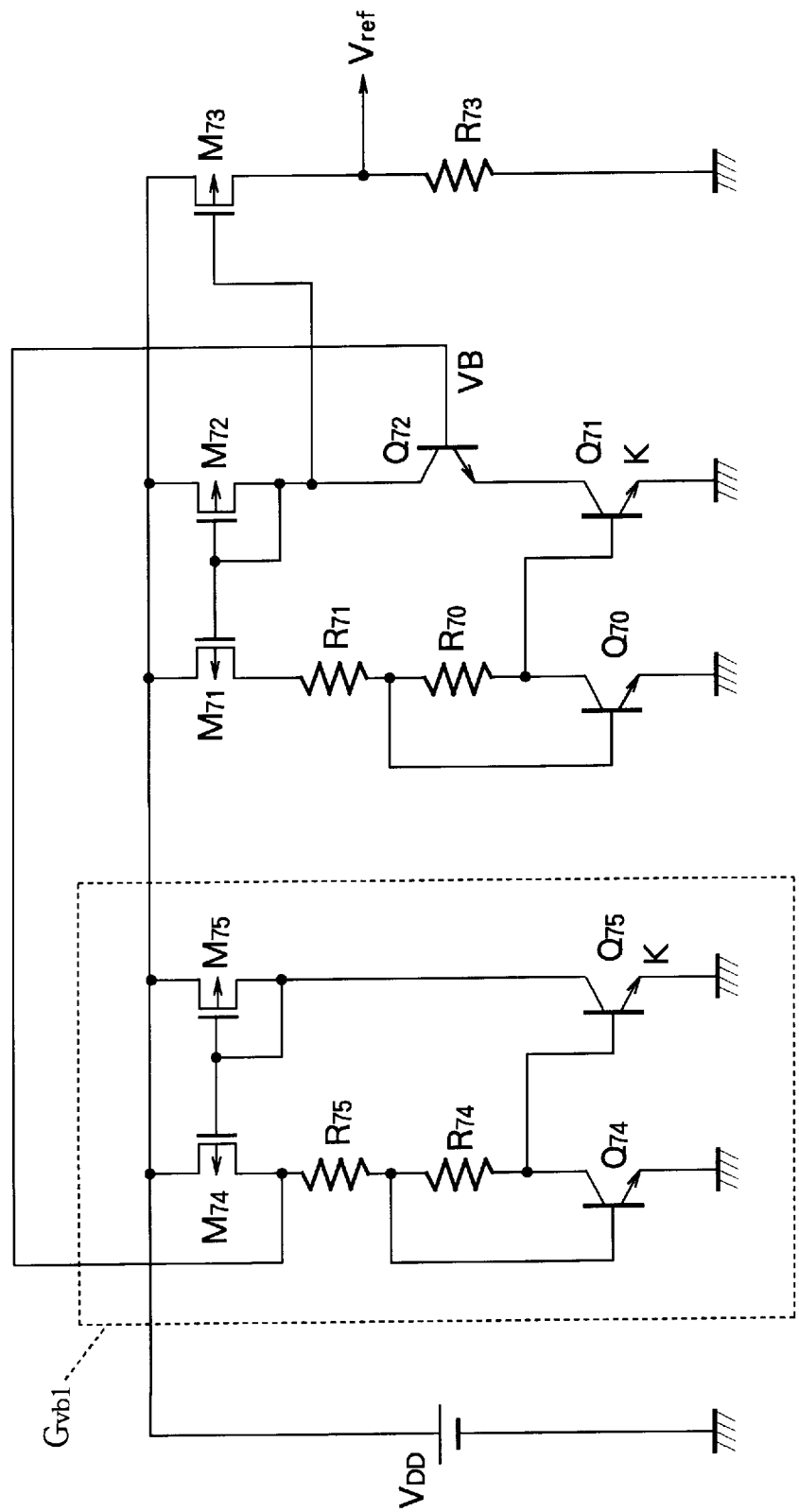
FIG. 40 is a more detailed circuit diagram of the temperature-sensing circuit in the seventh embodiment.

FIG. 40 shows the seventh embodiment in more detail by showing an auxiliary power supply circuit $G_{vb1}$ that can be used to generate the base bias voltage $V_B$. This circuit is somewhat similar to the circuit employed for temperature detection in the first embodiment (FIG. 27). Transistors $Q_{74}$ and $Q_{75}$ are npn bipolar transistors with a size ratio of 1:K. $M_{74}$ and $M_{75}$ are p-channel MOS transistors, the source terminals of which are coupled to the $V_{DD}$ power supply, and the gate terminals of which are interconnected to form a current mirror. The drain of transistor $M_{75}$ is coupled to the gates of transistors $M_{74}$ and $M_{75}$ and to the collector of transistor $Q_{75}$. The drain of transistor $M_{74}$ is coupled through series resistors $R_{75}$ and $R_{74}$ to the collector of transistor $Q_{74}$ and the base of transistor $Q_{75}$. The drain potential of transistor $M_{74}$ is also supplied as the bias voltage $V_B$ to the base of transistor $Q_{72}$.

The circuitry external to $G_{vb1}$ in FIG. 40 is identical to FIG. 39.

The base bias voltage $V_B$ can be calculated by the same procedure as used in the first embodiment to calculate the drain potential of transistor $M_{74}$, obtaining the following result, where $V_{BE}$ now represents the base-emitter voltage of transistor $Q_{74}$, k is the Boltzmann constant, T is absolute temperature, q is the charge of the electron, and ln is the natural logarithm function.

$$V_B=V_{BE}+(R_{75}/R_{74})(kT/q)\ln(K)$$

If K is greater than unity, then the second term on the right has a positive temperature coefficient, whereas the first term on the right ($V_{BE}$) has a negative temperature coefficient. If appropriate values are selected for $R_{74}$ and $R_{75}$, the decrease in $V_{BE}$ due to rising temperature can be balanced by an equal increase in the second term on the right, making the temperature coefficient of the bias voltage $V_B$ negligibly small. Applied to the base of transistor $Q_{72}$, this bias voltage controls the rise in the collector potential of transistor $Q_{71}$ and reduces the variability of the output voltage $V_{ref}$ due to the Early effect.

Figure 41:
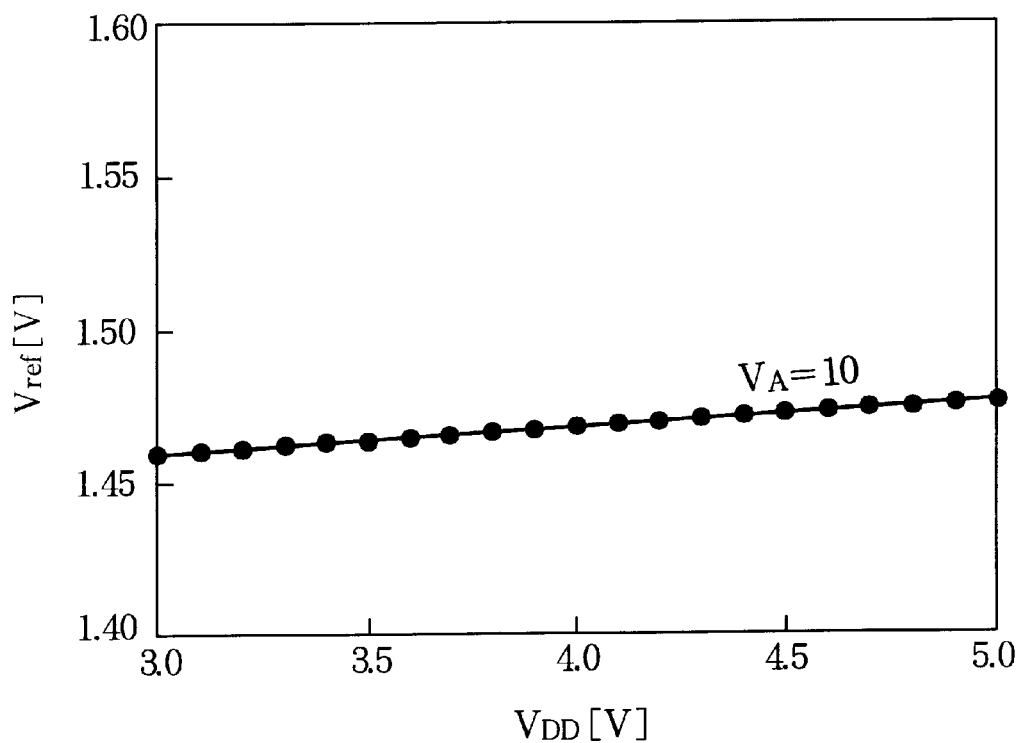
FIG. 41 is a graph illustrating the supply-voltage dependency of the voltage output signal of the temperature-sensing circuit in the seventh embodiment.

FIG. 41 illustrates the effect of the seventh embodiment by plotting the output voltage $V_{ref}$ in FIG. 40 as a function of the power-supply voltage $V_{DD}$ when the Early voltage of the bipolar transistors is ten volts. Despite this very small Early voltage, the dependency of $V_{ref}$ on $V_{DD}$ is held to only a few percent.

Next, an eighth embodiment of the invention will be described. The eighth embodiment adds a starting circuit to the configuration of the seventh embodiment, and provides a separate bias circuit to prevent a large in-rush current from causing start-up errors, by using a reduced bias potential generated by this bias circuit to start the flow of current in the temperature-sensing circuit.

Figure 42:
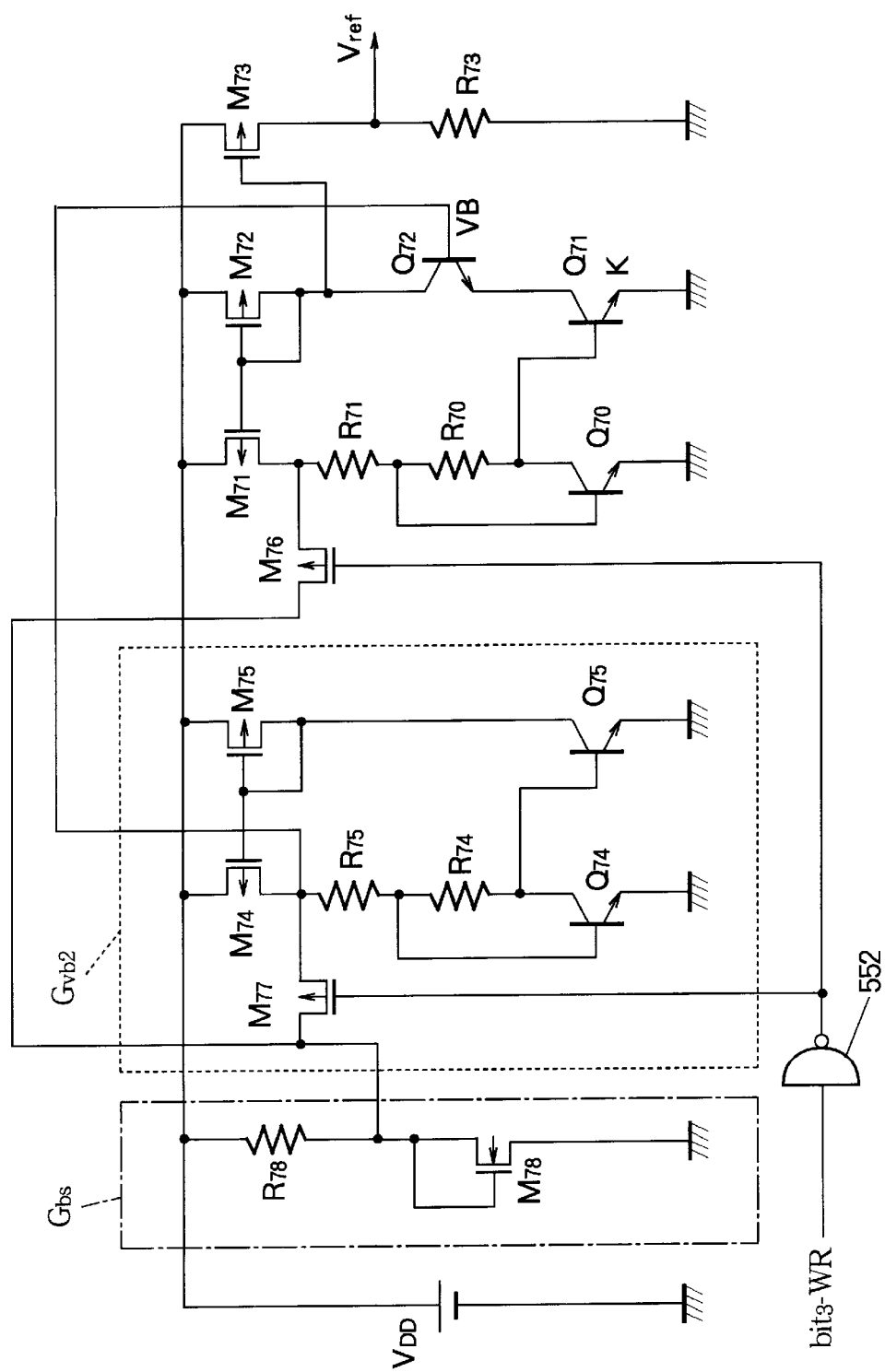
FIG. 42 is a circuit diagram of a temperature-sensing circuit according to an eighth embodiment of the invention.

Referring to FIG. 42, the eighth embodiment has an auxiliary power supply circuit $G_{vb2}$ similar to the one ($G_{vb1}$)

in the seventh embodiment. This circuit $G_{vb2}$ and the circuitry to its right in the drawing operate in substantially the same way as the corresponding circuits in the seventh embodiment, with like elements identified by like reference numerals.

The eighth embodiment also provides two p-channel MOS transistors $M_{76}$ and $M_{77}$ to assure start-up even if the power-supply voltage rises very slowly, as in the third embodiment. The gates of transistors $M_{76}$ and $M_{77}$ receive the $bit_3$-WR write command signal, as inverted by an inverter 552. The drain of transistor $M_{76}$ is coupled to a point between transistor $M_{71}$ and resistor $R_{71}$, while the drain of transistor $M_{77}$ is coupled to a point between transistor $M_{74}$ and resistor $R_{75}$.

The sources of transistors $M_{76}$ and $M_{77}$ are coupled to a bias circuit $Gb_s$ comprising a resistor $R_{78}$ and an n-channel MOS transistor $M_{78}$ coupled in series between the power-supply voltage $V_{DD}$ and ground. The gate and drain of transistor $M_{78}$ are both coupled to one terminal of resistor $R_{78}$, holding the drain potential of transistor $M_{78}$ to a value slightly above the threshold voltage of transistor $M_{78}$, regardless of variations in $V_{DD}$. The exact value of the drain potential depends on the dimensions of transistor $M_{78}$ and the resistance value of resistor $R_{78}$. This drain potential is supplied to the sources of transistors $M_{76}$ and $M_{77}$.

As explained in the third embodiment, when the printer's power is switched on, if for some reason the power-supply voltage rises extremely slowly, the transistors in the temperature-sensing circuit may fail to turn on, so that no reference voltage $V_{ref}$ is obtained. Before actual printing begins, however, the $bit_3$-WR signal line goes high during the transfer of compensation data from the control IC 100 to the driver ICs, turning on MOS transistors $M_{76}$ and $M_{77}$ and injecting current from the bias circuit $Gb_s$ into the bases of bipolar transistors $Q_{70}$, $Q_{71}$, $Q_{74}$, and $Q_{75}$.

If current were to be injected directly from the power supply, and if the on-resistances of transistors $M_{76}$ and $M_{77}$ were small, excessive flow of current into the bases of transistors $Q_{70}$ and $Q_{74}$ might saturate these transistors, reducing the collector potentials of transistors $Q_{70}$ and $Q_{74}$ to such a low level as to turn off transistors $Q_{71}$ and $Q_{75}$. This problem could be prevented by careful design of transistors $M_{76}$ and $M_{77}$, but it can also be prevented as in the eighth embodiment, by injecting current from a circuit biased at the desired potential of the injection points (the points between resistors $R_{71}$ and $R_{75}$ and transistors $M_{71}$ and $M_{74}$).

In the eighth embodiment, the power-supply voltage is divided by resistor $R_{78}$ and transistor $M_{78}$ to produce a comparatively low potential, which is used as a bias potential for current injection. When $bit_3$-WR goes high, inverter 552 turns on transistors $M_{76}$ and $M_{77}$, and current is injected through resistors $R_{71}$ and $R_{75}$ into the bases of transistors $Q_{70}$, $Q_{71}$, $Q_{74}$, and $Q_{75}$, but the low bias potential from which this current flows ensures that transistors $Q_{70}$ and $Q_{74}$ do not saturate. All four bipolar transistors $Q_{70}$, $Q_{71}$, $Q_{74}$, and $Q_{75}$ thus turn on.

When the $bit_3$-WR signal goes low, inverter 552 turns transistors $M_{76}$ and $M_{77}$ off, and positive feedback operates as explained in the third embodiment to bring the reference voltage $V_{ref}$ to the desired level.

The eighth embodiment assures that output of the reference voltage $V_{ref}$ starts before printing begins, even if the power-supply voltage rises slowly, without placing exacting requirements on the on-resistance values and other parameters of individual transistors.

Next, a ninth embodiment of the invention will be described.

The ninth embodiment provides the driver ICs with a test circuit to shorten the time required for testing the individual driver ICs before they are coupled to the LED array chips or mounted in the LED head. Such unit tests are carried out, for example, before the driver ICs are separated from the semiconductor wafer on which they are fabricated. Test time is a significant consideration, because the number of LEDs is large (e.g. 2496), and the driver ICs must provide a separate output terminal for each driven LED. In the embodiments described above, in which the LED output is adjustable in sixteen steps, fully testing a driver IC involves sixteen current measurements at each of the output terminals. If one current measurement takes only ten milliseconds (10 ms), the total measurement time for a single LED head is substantially four hundred seconds.

$$10 \text{ ms} \times 16 \times 2496 \approx 400 \text{ s}$$

The test procedure can be shortened by measuring only some of the sixteen current levels, but since there are five independent driving transistors 520 to 524, at least five current measurements are necessary per LED driving output terminal. The ninth embodiment partially alters the internal operation of the driver ICs during testing, thereby reducing the test procedure to at most one current measurement per LED driving output terminal. The other current measurements are replaced by window comparisons, which are less expensive in terms of test time and test equipment cost.

Figure 43:
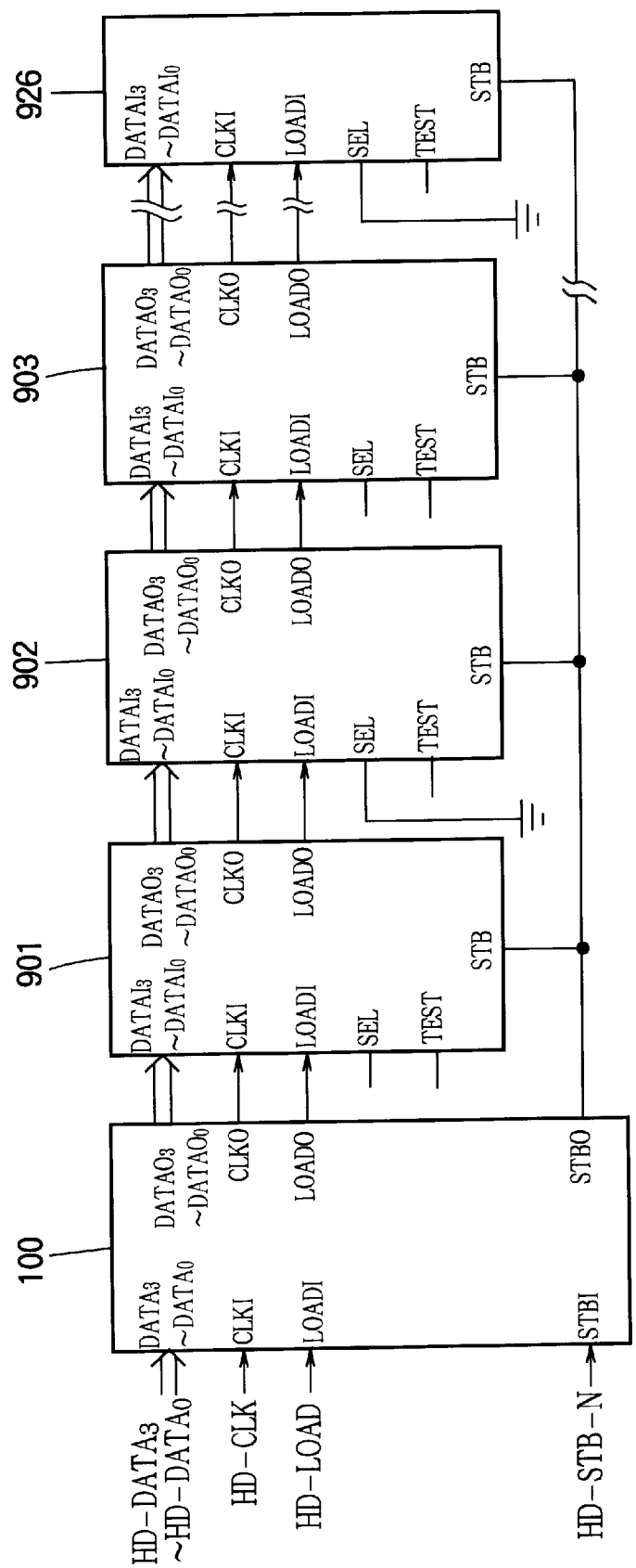
FIG. 43 is a block diagram illustrating the control IC and driver ICs in a ninth embodiment of the invention.

Referring to FIG. 43, each of the driver ICs 901 to 926 in the ninth embodiment has a test input terminal. The test input terminal can be left unconnected when the driver ICs are mounted in the LED head.

Figure 44:
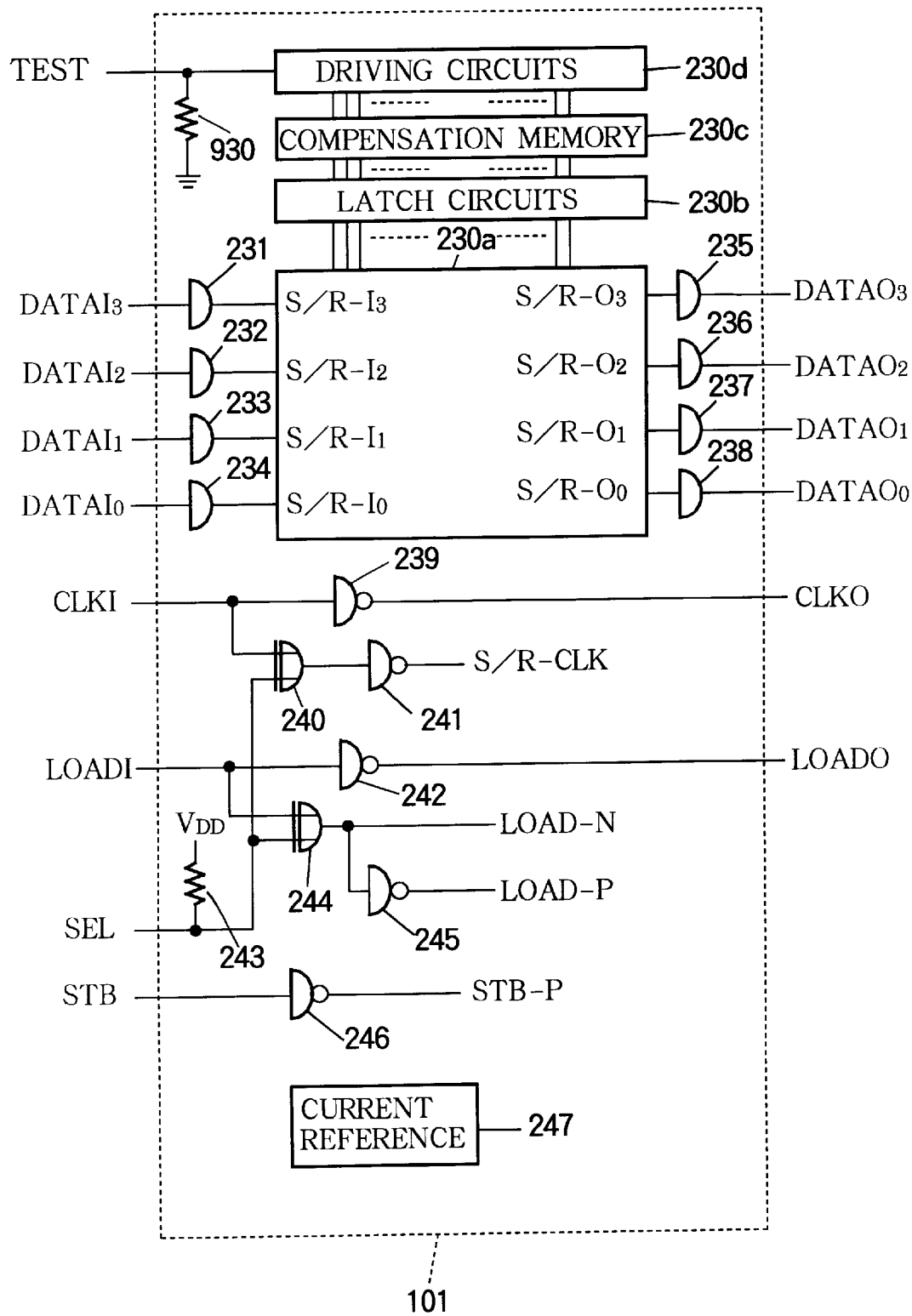
FIG. 44 is a block diagram illustrating the internal structure of the driver ICs in FIG. 43.

FIG. 44 is a block diagram showing the internal structure of the driver ICs 901 to 926 in the ninth embodiment. The test input terminal is pulled down through a resistor 930 to the ground level, so when the test input terminal is left unconnected, the test input signal is held at the low logic level. When the test input terminal is connected to external test equipment, the test equipment supplies a test signal to the test input terminal. The test signal is passed to each of the driving circuits 230d.

Figure 45:
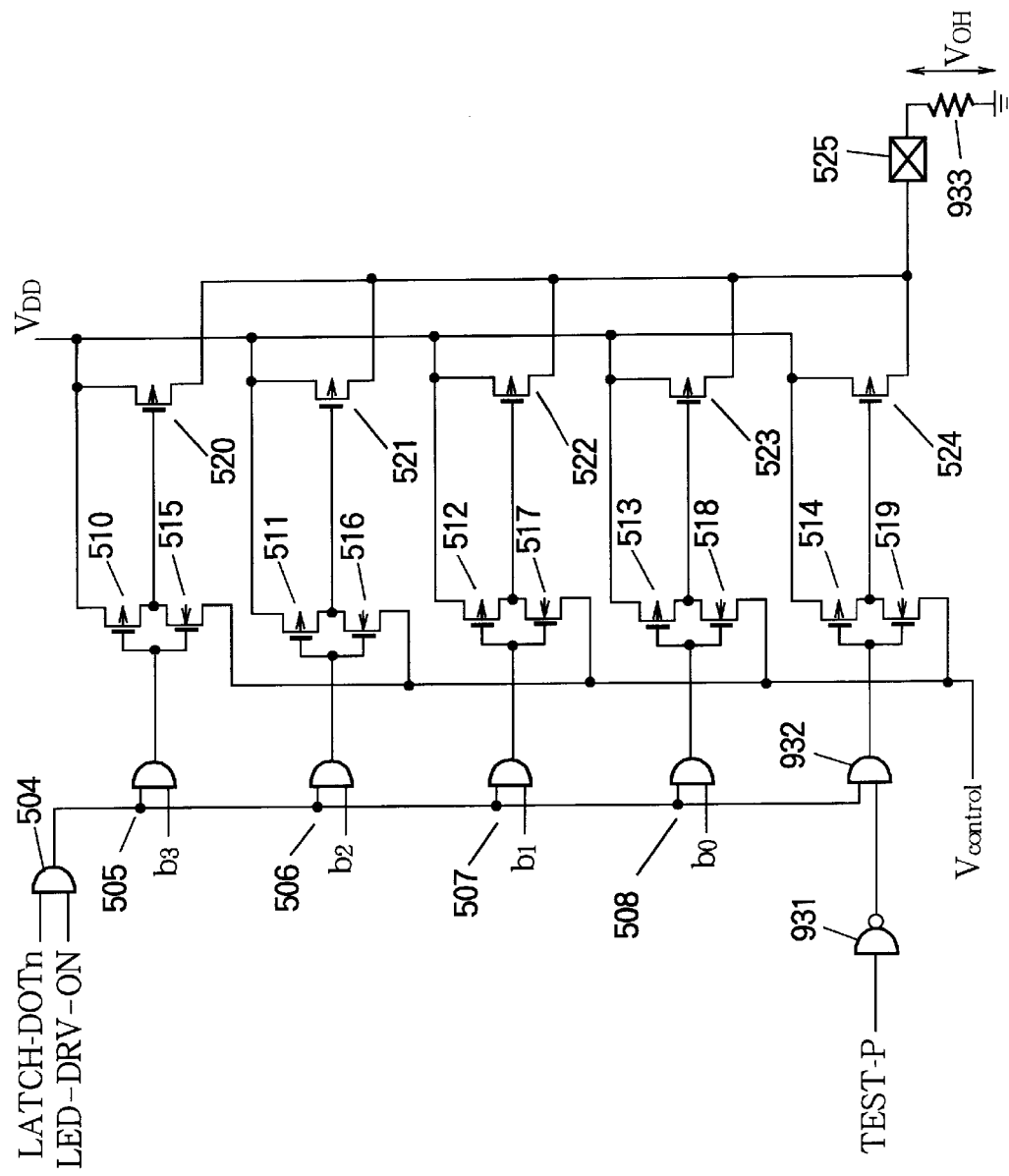
FIG. 45 is a circuit diagram illustrating the internal structure of one of the driving circuits in FIG. 44, showing the circuitry for driving one LED.

FIG. 45 shows one of the driving circuits 230d, using the same reference numerals as in FIG. 20 for equivalent circuit elements. The new elements are an inverter 931 that inverts the TEST-P signal received from the test input terminal, an AND gate 932 that replaces the buffer circuit 509 of the first embodiment, and a resistor 933 coupled between the output terminal 525 and ground. The two input terminals of AND gate 932 receive the signals output by AND gate 504 and inverter 931. Resistor 933 is not part of the driver IC, but is connected to the output terminal 525 during the unit test process. Current flowing through resistor 933 produces a voltage $V_{OH}$ at output terminal 525.

Voltage $V_{OH}$ is supplied to a window comparator in the test equipment (not visible) used to perform the unit test. The window comparator determines whether $V_{OH}$ is within a predetermined range or window, such as a window extending several percent above and below a predetermined nominal value. If $V_{OH}$ is not within the window, the driver IC can be rejected without the need for accurate measurement of the actual current value.

Figure 46:
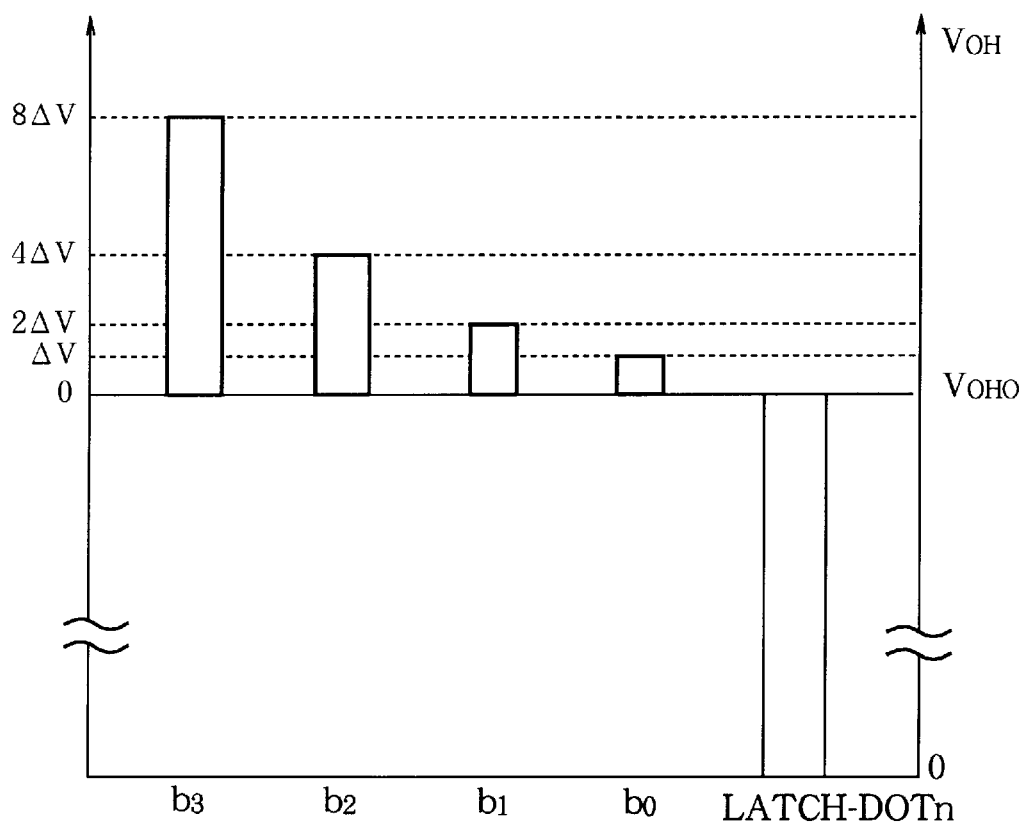

FIG. 46 illustrates the operation of the driving circuit in FIG. 45 when LATCH-DOTn and LED-DRV-ON are high but the TEST-P input signal is low. The output of inverter 931 is high, so AND gate 932 operates in the same way as the buffer circuit 509 in the first embodiment. When LATCH-DOTn and LED-DRV-ON are both active (high), the output of AND gate 504 goes high, the output of AND gate 932 goes high, transistor 514 turns off, and transistor 519 turns on, supplying the $V_{control}$ potential to the gate of the main driving transistor 524. Transistor 524 supplies a current determined by the $V_{control}$ potential to the output terminal 525. Transistors 520, 521, 522, and 523 supply additional current to output terminal 525 responsive to the logic levels of compensation data bits $b_3$ to $b_0$, in amounts determined by $V_{control}$ and the dimensions of transistors 520, 521, 522, and 523.

$V_{OHO}$ in FIG. 46 indicates the potential of the output terminal 525 when bits $b_0$ to $b_3$ are all low, so current is supplied to resistor 933 only through the main driving transistor 524. $\Delta V$ indicates the increase in the potential of output terminal 525 when $b_0$ is high and $b_1$, $b_2$, and $b_3$ are low. Similarly, $2\Delta V$, $4\Delta V$, and $8\Delta V$ indicate the increase in the potential of output terminal 525 when each data compensation bit $b_1$, $b_2$, and $b_3$ goes high independently, while the other three data compensation bits are low. $\Delta V$ is the product of the driving current supplied by MOS transistor 523 and the resistance of resistor 933.

As explained in the first embodiment, differences in LED output arising from variability in the fabrication process are corrected by using bits $b_0$ to $b_3$ to adjust the driving current in, for example, two-percent steps, with sixteen adjustment levels. The voltage $V_{OH}$ across resistor 933 is proportional to the driving current, and $\Delta V$ is, in the above example, two percent of $V_{OHO}$. Thus the change in $V_{OH}$ caused by switching $b_0$ on or off is only two percent, which is less than the allowed variability in $V_{OHO}$. Detecting this two-percent change with a window comparator would be impractical.

Figure 47:
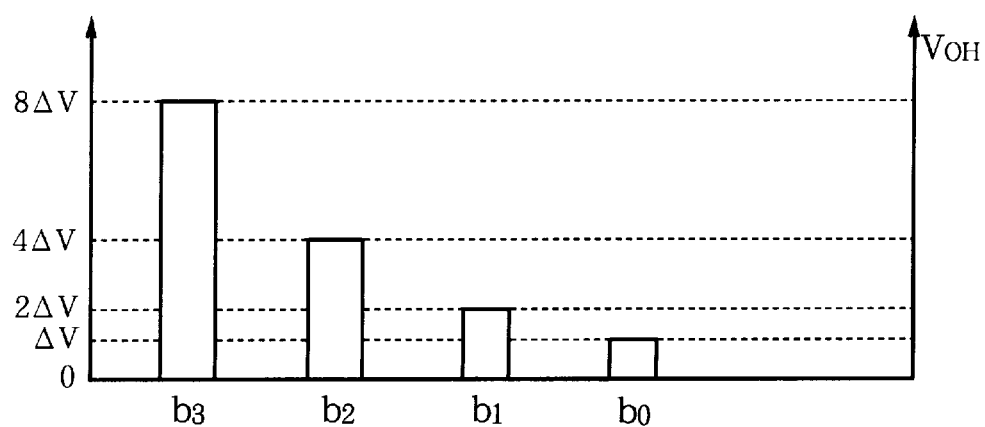
FIG. 47 is a graph illustrating test results obtained from the internal circuit in FIG. 45 when the main driving transistor is switched off.

FIG. 47 illustrates the operation when the TEST-P signal is high. The outputs of inverter 931 and AND gate 932 are both low, switching p-channel MOS transistor 514 on and n-channel MOS transistor 519 off, so that the gate-source voltage of the main driving transistor 524 is substantially zero and transistor 524 is switched off. The voltage $V_{OHO}$ that was indicated in FIG. 46 is therefore not present in FIG. 47.

When compensation data bits $b_0$ to $b_3$ are all low, the potential $V_{OH}$ observed at the output terminal 525 is zero volts. When $b_0$ to $b_3$ are driven high one bit at a time, potentials $V_{OH}$ equal to $\Delta V$, $2\Delta V$, $4\Delta V$, and $8\Delta V$ are observed at output terminal 525. Each compensation data bit now produces a relatively large potential change, which can easily be detected by the window comparator in the test equipment.

Figure 48:
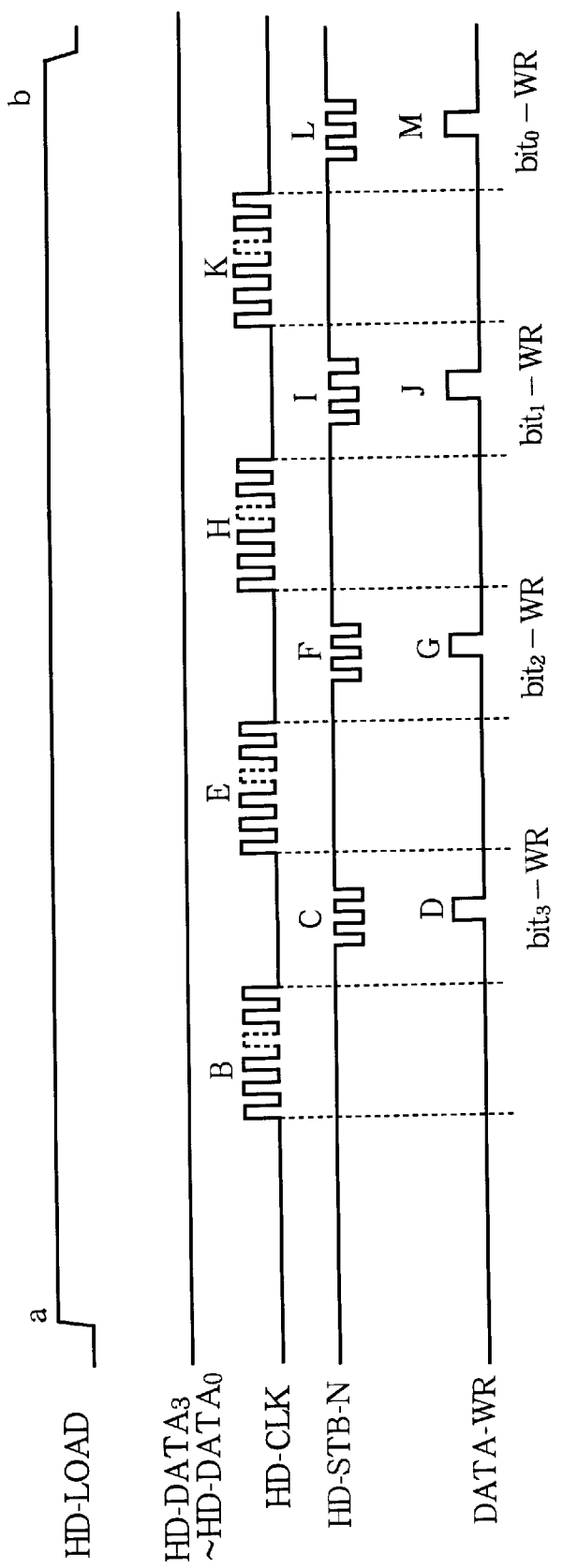
FIG. 48 is a timing diagram illustrating a first part of a test procedure in the ninth embodiment.

The test procedure in the ninth embodiment will be described with reference to FIGS. 48 and 49, using the same notation as in FIG. 25 in the first embodiment. The input signal at the SEL terminal of the driver IC is assumed to be at the high logic level.

First, all-zero compensation data are loaded into the compensation memory. Referring to FIG. 48, an active (high) HD-LOAD signal is applied to the LOADI terminal from time a to time b, during which interval the data signals (HD-DATA$_3$ to HD-DATA$_0$) are all held at the low logic level. During this interval, first, twenty-four clock pulses (HD-CLK) are supplied to the CLKI input terminal (B), loading all-zero data into the shift register 230a in the driver IC. Three HD-STB-N pulses are then supplied to the STB input terminal (C), generating a bit$_3$-WR write command signal (D) that writes all-zero data into memory cell c3 in each of the compensation memory circuits shown in FIG. 16.

Further clock pulses (E, H, and K) and strobe pulses (F, I, and L) are supplied to write all-zero data into the other memory cells (c2, c1, c0) in the memory compensation circuits, then the HD-LOAD signal is returned to the low logic level. The TEST-P input signal can be held low throughout the loading of these all-zero data.

Next, with TEST-P low, HD-LOAD and HD-STB-N are driven so as to transfer driving data and activate each of the LED driving circuits 230d. In FIG. 45, LATCH-DOTn and LED-DRV-ON go high. The resulting driving currents can be measured by accurately measuring the voltage $V_{OH}$ at each output terminal 525. Alternatively, the window comparator can be used to determine quickly whether each driving current is in an acceptable range. The measured or compared driving current is due only to the main driving transistor 524. The other driving transistors 520 to 523 remain off, because bits $b_0$ to $b_3$ of the compensation data area all zero. This part of the procedure tests for normal operation of the main driving transistor 524 and its associated circuitry, including the current reference circuit 247.

Next, to test the other driving transistors 520 to 523 and their associated circuits, the TEST-P signal is set to the high logic level, and bits $b_0$ to $b_3$ are driven high one at a time. FIG. 49 shows the procedure for loading high data for bit $b_0$, to test for short circuits, open circuits, and other faults in memory cell c0 in FIG. 16 (transistors 471 and 472 and inverters 451 and 452 in FIG. 18), and AND gate 508 and transistors 513, 518, and 523 in FIG. 45.

Figure 49:
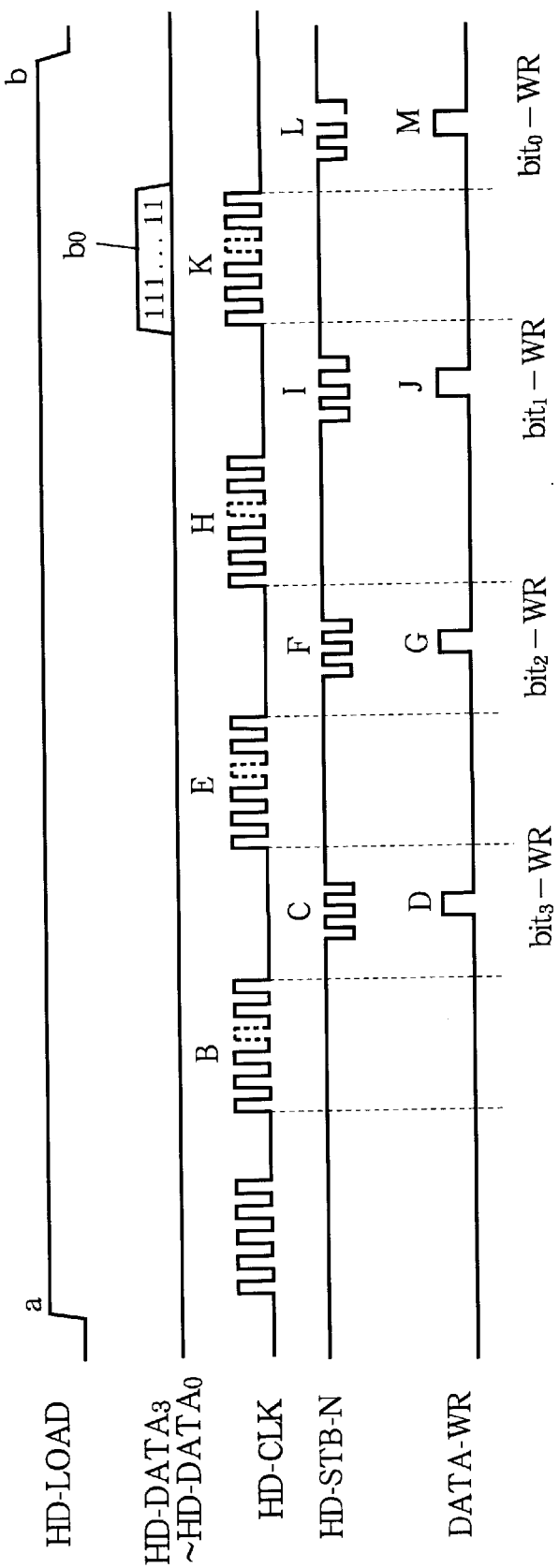
FIG. 49 is a timing diagram illustrating a second part of a test procedure in the ninth embodiment.

The HD-LOAD signal is driven high from time a to time b in FIG. 49. During the HD-CLK, HD-STB-N, and DATA-WR waveform segments marked B to J, the HD-DATA signals are held low and all-zero data are written into memory cells c3, c2, and c1 in the compensation memory circuits. During the HD-CLK waveform segment marked K, comprising twenty-four clock pulses, the HD-DATA signals are all driven high, loading all-one data into the shift register 230a. The HD-STB-N pulses (L) and bit$_0$-WR signal (M) then write the all-one data into the c0 memory cells in the compensation memory circuits.

After HD-LOAD goes low at time b, TEST-P is driven high, dot data are supplied, then HD-STB-N is driven low, and the potentials of the LED driving output terminals 525 are sensed by the window comparator in the test equipment. Referring again to FIG. 45, since TEST-P is high, the output of AND gate 932 is low, and the main driving transistor 524 is switched off, but the $b_0$ signal is now high, so when LATCH-DOTn and LED-DRV-ON go high, the outputs of both AND gates 504 and 508 go high, switching on transistor 523. Since $b_1$, $b_2$, and $b_3$ are low, transistors 522, 521, and 520 remain off.

The potential $V_{OH}$ of the output terminal 525 should accordingly be $\Delta V$, as shown in FIG. 47. If the circuits that generate this $\Delta V$ output are defective, then $V_{OH}$ will generally either be zero volts or have a value of $3\Delta V$ or greater. For example, if the $b_1$ input to AND gate 507 in FIG. 25 is shorted to $V_{DD}$, the output potential will be $\Delta V + 2\Delta V$, which is $3\Delta V$. Similarly, if $b_2$ or $b_3$ is shorted to $V_{DD}$, the output potential will be $5\Delta V$ or $9\Delta V$. The window comparator in the test equipment can easily detect the difference between $\Delta V$ and zero volts, or between $\Delta V$ and $3\Delta V$, so faults such as these can be discovered without accurate current measurements.

The ninth embodiment greatly reduces the number of accurate current measurements needed to test the current reference circuit and driving circuits in the driver IC, enabling most such measurements to be replaced by quicker and less expensive window comparisons. The ninth embodiment thus enables test times to be shortened and fabrication costs to be reduced.

Next, a tenth embodiment of the invention will be described. The tenth embodiment relates to a method of mounting the LED array chips and driver ICs of the ninth embodiment.

The LED array chips in the tenth embodiment are semiconductor chips with anode terminals for driving the individual LEDs on one surface, and a common cathode terminal on the other surface. Each LED array chip is bonded directly to the corresponding driver IC, the anode terminals of the LEDs being aligned with and electrically coupled to the corresponding driving terminals of the driver IC, which is mounted on a printed circuit board. The common cathode is coupled by bonding wires to three dummy terminals provided on the driver IC. The dummy terminals are coupled by further bonding wires to ground terminals on the printed circuit board.

Figure 50:
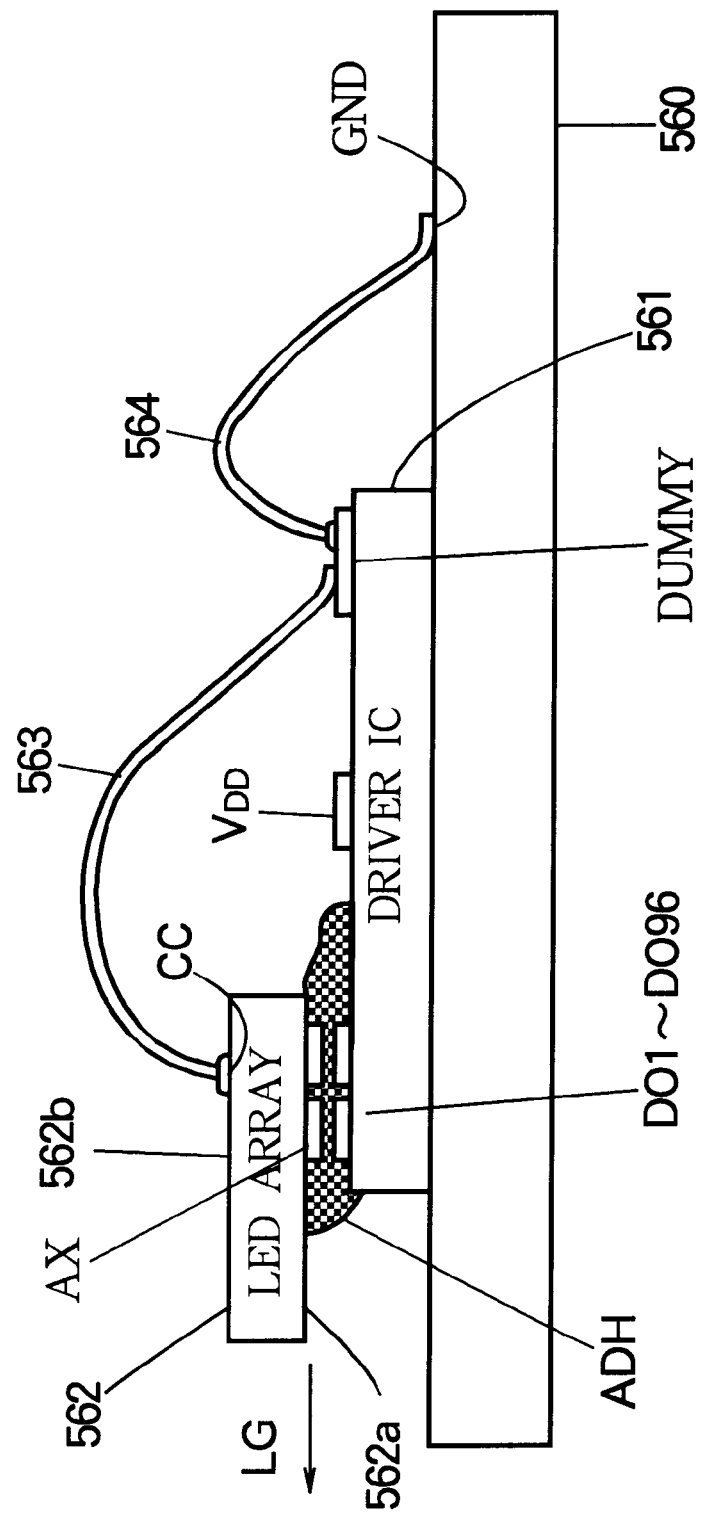
FIG. 50 is a sectional view of an LED head according to a tenth embodiment of the invention.

FIG. 50 is a sectional view showing the printed circuit board 560, a driver IC 561, an LED array chip 562, a first bonding wire 563 coupling the common cathode (CC) on the upper surface 562b of the LED array chip 562 to one of the dummy terminals on the driver IC 561, and a second bonding wire 564 coupling the dummy terminal to a ground terminal on the printed circuit board 560. The dummy terminal is a rectangular wire-bonding pad having substantially twice the surface area of the wire-bonding pads (not visible) used for input/output signals, to provide sufficient space for attachment of both bonding wires 563 and 564.

The driver IC 561 also has several driving power supply ($V_{DD}$) terminals, one of which is shown in the drawing. Each of these $V_{DD}$ terminals is a bonding pad that is coupled by a bonding wire (not visible) to a $V_{DD}$ terminal on the printed circuit board 560.

The driver IC 561 has driving output terminals DO1 to DO96, which are arranged zig-zag in a double row. Each of these driving terminals is the output terminal 525 of one driving circuit in the driver IC. The LEDs are formed on the lower surface 562a of the LED array chip, and have anode terminals, denoted AX, which are disposed in a similar double row facing the driving output terminals DO1 to DO96. The LEDs emit light in the direction of the arrow marked LG.

The LED array chip 562 is bonded to the driver IC 561 by an epoxy-based adhesive (ADH) in which tiny gold or gold-plated granules are dispersed. Some of these gold granules come to be positioned between the anode terminals AX of the LEDs and the driving output terminals DO1 to DO96 of the driver IC 561. When the LED array chip 562 is pressed down onto the driver IC 561, these gold granules form electrical couplings between the anode terminals AX and driving output terminals DO1 to DO96, eliminating the need for bonding wires.

Figure 51:
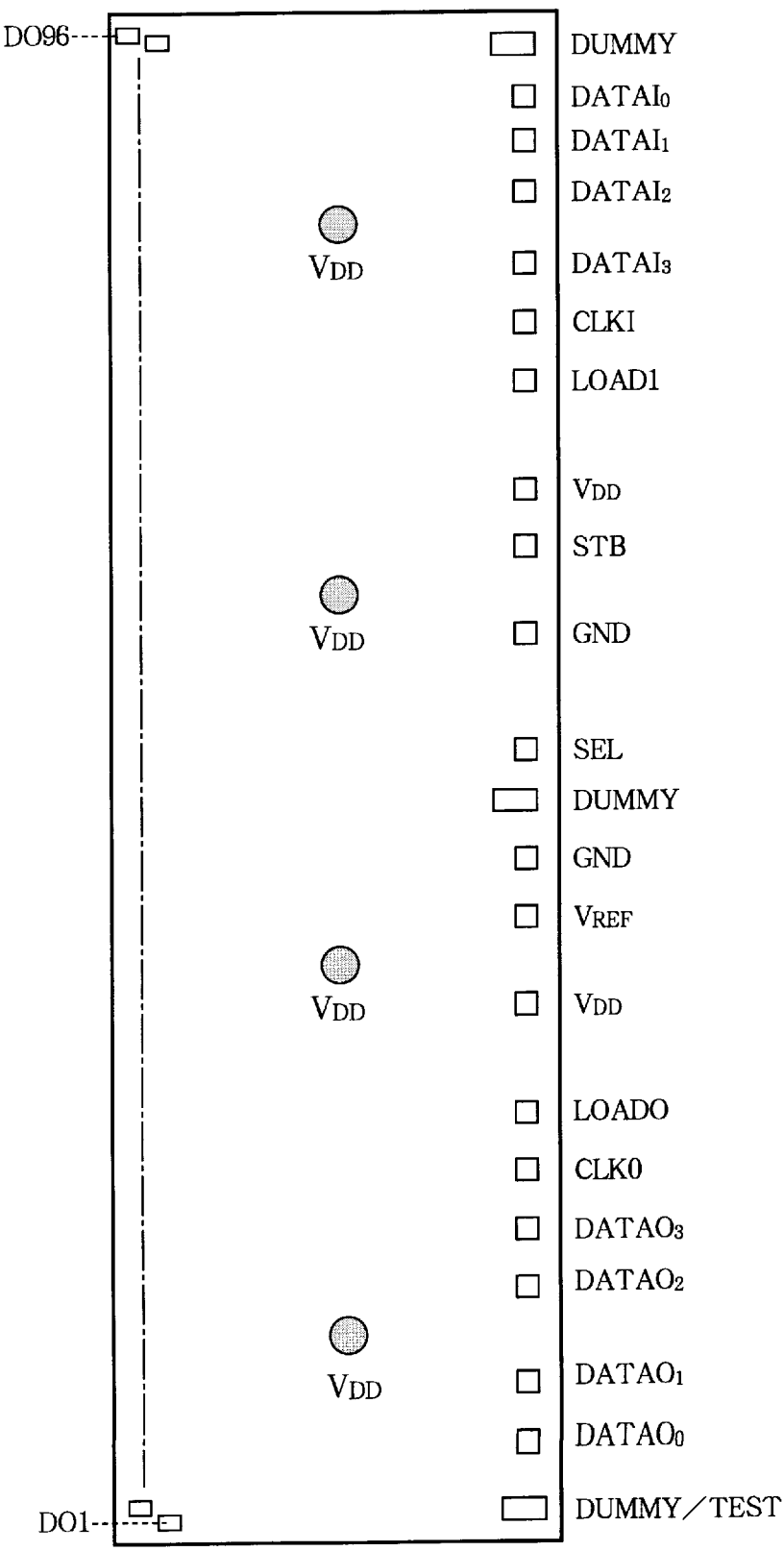
FIG. 51 is a plan view of a driver IC in the tenth embodiment.

Referring to FIG. 51, the driver IC 561 has a row of wire-bonding terminals arranged along one side (the right side in the drawing), with rectangular dummy terminals in the two corners and in the center of this side, enabling the common cathode of the LED array chip 562 to be grounded at three widely separated points. The dummy terminal marked DUMMY/TEST in the bottom right corner in FIG. 51 is also used as the test input terminal. The other (smaller, square) wire-bonding terminals on this side are $DATAI_0$ to $DATAI_3$, CLKI, LOADI, $V_{DD}$, STB, GND, SEL, VREF, LOADO, CLKO, and $DATAO_0$ to $DATAO_3$. The two $V_{DD}$ terminals and two GND terminals supply power and ground potentials to the logic circuits in the driver IC 561.

All three dummy terminals, including DUMMY/TEST, are coupled by bonding wires to ground terminals on the printed circuit board 560. The DUMMY/TEST terminal is accordingly held at the ground level, keeping the TEST-P signal inactive so that it does not interfere with printing operations.

The four $V_{DD}$ terminals in the center of the driver IC 561 are used to supply LED driving current to the LED driving circuits. The LED driving output terminals DO1 to DO96 are arranged in a zig-zag pattern along the side opposite to the other signal terminals.

In the tenth embodiment, the DUMMY/TEST terminal used for test signal input during unit testing of the driver ICs, before they are mounted in the LED head, is also used for grounding of the common cathode of the LED array chip after mounting in the LED head. This arrangement avoids the need for a special test input terminal, thereby reducing the size and cost of the driver ICs.

The preceding embodiments have been described in relation to an LED printer, but temperature-sensing circuits similar to those shown in the embodiments can also be used in thermal printers, in which the driven elements are resistive heating elements, and in various other circuits, such as the integrated circuits used to provide driving energy to display elements in display devices.

More generally, the invented temperature-sensing circuit can be incorporated into any integrated circuit that needs to detect either its own temperature or the temperature of a nearby external circuit, which might be another integrated circuit, or some other type of electronic or optical device. The invented temperature-sensing circuit can be used to detect abnormal conditions, so that circuit operations can be shut down if necessary, or to adjust circuit operations within a range of normal temperature conditions, as in the embodiments above, for temperature compensation purposes or other purposes.

A particular advantage of the invention is that the circuitry needed for temperature compensation of a driven element, or an array of driven elements, can be built directly into the integrated circuit that drives the driven element, or array of driven elements. When the driven elements are disposed on a plurality of semiconductor chips, incorporation of the invented temperature-sensing circuit into the driver ICs of these chips can provide automatic compensation for temperature differences between the driven chips. If the driver ICs already contain circuitry for compensating for fabrication variability by varying the driving current or driving energy, the invented temperature-sensing circuit can be added to these compensation circuits to provide temperature compensation as an additional feature, as in the preceding embodiments.

The embodiments described above can be combined in various ways. For example, the cascoded current mirror circuit of the second embodiment can be combined with the starting circuit of the third embodiment or the eighth embodiment.

Those skilled in the art will recognize that the embodiments described above can be modified in various other ways within the scope of the invention as claimed below.

What is claimed is:

1. A temperature-sensing circuit, comprising:
 a first bipolar transistor exposed to a temperature to be sensed;
 a second bipolar transistor exposed to said temperature to be sensed, differing in size from said first bipolar transistor, and generating a transistor output signal;
 a converting element for converting current to voltage, thereby generating a voltage output signal of the temperature-sensing circuit; and
 a current mirror circuit coupled to said first bipolar transistor, said second bipolar transistor, and said converting element, having a plurality of MOS transistors supplying mutually corresponding currents to said first bipolar transistor, said second bipolar transistor, and said converting element responsive to said transistor output signal, thereby determining base-emitter voltages of said first bipolar transistor and said second bipolar transistor.

2. The temperature-sensing circuit of claim 1, wherein said current mirror circuit has a cascoded circuit configuration.

3. The temperature-sensing circuit of claim 1, further comprising a starting circuit for turning on said first bipolar transistor and said second bipolar transistor by injecting charge into said first bipolar transistor and said second bipolar transistor, responsive to a command signal.

4. The temperature-sensing circuit of claim 3, wherein said starting circuit comprises a MOS transistor coupled to said first bipolar transistor in parallel with said current mirror circuit, having a gate terminal for receiving said command signal.

5. The temperature-sensing circuit of claim 3, wherein said starting circuit receives a power-supply voltage and a ground potential, generates an intermediate potential between said power-supply voltage and said ground potential, and uses said intermediate potential to inject said charge into said first bipolar transistor and said second bipolar transistor.

6. The temperature-sensing circuit of claim 1, wherein:
said first bipolar transistor and said second bipolar transistor are npn bipolar transistors with grounded emitter terminals, also having respective base terminals and respective collector terminals;
said current mirror circuit comprises a first p-channel MOS transistor, a second p-channel MOS transistor, and a third p-channel MOS transistor having respective source terminals coupled to a power supply, having respective drain terminals, and having respective gate terminals coupled in common to the drain terminal of said second p-channel MOS transistor and the collector terminal of said second bipolar transistor, the drain terminal of said third p-channel MOS transistor being coupled to said converting element;
further comprising
a first resistor having a first terminal coupled to the drain terminal of said first p-channel MOS transistor, and a second terminal coupled to the base terminal of said first bipolar transistor; and
a second resistor having a first terminal coupled to the second terminal of said first resistor, and a second terminal coupled to the collector terminal of said first bipolar transistor and the base terminal of said second bipolar transistor.

7. The temperature-sensing circuit of claim 6, wherein said converting element comprises a third resistor having a first terminal coupled to the drain terminal of said third p-channel MOS transistor, and having a grounded second terminal, said second resistor and said third resistor having substantially equal temperature coefficients.

8. The temperature-sensing circuit of claim 6, wherein said current mirror circuit also comprises:
a fourth p-channel MOS transistor coupled in series between said first p-channel MOS transistor and said power supply;
a fifth p-channel MOS transistor coupled in series between said second p-channel MOS transistor and said power supply; and
a sixth p-channel MOS transistor coupled in series between said third p-channel MOS transistor and said power supply;
said fourth p-channel MOS transistor, said fifth p-channel MOS transistor, and said sixth p-channel MOS transistor having mutually interconnected gate terminals.

9. The temperature-sensing circuit of claim 6, further comprising:
a third bipolar transistor coupled in series between the collector terminal of said second bipolar transistor and the drain terminal of said second p-channel MOS transistor.

10. The temperature-sensing circuit of claim 9, wherein said third bipolar transistor has an emitter terminal coupled to the collector terminal of said second bipolar transistor, a collector terminal coupled to the drain terminal of said second p-channel MOS transistor, and a base terminal receiving a certain bias voltage.

11. The temperature-sensing circuit of claim 10, further comprising a biasing circuit for generating said bias voltage, said biasing circuit having:
a seventh p-channel MOS transistor having a source terminal coupled to said power supply, a drain terminal coupled to the base terminal of said third bipolar transistor, for supplying said bias voltage to the base terminal of said third bipolar transistor, and a gate terminal;
an eighth p-channel MOS transistor having a source terminal coupled to said power supply, a drain terminal coupled to the gate terminal of said seventh p-channel MOS transistor, and a gate terminal also coupled to the gate terminal of said seventh p-channel MOS transistor;
a fourth bipolar transistor having a grounded emitter terminal, a base terminal, and a collector terminal coupled to the drain terminal of said eighth p-channel MOS transistor;
a fifth bipolar transistor having a grounded emitter terminal, a base terminal, and a collector terminal coupled to the base terminal of said fourth bipolar transistor;
a fourth resistor having a first terminal coupled to the drain terminal of said seventh p-channel MOS transistor, and a second terminal coupled to the base terminal of said fifth bipolar transistor; and
a fifth resistor having a first terminal coupled to the second terminal of said fourth resistor, and a second terminal coupled to the collector terminal of said fifth bipolar transistor.

12. The temperature-sensing circuit of claim 11, further comprising a starting circuit for supplying current to the first terminal of said first resistor and the first terminal of said fourth resistor, responsive to a command signal.

13. The temperature-sensing circuit of claim 12, wherein said starting circuit comprises:
a voltage dividing circuit for generating a divided voltage by dividing a voltage of said power supply;
a first switching element coupled to said voltage dividing circuit, for supplying said divided voltage to the first terminal of said first resistor, responsive to said command signal; and
a second switching element coupled to said voltage dividing circuit, for supplying said divided voltage to the first terminal of said fourth resistor, responsive to said command signal.

14. A temperature-sensing circuit, comprising:
a first bipolar transistor exposed to a temperature to be sensed;
a second bipolar transistor exposed to said temperature to be sensed, differing in size from said first bipolar transistor;
a converting element for converting current to voltage, thereby generating a voltage output signal of the temperature-sensing circuit;

an operational amplifier coupled to said first bipolar transistor and said second bipolar transistor, for generating an amplifier output signal responsive to a difference between respective base-emitter voltages of said first bipolar transistor and said second bipolar transistor; and a third bipolar transistor coupled to said converting element and said operational amplifier, for supplying current to said converting element responsive to said amplifier output signal.

15. The temperature-sensing circuit of claim 14, wherein said first bipolar transistor, said second bipolar transistor, and said third bipolar transistor are npn bipolar transistors having respective emitter terminals, respective base terminals receiving said amplifier output signal, and respective collector terminals coupled to a power supply, further comprising:

a first resistor having a first terminal coupled to the emitter terminal of said first bipolar transistor and a second terminal coupled to one input terminal of said operational amplifier;

a second resistor having a first terminal coupled to the second terminal of said first resistor, and having a grounded second terminal; and a third resistor having a first terminal coupled to the emitter terminal of said second bipolar transistor and to another input terminal of said operational amplifier, and having a grounded second terminal;

said first resistor and said second resistor having substantially equal temperature coefficients.

16. The temperature-sensing circuit of claim 15, wherein said converting element is a fourth resistor having a first terminal coupled to the emitter terminal of said third bipolar transistor, having a grounded second terminal, and having a temperature coefficient substantially equal to the temperature coefficient of said third resistor.

17. A driving apparatus for supplying energy to at least one driven element, comprising:

the temperature-sensing circuit of claim 1; and a temperature compensation circuit coupled to said temperature-sensing circuit, for adjusting the energy supplied to said driven element responsive to the voltage output signal generated by said temperature-sensing circuit.

18. The driving apparatus of claim 17, wherein said temperature-sensing circuit is thermally coupled to said driven element and senses a temperature of said driven element.

19. The driving apparatus of claim 18, wherein said driving apparatus selectively and cyclically drives a plurality of driven elements to form dots, said driven elements generate heat, said driven elements operate with decreasing efficiency at increasing temperature, and said temperature compensation circuit compensates for said decreasing efficiency.

20. The driving apparatus of claim 19, wherein said driven elements are disposed on a plurality of semiconductor chips, and said driving apparatus comprises a plurality of integrated circuits disposed adjacent respective semiconductor chips, for driving the driven elements on respective semiconductor chips, each of said integrated circuits separately having said temperature-sensing circuit and said temperature compensation circuit.

21. The driving apparatus of claim 17, further comprising a voltage reference circuit generating a constant voltage with a temperature coefficient of substantially zero, said temperature compensation circuit adjusting said driving energy according to a difference between said constant voltage and the voltage output signal generated by said temperature-sensing circuit.

22. A driving apparatus for selectively and cyclically driving a plurality of driven elements to form dots, comprising:

the temperature-sensing circuit of claim 1, for sensing the temperature of said driven elements;

a temperature compensation circuit coupled to said temperature-sensing circuit, for generating a control voltage responsive to the voltage output signal generated by said temperature-sensing circuit;

a plurality of driving circuits coupled to said temperature compensation circuit, for supplying driving energy to respective driven elements, responsive to driving data indicating whether said driven elements are to be driven, to compensation data for adjusting said driving energy, and to said control voltage;

a plurality of compensation memory circuits coupled to respective driving circuits, for storing said compensation data; and a data transfer means coupled to said plurality of driving circuits and said plurality of compensation memory circuits, for first transferring said compensation data to said compensation memory circuits, then transferring said driving data to said driving circuits.

23. A printer comprising the driving apparatus of claim 22.

24. The printer of claim 23, further comprising a printing control unit receiving the voltage output signal from said temperature-sensing circuit, for halting transfer of said driving data to said driving circuits when the voltage output signal generated by said temperature-sensing circuit exceeds a certain threshold.

25. A driving apparatus for supplying energy to at least one driven element, comprising:

the temperature-sensing circuit of claim 14; and a temperature compensation circuit coupled to said temperature-sensing circuit, for adjusting the energy supplied to said driven element responsive to the voltage output signal generated by said temperature-sensing circuit.

26. The driving apparatus of claim 25, wherein said temperature-sensing circuit is thermally coupled to said driven element and senses a temperature of said driven element.

27. The driving apparatus of claim 26, wherein said driving apparatus selectively and cyclically drives a plurality of driven elements to form dots, said driven elements generate heat, said driven elements operate with decreasing efficiency at increasing temperature, and said temperature compensation circuit compensates for said decreasing efficiency.

28. The driving apparatus of claim 27, wherein said driven elements are disposed on a plurality of semiconductor chips, and said driving apparatus comprises a plurality of integrated circuits disposed adjacent respective semiconductor chips, for driving the driven elements on respective semiconductor chips, each of said integrated circuits separately having said temperature-sensing circuit and said temperature compensation circuit.

29. The driving apparatus of claim 25, further comprising a voltage reference circuit generating a constant voltage with a temperature coefficient of substantially zero, said temperature compensation circuit adjusting said driving energy according to a difference between said constant voltage and the voltage output signal generated by said temperature-sensing circuit.

30. A driving apparatus for selectively and cyclically driving a plurality of driven elements to form dots, comprising:

the temperature-sensing circuit of claim 14, for sensing the temperature of said driven elements;

a temperature compensation circuit coupled to said temperature-sensing circuit, for generating a control voltage responsive to the voltage output signal generated by said temperature-sensing circuit;

a plurality of driving circuits coupled to said temperature compensation circuit, for supplying driving energy to respective driven elements, responsive to driving data indicating whether said driven elements are to be driven, to compensation data for adjusting said driving energy, and to said control voltage;

a plurality of compensation memory circuits coupled to respective driving circuits, for storing said compensation data; and a data transfer means coupled to said plurality of driving circuits and said plurality of compensation memory circuits, for first transferring said compensation data to said compensation memory circuits, then transferring said driving data to said driving circuits.

31. A printer comprising the driving apparatus of claim 30.

32. The printer of claim 31, further comprising a printing control unit receiving the voltage output signal from said temperature-sensing circuit, for halting transfer of said driving data to said driving circuits when the voltage output signal generated by said temperature-sensing circuit exceeds a certain threshold.

* * * * *